US012639494B2

(12) United States Patent
Roper, Jr. et al.

(10) Patent No.: US 12,639,494 B2
(45) Date of Patent: May 26, 2026

(54) DIGITAL TWIN AND PHYSICAL TWIN MANAGEMENT WITH INTEGRATED EXTERNAL FEEDBACK WITHIN A DIGITAL ENGINEERING PLATFORM

(71) Applicant: Istari Digital, Inc., Charleston, SC (US)

(72) Inventors: William Roper, Jr., Charleston, SC (US); Christopher Lee Benson, Arlington, VA (US); Sriram Krishnan, Cambridge, MA (US); Peter Galvin, Watertown, MA (US); Najem Aldeen Abu Rmaileh, Amman (JO); Ross Billings, Reisterstown, MD (US); Christopher Alexis Kotelly, Boston, MA (US)

(73) Assignee: Istari Digital, Inc., Charleston, SC (US)

( * ) Notice: Subject to any disclaimer, the term of this patent is extended or adjusted under 35 U.S.C. 154(b) by 0 days.

(21) Appl. No.: 19/297,476

(22) Filed: Aug. 12, 2025

(65) Prior Publication Data

US 2026/0030415 A1     Jan. 29, 2026

Related U.S. Application Data

(63) Continuation of application No. PCT/US2024/027898, filed on May 4, 2024.
(Continued)

(51) Int. Cl.
| | |
|---|---|
| *G06F 7/48* | (2006.01) |
| *G05B 17/02* | (2006.01) |
| *G06F 30/27* | (2020.01) |

(52) U.S. Cl.
CPC ............. *G06F 30/27* (2020.01); *G05B 17/02* (2013.01)

(58) Field of Classification Search
CPC ................................ G06F 30/27; G05B 17/02
See application file for complete search history.

(56) References Cited

U.S. PATENT DOCUMENTS

| | | | | |
|---|---|---|---|---|
| 11,637,899 B2* | 4/2023 | Knight | ................ | H04L 67/1065 |
| | | | | 709/224 |
| 11,764,991 B2* | 9/2023 | Park | .................... | H04L 12/2812 |
| | | | | 709/224 |

(Continued)

OTHER PUBLICATIONS

International Search Report and Written Opinion of PCT Application No. PCT/US24/27898, mailed on Aug. 13, 2024.
(Continued)

*Primary Examiner* — Nithya J. Moll
(74) *Attorney, Agent, or Firm* — American Patent Agency PC; Daniar Hussain; Stephen M. Hou

(57) ABSTRACT

Digital model platform that enables the streamlined creation and management of digital twins and physical twins by leveraging external feedback and artificial intelligence (AI) is disclosed. Methods and systems for a model collaboration platform that facilitate the integration of external feedback, whether from physical, virtual, or human sources, into the streamlined design, validation, verification, certification, assembly, operations, and maintenance processes of complex systems. Updated results are output to those external sources, including physical twins, other digital twins or models and simulations, and/or human users. External feedback includes feedback data from physical prototypes and their environment, virtual prototypes, simulations, and subject-matter experts. Embodiments are directed to integrating external feedback into the assembly and system-level assessment of digital twins, physical twins, digital threads, and the iterative design of constituting digital engineering models, including constructing, maintaining, and improving digital engineering models for the design, validation, verification, (Continued)

certification, operations, and maintenance of complex systems.

20 Claims, 29 Drawing Sheets

Related U.S. Application Data

(60) Provisional application No. 63/470,870, filed on Jun. 3, 2023.

(56) References Cited

U.S. PATENT DOCUMENTS

| | | | |
|---|---|---|---|
| 11,769,066 B2 * | 9/2023 | Ramanasankaran ... | G06N 5/022 |
| | | | 706/47 |
| 11,770,269 B2 * | 9/2023 | Ploegert ................. | G06F 21/60 |
| | | | 700/29 |
| 11,774,946 B2 * | 10/2023 | Chand ............... | G05B 19/0426 |
| | | | 700/275 |

| | | |
|---|---|---|
| 2017/0161044 A1 | 6/2017 | Singh et al. |
| 2020/0142365 A1 | 5/2020 | Sharma et al. |
| 2020/0265329 A1 | 8/2020 | Thomsen et al. |
| 2021/0006622 A1 | 1/2021 | Knight et al. |
| 2021/0109837 A1 | 4/2021 | Rakshit |
| 2022/0241972 A1 | 8/2022 | McGregor et al. |
| 2023/0058169 A1 | 2/2023 | Cella et al. |
| 2023/0155857 A1 | 5/2023 | Ploegert et al. |

OTHER PUBLICATIONS

International Preliminary Report on Patentaibility of PCT Application No. PCT/US24/27898, mailed on Jul. 28, 2025.

West et al., "Is Digital Thread/Digital Twin Affordable? A Systemic Assessment of the Cost of DoD's Latest Manhattan Project", Procedia Manufacturing, vol. 114, Dec. 2017, pp. 47-56.

Al-Geddawy, "A Digital Twin Creation Method for an Opensource Low-cost Changeable Learning Factory" Procedia Manufacturing, vol. 51, Nov. 19, 2020, pp. 1799-1805.

* cited by examiner

600
Exemplary Digital
Threads that connect
DE models

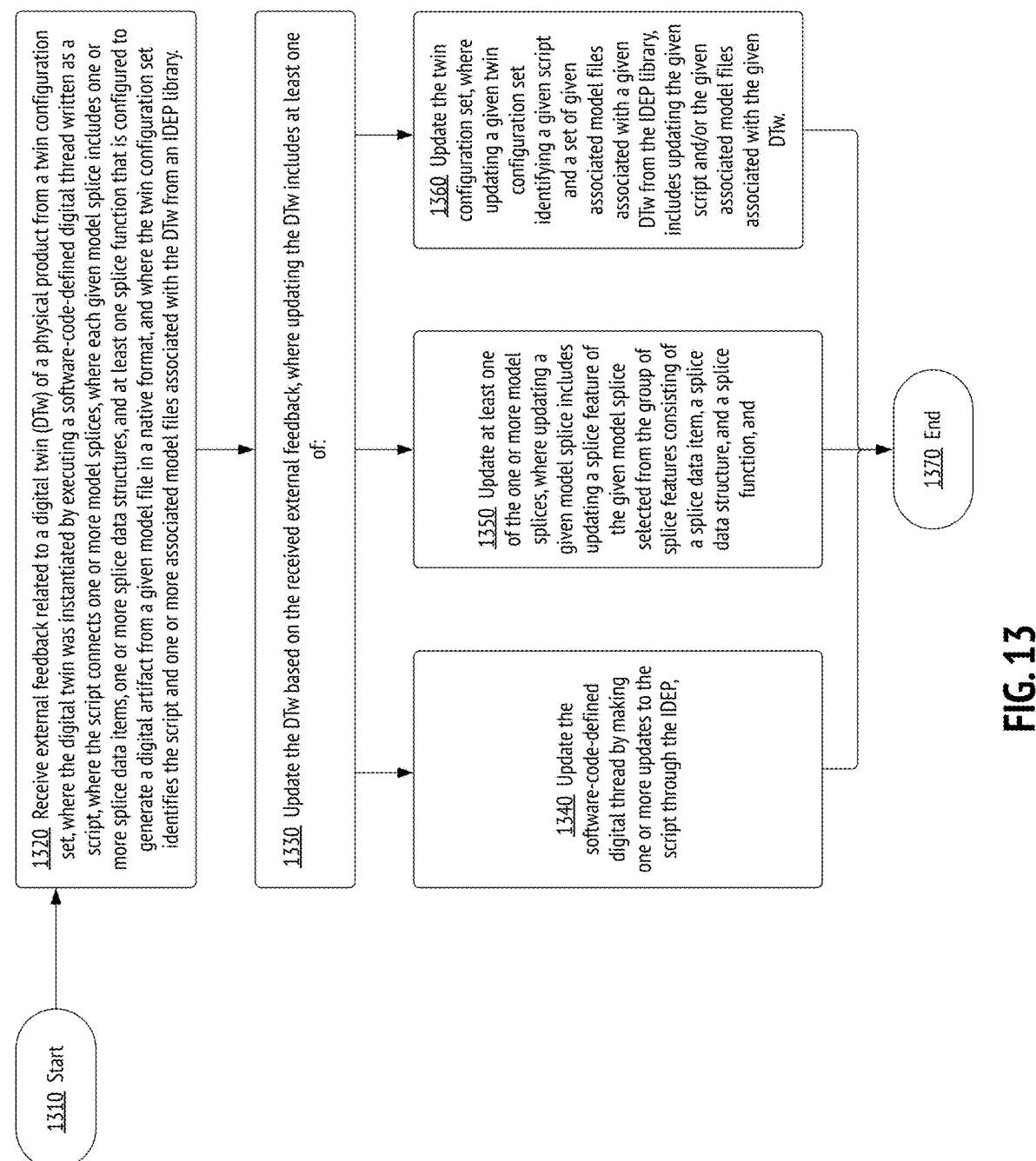

1310 Start

1320 Receive external feedback related to a digital twin (DTw) of a physical product from a twin configuration set, where the digital twin was instantiated by executing a software-code-defined digital thread written as a script, where the script connects one or more model splices, where each given model splice includes one or more splice data items, one or more splice data structures, and at least one splice function that is configured to generate a digital artifact from a given model file in a native format, and where the twin configuration set identifies the script and one or more associated model files associated with the DTw from an iDEP library.

1330 Update the DTw based on the received external feedback, where updating the DTw includes at least one of:

1340 Update the software-code-defined digital thread by making one or more updates to the script through the iDEP, 1350 Update at least one of the one or more model splices, where updating a given model splice includes updating a splice feature of the given model splice selected from the group of splice features consisting of a splice data item, a splice data structure, and a splice function, and 1360 Update the twin configuration set, where updating a given twin configuration set identifying a given script and a set of given associated model files associated with a given DTw from the iDEP library, includes updating the given script and/or the given associated model files associated with the given DTw.

1370 End

FIG. 13

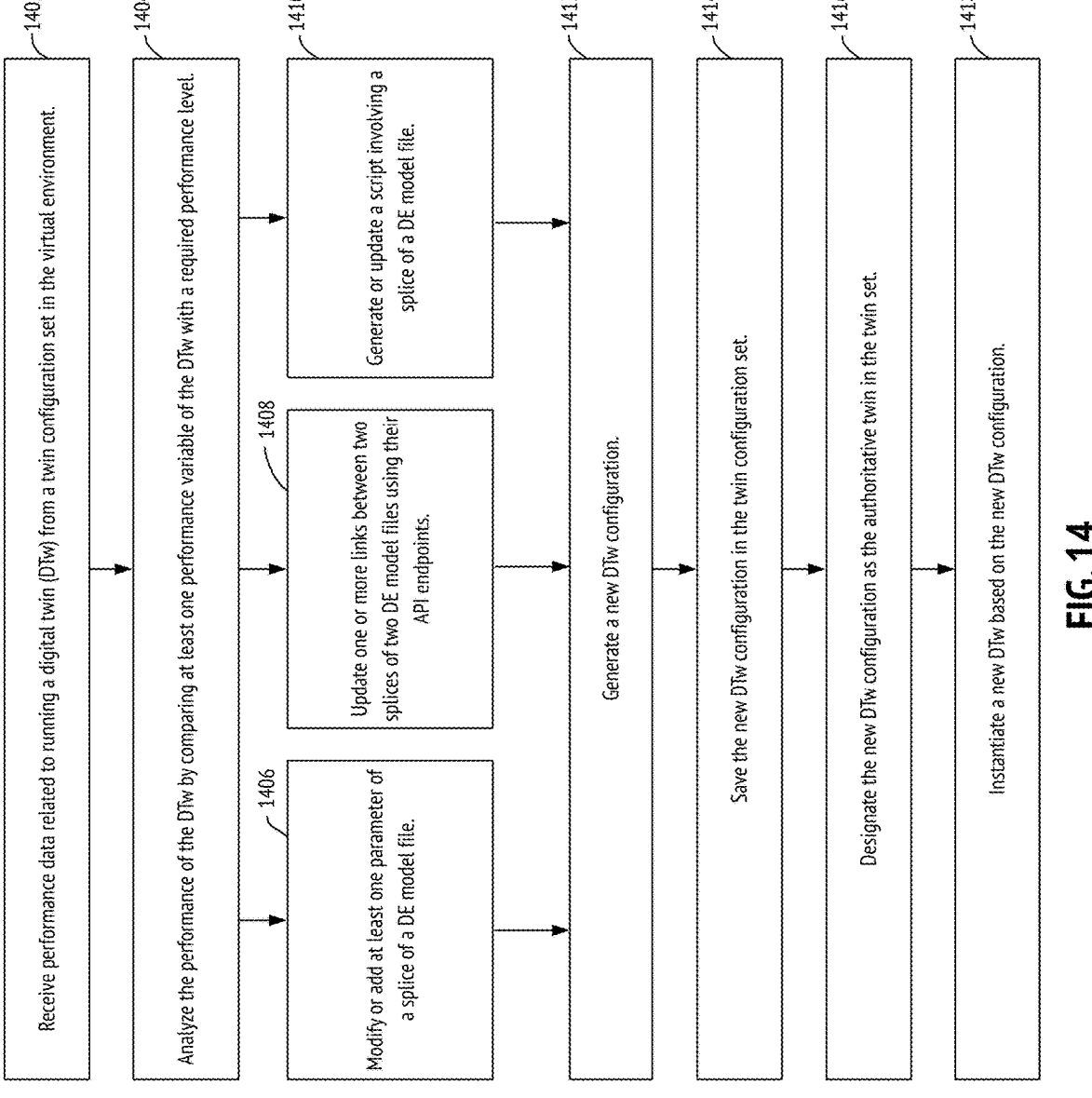

FIG. 14

1402 Receive performance data related to running a digital twin (DTw) from a twin configuration set in the virtual environment.

1404 Analyze the performance of the DTw by comparing at least one performance variable of the DTw with a required performance level.

1406 Modify or add at least one parameter of a splice of a DE model file.

1408 Update one or more links between two splices of two DE model files using their API endpoints.

1410 Generate or update a script involving a splice of a DE model file.

1412 Generate a new DTw configuration.

1414 Save the new DTw configuration in the twin configuration set.

1416 Designate the new DTw configuration as the authoritative twin in the twin set.

1418 Instantiate a new DTw based on the new DTw configuration.

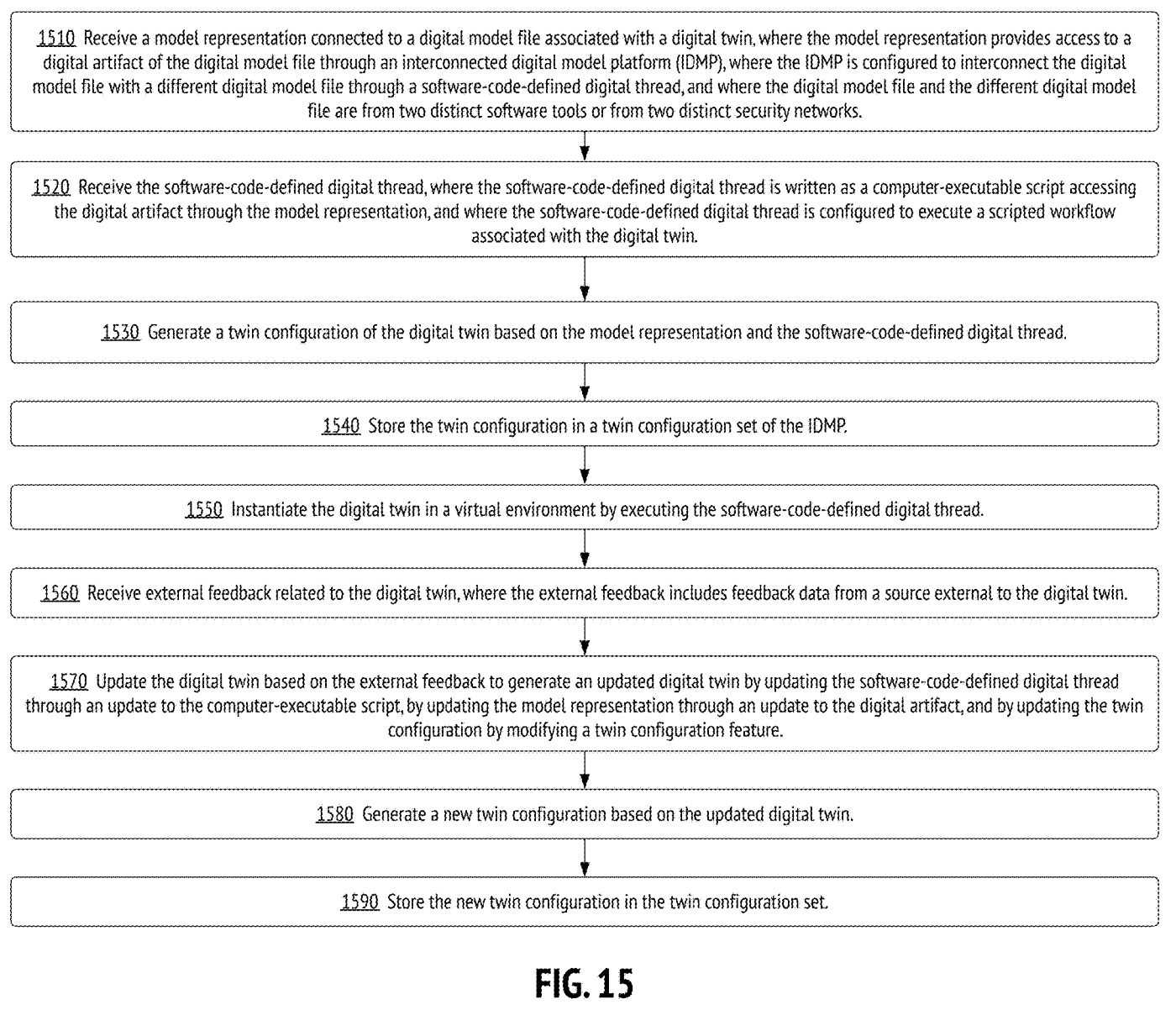

1510 Receive a model representation connected to a digital model file associated with a digital twin, where the model representation provides access to a digital artifact of the digital model file through an interconnected digital model platform (iDMP), where the iDMP is configured to interconnect the digital model file with a different digital model file through a software-code-defined digital thread, and where the digital model file and the different digital model file are from two distinct software tools or from two distinct security networks.

1520 Receive the software-code-defined digital thread, where the software-code-defined digital thread is written as a computer-executable script accessing the digital artifact through the model representation, and where the software-code-defined digital thread is configured to execute a scripted workflow associated with the digital twin.

1530 Generate a twin configuration of the digital twin based on the model representation and the software-code-defined digital thread.

1540 Store the twin configuration in a twin configuration set of the iDMP.

1550 Instantiate the digital twin in a virtual environment by executing the software-code-defined digital thread.

1560 Receive external feedback related to the digital twin, where the external feedback includes feedback data from a source external to the digital twin.

1570 Update the digital twin based on the external feedback to generate an updated digital twin by updating the software-code-defined digital thread through an update to the computer-executable script, by updating the model representation through an update to the digital artifact, and by updating the twin configuration by modifying a twin configuration feature.

1580 Generate a new twin configuration based on the updated digital twin.

1590 Store the new twin configuration in the twin configuration set.

FIG. 15

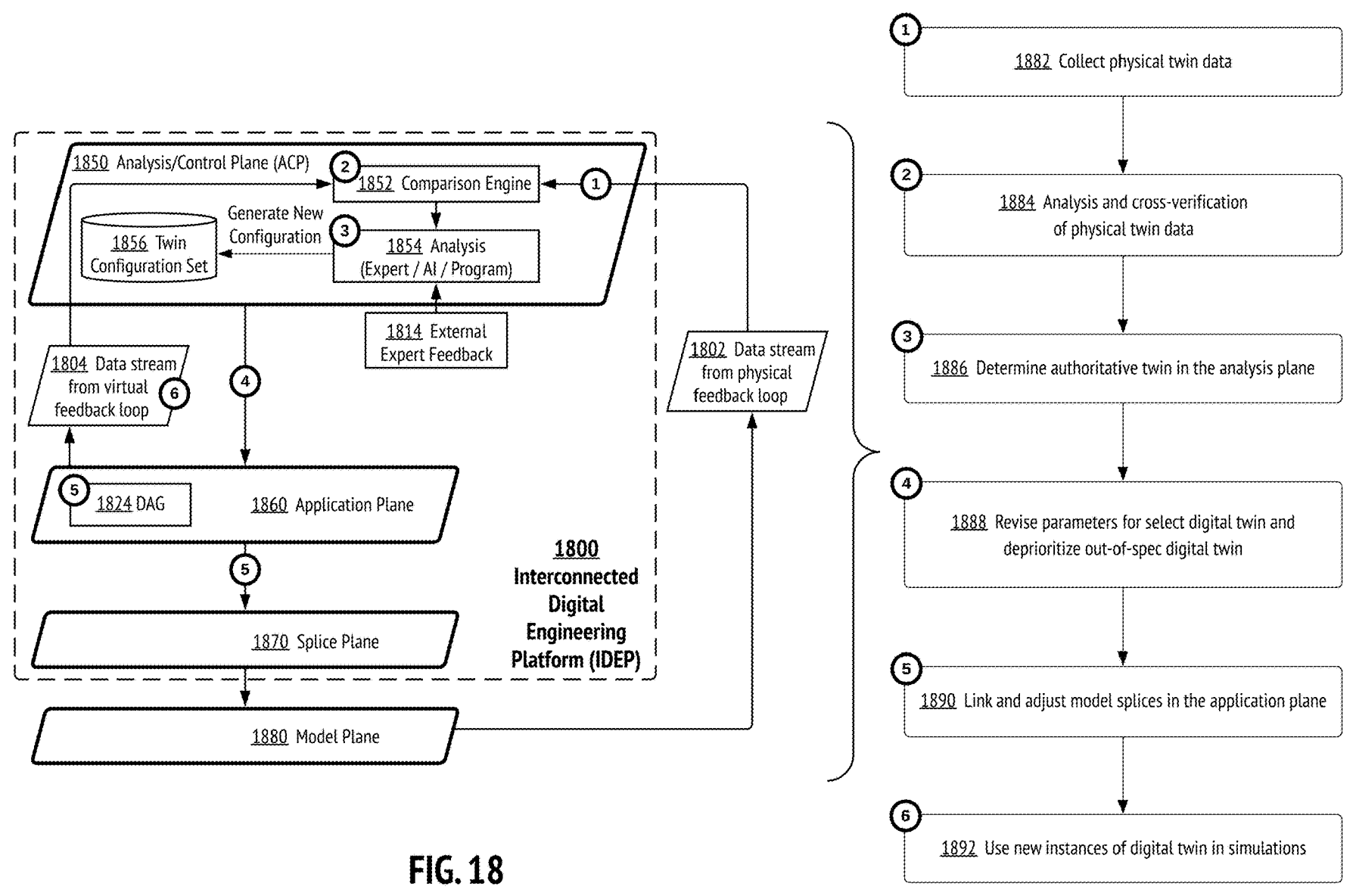

1882  Collect physical twin data

1884  Analysis and cross-verification of physical twin data

1886  Determine authoritative twin in the analysis plane

1888  Revise parameters for select digital twin and deprioritize out-of-spec digital twin 1890  Link and adjust model splices in the application plane 1892  Use new instances of digital twin in simulations 1802  Data stream from physical feedback loop 1850  Analysis/Control Plane (ACP)

1852  Comparison Engine

1854  Analysis (Expert / AI / Program)

1814  External Expert Feedback

Generate New Configuration

1856  Twin Configuration Set

1804  Data stream from virtual feedback loop

1800 Interconnected Digital Engineering Platform (IDEP)

1860  Application Plane

1824  DAG

1870  Splice Plane

1880  Model Plane

FIG. 18

2410 Upload model (e.g., seat CAD model) into IDEP application.

2420 Use GUI for seat requirements verification.

2430 Upload requirements.

2440 Walk through requirements use cases.

2450 Start verification.

2460 Verification process, with human expert feedback.

2470 Report, with digital signature.

AI-assisted requirements verification

DIGITAL TWIN AND PHYSICAL TWIN MANAGEMENT WITH INTEGRATED EXTERNAL FEEDBACK WITHIN A DIGITAL ENGINEERING PLATFORM

REFERENCE TO RELATED APPLICATIONS

If an Application Data Sheet ("ADS") or PCT Request Form ("Request") has been filed on the filing date of this application, it is incorporated by reference herein. Any applications claimed on the ADS or Request for priority under 35 U.S.C. §§ 119, 120, 121, or 365 (c), and any and all parent, grandparent, great-grandparent, etc. applications of such applications, are also incorporated by reference, including any priority claims made in those applications and any material incorporated by reference, to the extent such subject matter is not inconsistent herewith.

Furthermore, this application is related to the U.S. patent applications listed below, which are incorporated by reference in their entireties herein, as if fully set forth herein:

PCT patent application No. PCT/US24/19297, filed on Mar. 10, 2024, entitled "Software-Code-Defined Digital Threads in Digital Engineering Systems with Artificial Intelligence (AI) Assistance," describes AI-assisted digital threads for digital engineering platforms.

PCT patent application No. PCT/US24/14030, filed on Feb. 1, 2024, entitled "Artificial Intelligence (AI) Assisted Digital Documentation for Digital Engineering," describes AI-assisted documentation for digital engineering platforms.

U.S. provisional patent application No. 63/442,659, filed on Feb. 1, 2023, entitled "AI-Assisted Digital Documentation for Digital Engineering with Supporting Systems and Methods," describes AI-assistance tools for digital engineering, including modeling and simulation applications, and the certification of digitally engineered products.

U.S. provisional patent application No. 63/451,545, filed on Mar. 10, 2023, entitled "Digital Threads in Digital Engineering Systems, and Supporting AI-Assisted Digital Thread Generation," describes model splicer and digital threading technology.

U.S. provisional patent application No. 63/451,577, filed on Mar. 11, 2023, entitled "Model Splicer and Microservice Architecture for Digital Engineering," describes model splicer technology.

U.S. provisional patent application No. 63/462,988, filed on Apr. 29, 2023, also entitled "Model Splicer and Microservice Architecture for Digital Engineering," describes model splicer technology.

U.S. provisional patent application No. 63/511,583, filed on Jun. 30, 2023, entitled "AI-Assisted Model Splicer Generation for Digital Engineering," describes model splicer technology with AI-assistance.

U.S. provisional patent application No. 63/516,624, filed on Jul. 31, 2023, entitled "Document and Model Splicing for Digital Engineering," describes document splicer technology.

U.S. provisional patent application No. 63/520,643, filed on Aug. 20, 2023, entitled "Artificial Intelligence (AI)-Assisted Automation of Testing in a Software Environment," describes software testing with AI-assistance.

U.S. provisional patent application No. 63/590,420, filed on Oct. 14, 2023, entitled "Commenting and Collaboration Capability within Digital Engineering Platform," describes collaborative capabilities.

U.S. provisional patent application No. 63/586,384, filed on Sep. 28, 2023, entitled "Artificial Intelligence (AI)-Assisted Streamlined Model Splice Generation, Unit Testing, and Documentation," describes streamlined model splicing, testing and documentation with AI-assistance.

U.S. provisional patent application No. 63/470,870, filed on Jun. 3, 2023, entitled "Digital Twin and Physical Twin Management with Integrated External Feedback within a Digital Engineering Platform," describes digital and physical twin management and the integration of external feedback within a DE platform.

U.S. provisional patent application No. 63/515,071, filed on Jul. 21, 2023, entitled "Generative Artificial Intelligence (AI) for Digital Engineering," describes an AI-enabled digital engineering task fulfillment process within a DE software platform.

U.S. provisional patent application No. 63/517,136, filed on Aug. 2, 2023, entitled "Machine Learning Engine for Workflow Enhancement in Digital Engineering," describes a machine learning engine for model splicing and DE script generation.

U.S. provisional patent application No. 63/516,891, filed on Aug. 1, 2023, entitled "Multimodal User Interfaces for Digital Engineering," describes multimodal user interfaces for DE systems.

U.S. provisional patent application No. 63/580,384, filed on Sep. 3, 2023, entitled "Multimodal Digital Engineering Document Interfaces for Certification and Security Reviews," describes multimodal user interfaces for certification and security reviews.

U.S. provisional patent application No. 63/613,556, filed on Dec. 21, 2023, entitled "Alternative Tool Selection and Optimization in an Integrated Digital Engineering Platform," describes tool selection and optimization.

U.S. provisional patent application No. 63/584,165, filed on Sep. 20, 2023, entitled "Methods and Systems for Improving Workflows in Digital Engineering," describes workflow optimization in a DE platform.

U.S. provisional patent application No. 63/590,456, filed on Oct. 15, 2023, entitled "Data Sovereignty Assurance for Artificial Intelligence (AI) Models," relates to data sovereignty assurance during AI model training and evaluation.

U.S. provisional patent application No. 63/606,030, filed on Dec. 4, 2023, also entitled "Data Sovereignty Assurance for Artificial Intelligence (AI) Models," further details data sovereignty assurances during AI model training and evaluation.

U.S. provisional patent application No. 63/419,051, filed on Oct. 25, 2022, entitled "Interconnected Digital Engineering and Certification Ecosystem."

U.S. non-provisional patent application Ser. No. 17/973, 142 filed on Oct. 25, 2022, entitled "Interconnected Digital Engineering and Certification Ecosystem."

U.S. non-provisional patent application Ser. No. 18/383, 635, filed on Oct. 25, 2023, entitled "Interconnected Digital Engineering and Certification Ecosystem."

U.S. provisional patent application No. 63/489,401, filed on Mar. 9, 2023, entitled "Security Architecture for Interconnected Digital Engineering and Certification Ecosystem."

NOTICE OF COPYRIGHTS AND TRADEDRESS

A portion of the disclosure of this patent document contains material which is subject to copyright protection.

This patent document may show and/or describe matter which is or may become tradedress of the owner. The copyright and tradedress owner has no objection to the facsimile reproduction by anyone of the patent disclosure as it appears in the U.S. Patent and Trademark Office files or records, but otherwise reserves all copyright and tradedress rights whatsoever.

ISTARI DIGITAL is a trademark name carrying embodiments of the present invention, and hence, the aforementioned trademark name may be interchangeably used in the specification and drawings to refer to the products/process offered by embodiments of the present invention. The terms ISTARI and ISTARI DIGITAL may be used in this specification to describe the present invention, as well as the company providing said invention.

FIELD OF THE INVENTION

This disclosure relates to tools for digital engineering, including modeling and simulation applications, and the certification of digitally engineered products. Specifically, this disclosure relates to methods and systems for the manipulation and management of digital threads, digital twins, and physical twins throughout the product life cycle.

BACKGROUND OF THE INVENTION

The statements in the background of the invention are provided to assist with understanding the invention and its applications and uses, and may not constitute prior art.

Digital twins of physical systems are expected to become crucial throughout the product life cycle, from engineering design, verification, manufacturing, to certification. Current approaches to digital twin generation involve inefficient processes with a large number of engineers working with many disparate engineering tools. This typically requires massive teams of highly specialized engineers and software developers working with data and models from the siloed tools, while cross-platform collaboration is often further impeded by the mismatch of software skill sets among highly expensive subject matter experts, given the sheer number of different digital engineering model types in use today. The resulting "spaghetti monster" of code, data, and engineering models is difficult to track and update, especially with limited budgets.

Furthermore, the full power of digital twins can only be realized through iterative revisions that require external feedback throughout the product life cycle. External feedback may be defined as input from external data sources, such as physical prototypes and their environment, virtual prototypes, performance data from simulations, and even feedback from subject matter experts. In particular, the multiple design iteration and certification processes of modern systems are complex and require information and tests that largely occur in the physical world using physical manifestations of digitally engineered systems. The integration of external feedback, whether from physical, virtual, or human sources, may streamline these iterative digital engineering processes, thus dramatically reducing design, manufacturing, and certification delays, as well as their associated costs. The streamlined processes for design, testing, and production would ensure a seamless transition from concept to final product, thus simplifying linking digital models and simulations, reducing delays and inefficiencies. However, the integration of external feedback into the digital twin design process makes the "spaghetti monster" problem even worse. Furthermore, the fact that each of the feedback sources or digital models are likely from different sources or organizations compounds the security issues associated with iterative digital engineering.

Therefore, in view of the aforementioned difficulties, there is an unsolved need to provide a digital model collaboration platform that integrates external feedback into digital and physical twin manipulation and management throughout the product life cycle, including product design, manufacturing, assembly, manipulating and updating during these steps and during operations. Accordingly, it would be an advancement in the state of the art to enable external feedback within a unified, scalable, collaborative, and secure digital model platform integrating multidisciplinary models from disparate, disconnected tools.

It is against this background that various embodiments of the present invention were developed.

BRIEF SUMMARY OF THE INVENTION

This summary of the invention provides a broad overview of the invention, its application, and uses, and is not intended to limit the scope of the present invention, which will be apparent from the detailed description when read in conjunction with the drawings.

Broadly, the present invention relates to methods and systems for a digital model collaboration system and platform that facilitate the integration of external feedback, whether from physical, virtual, or human sources, into the streamlined design, validation, verification, certification, assembly, operations, and maintenance processes of complex systems, that could then output updated results to those external sources, including physical twins, other digital twins or models and simulations, and/or human users. External feedback includes feedback data from physical prototypes and their environment, virtual prototypes, simulations, and subject-matter experts. Embodiments of the present invention are directed to integrating external feedback into the assembly and system-level assessment of digital twins, physical twins, digital threads, and the iterative design of constituting digital engineering models, including constructing, maintaining, and improving digital engineering models for the design, validation, verification, certification, operations, and maintenance of complex systems. This is achieved via a unified, scalable, secure, and collaborative digital engineering platform that itself integrates multidisciplinary digital models from disparate, disconnected tools through the use of digital model "splicing." Model splicing encapsulates and compartmentalizes digital engineering model data and model data manipulation and access functionalities, enabling the versatile functionality of the digital model platform.

More specifically, the interconnected digital model platform (IDMP) allows disparate and different sources of data, whether virtual, physical, human, or algorithmic, to be combined in feedback loops using agent-configurable mechanisms (e.g., policies, algorithms, voting schema, statistical) to iteratively determine, track, and use, data sources as more authoritative than others-including designating one as the authoritative source of truth—for specific decisions (e.g., engineering, financial, operational, performance user-driven) as a function of time; this includes feedback loops that allow data sources to improve via iteration (e.g., physical data improving virtual, virtual improving physical).

Accordingly, various methods, processes, systems, and non-transitory storage medium storing program code for executing processes for integrating external feedback within a digital model platform, are provided.

According to a first aspect or in one embodiment, a non-transitory physical storage medium storing program code is provided. The program code is executable by a hardware processor. The hardware processor when executing the program code causes the hardware processor to execute a computer-implemented process for updating a digital twin of a physical product and/or a physical process within an interconnected digital model platform (IDMP). The program code includes code that may receive a model representation connected to a digital model file associated with the digital twin. The model representation may provide access to a digital artifact of the digital model file through the IDMP. The IDMP may be configured to interconnect the digital model file with a different digital model file through a software-code-defined digital thread. The digital model file and the different digital model file may be from two distinct software tools or from two distinct security networks. The program code may comprise code to receive the software-code-defined digital thread. The software-code-defined digital thread may be written as a computer-executable script accessing the digital artifact through the model representation. The software-code-defined digital thread may be configured to execute a scripted workflow associated with the digital twin. The program code may comprise code to generate a twin configuration of the digital twin based on the model representation and the software-code-defined digital thread. The program code may comprise code to store the twin configuration in a twin configuration set of the IDMP. The program code may comprise code to instantiate the digital twin in a virtual environment by executing the software-code-defined digital thread. The program code may comprise code to receive external feedback related to the digital twin. The external feedback may include feedback data from a source external to the digital twin. The program code may comprise code to update the digital twin based on the external feedback to generate an updated digital twin by updating the software-code-defined digital thread through an update to the computer-executable script. The program code may comprise code to update the digital twin based on the external feedback by updating the model representation through an update to the digital artifact. The program code may comprise code to update the digital twin based on the external feedback by updating the twin configuration by modifying a twin configuration feature. The program code may comprise code to generate a new twin configuration based on the updated digital twin. Finally, the program code may comprise code to store the new twin configuration in the twin configuration set.

In one embodiment, the digital model file is selected from the group consisting of a digital engineering (DE) model file, a medical model file, a supply chain logistics model file, a manufacturing model file, and a financial model file.

In one embodiment, the digital model file and the different digital model file are from two distinct software tools. One of the two distinct software tools may be non-proprietary.

In one embodiment, the digital model file and the different digital model file are from two distinct security networks.

In one embodiment, the twin configuration includes a twin version identifier identifying the digital twin, a digital thread identifier identifying the software-code-defined digital thread, a model representation identifier identifying the model representation, and an authoritative twin indicator. The twin configuration feature may be selected from the group of twin configuration features consisting of the digital thread identifier, the model representation identifier, and an authoritative twin indicator.

In one embodiment, the authoritative twin indicator is a boolean indicator indicating whether the digital twin is authoritative. The code to update the twin configuration may include code to modify the authoritative twin indicator.

In one embodiment, the non-transitory physical storage medium further includes program code to designate the new twin configuration as an authoritative twin configuration of the physical product by updating the authoritative twin indicator.

In one embodiment, the new twin configuration is designated as the authoritative twin configuration using an authoritative twin designation ML model. The authoritative twin designation ML model may be trained on an IDMP training dataset including a plurality of sample twin configurations including at least one sample authoritative twin configuration.

In one embodiment, the new twin configuration is designated as the authoritative twin configuration using a configurable mechanism selected from the group consisting of a policy, an algorithm, a voting schema, and a statistical process.

In one embodiment, the model representation includes a model splice connected to the digital model file. The model splice may include one or more splice data items, one or more splice data structures, and a splice function providing access to the digital artifact. The access to the digital artifact may be provided through an Application Programming Interface (API) or Software Development Kit (SDK) endpoint.

In one embodiment, the digital model file and the different digital model file are from different software tools. The software-code-defined digital thread may access a different digital artifact through a different model splice connected to the different digital model file.

In one embodiment, the non-transitory physical storage medium further includes program code to share a model splice associated with the updated digital twin.

In one embodiment, the code to update the model representation includes code to update the model splice. The code to update a given model splice may include code to update a splice feature of the given model splice selected from the group of splice features consisting of a given splice data item of the given model splice, a given splice data structure of the given model splice, and given a splice function of the given model splice.

In one embodiment, the model splice is updated using a splice updating ML model trained on an IDMP training dataset including at least one sample updated model splice and corresponding sample external feedback.

In one embodiment, the non-transitory physical storage medium further includes program code to update a digital document based on the updated digital twin.

In one embodiment, the update to the computer-executable script is carried out using a script-updating ML model. The script-updating ML model may be trained on an IDMP training dataset including at least one sample updated computer-executable script and corresponding sample external feedback.

In one embodiment, the external feedback includes digital twin performance data. The twin configuration may be configured to receive one or more performance data sets from the digital twin. The code to update the twin configuration may include code to modify the one or more performance data sets.

In one embodiment, the non-transitory physical storage medium further includes program code to analyze the digital twin performance data. The code to analyze the digital twin performance data may include code to compare the digital twin performance data with one of a product requirement and a performance data set of the twin configuration.

In one embodiment, analyzing the digital twin performance data includes using an analysis script generated by an analysis ML model. The analysis ML model may be trained on an IDMP training dataset including one or more digital twins and one or more corresponding performance data sets.

In one embodiment, the non-transitory physical storage medium further includes program code to update the virtual environment based on the digital twin performance data. Updating a given virtual environment may include updating one of a parameter and a virtual object of the given virtual environment.

In one embodiment, the digital twin performance data is generated by running the digital twin in the virtual environment.

In one embodiment, the digital twin performance data is generated by running a simulation of one or more components of the digital twin.

In one embodiment, the external feedback includes instructions from a user to update the model representation or the computer-executable script.

In one embodiment, the external feedback is generated by a data source selected from the group of data sources consisting of a sensor, a virtual sensor, a simulation, a physical twin, a digital twin, a product certification file, a product requirements file, and a user input.

In one embodiment, the external feedback includes a feedback suggestion generated by a feedback ML model trained on an IDMP training dataset. The IDMP training dataset may include one or more sample digital twins, one or more sample updated digital twins, and corresponding sample external feedback.

In one embodiment, the non-transitory physical storage medium further includes program code to display the feedback suggestion to a given user for approval. The program code may comprise code to receive a response from the given user to the feedback suggestion.

In one embodiment, the feedback ML model includes a transformer.

In one embodiment, the feedback ML model includes a neural network.

In one embodiment, the non-transitory physical storage medium further includes program code to instantiate a new digital twin based on the new twin configuration. The new digital twin may be instantiated using a computer-executable script generated by a digital twin instantiation ML model. The digital twin instantiation ML model may be trained on an IDMP training dataset. IDMP training dataset may include one or more sample twin configurations and one or more sample computer-executable scripts.

In one embodiment, the non-transitory physical storage medium further includes program code to instantiate a new physical twin based on the new twin configuration. The physical twin may be instantiated in a physical environment based on a plurality of spliced digital model files through a model-based systems engineering (MBSE) manufacturing process. Each spliced digital model file of the plurality of spliced digital model files may be associated with a model splice identified by a splice identifier of the new twin configuration.

In one embodiment, the external feedback is received through a multimodal interface. The multimodal interface may be selected from the group consisting of a 3D visualization interface, a dashboard-style interface, a workflow-based interface, a conversational interface, and a code interface.

In one embodiment, the IDMP is deployed following a deployment configuration selected from the group consisting of an external platform instance, an external platform instance with internal agent, an external platform instance with internal agent and edge computing, an edge instance connection, a direct API connection, and an air-gapped platform instance.

In a second aspect or in yet another embodiment, a computer-implemented method for updating a digital twin of a physical product and/or a physical process within an interconnected digital model platform (IDMP) is disclosed. The method includes receiving a model representation connected to a digital model file associated with the digital twin. The model representation may provide access to a digital artifact of the digital model file through the IDMP. The IDMP may be configured to interconnect the digital model file with a different digital model file through a software-code-defined digital thread. The digital model file and the different digital model file may be from two distinct software tools or from two distinct security networks. The method may further include receiving the software-code-defined digital thread. The software-code-defined digital thread may be written as a computer-executable script accessing the digital artifact through the model representation. The software-code-defined digital thread may be configured to execute a scripted workflow associated with the digital twin. The method may further include generating a twin configuration of the digital twin based on the model representation and the software-code-defined digital thread. The method may further include storing the twin configuration in a twin configuration set of the IDMP. The method may further include instantiating the digital twin in a virtual environment by executing the software-code-defined digital thread. The method may further include receiving external feedback related to the digital twin. The external feedback may include feedback data from a source external to the digital twin. The method may further include updating the digital twin based on the external feedback to generate an updated digital twin by updating the software-code-defined digital thread through an update to the computer-executable script. The method may further include updating the digital twin based on the external feedback by updating the model representation through an update to the digital artifact. The method may further include updating the digital twin based on the external feedback by updating the twin configuration by modifying a twin configuration feature. The method may further include generating a new twin configuration based on the updated digital twin. Finally, the method may further include storing the new twin configuration in the twin configuration set.

Embodiments as set out for the first aspect may apply equally to the second aspect.

In various aspects and embodiments, a computer program product is provided. The computer program may be used for integrating external feedback within an IDEP, and may include a computer-readable storage medium having program instructions, or program code, embodied therewith, the program instructions executable by a processor to cause the processor to perform the aforementioned steps.

In various aspects and embodiments, a system for integrating external feedback within an IDEP is provided, the system including a memory that stores computer-executable components, and a hardware processor, operably coupled to the memory, and that executes the computer-executable components stored in the memory, where the computer-executable components may include components communicatively coupled with the processor that execute the aforementioned steps.

In various aspects and embodiments, a system for integrating external feedback within an IDEP is provided, the system including a user device having a processor, a display, a first memory; a server including a second memory and a data repository; a communications link between said user device and said server; and a plurality of computer codes embodied on said first and second memory of said user device and said server, said plurality of computer codes which when executed causes said server and said user device to execute a process including the steps described herein.

In various aspects and embodiments, a computerized server is provided, including at least one processor, memory, and a plurality of computer codes embodied on said memory, said plurality of computer codes which when executed causes said processor to execute a process including the steps described herein. Other aspects and embodiments of the present invention include the methods, processes, and algorithms including the steps described herein, and also include the processes and modes of operation of the systems and servers described herein.

In various aspects and embodiments, an edge computerized system is provided, the edge computerized system running on a physical system or physical twin (PTw) with either access to, or dedicated, processing, memory, computer code stored on a non-transitory computer-readable storage medium of the physical system or PTw, and a plurality of sensor data being measured on said physical system or PTw, the computer code causing the processor to perform the aforementioned steps.

Other aspects and embodiments of the present invention include the methods, processes, and algorithms comprising the steps described herein, and also include the processes and modes of operation of the systems and servers described herein.

Features which are described in the context of separate aspects and/or embodiments of the invention may be used together and/or be interchangeable wherever possible. Similarly, where features are, for brevity, described in the context of a single embodiment, those features may also be provided separately or in any suitable sub-combination. Features described in connection with the non-transitory physical storage medium may have corresponding features definable and/or combinable with respect to a digital model system and/or method and/or system, or vice versa, and these embodiments are specifically envisaged.

Yet other aspects and embodiments of the present invention will become apparent from the detailed description of the invention when read in conjunction with the attached drawings.

BRIEF DESCRIPTION OF THE DRAWINGS

The accompanying drawings, which are incorporated in and constitute part of this specification, illustrate embodiments of the invention and together with the description, serve to explain the principles of the disclosed embodiments. For clarity, simplicity, and flexibility, not all elements, components, or specifications are defined in all drawings. Not all drawings corresponding to specific steps or embodiments of the present invention are drawn to scale. Emphasis is instead placed on illustration of the nature, function, and product of the manufacturing method and devices described herein.

Embodiments of the present invention described herein are exemplary, and not restrictive. Embodiments will now be described, by way of examples, with reference to the accompanying drawings, in which:

Interconnected Digital Engineering Platform

Figure 1:
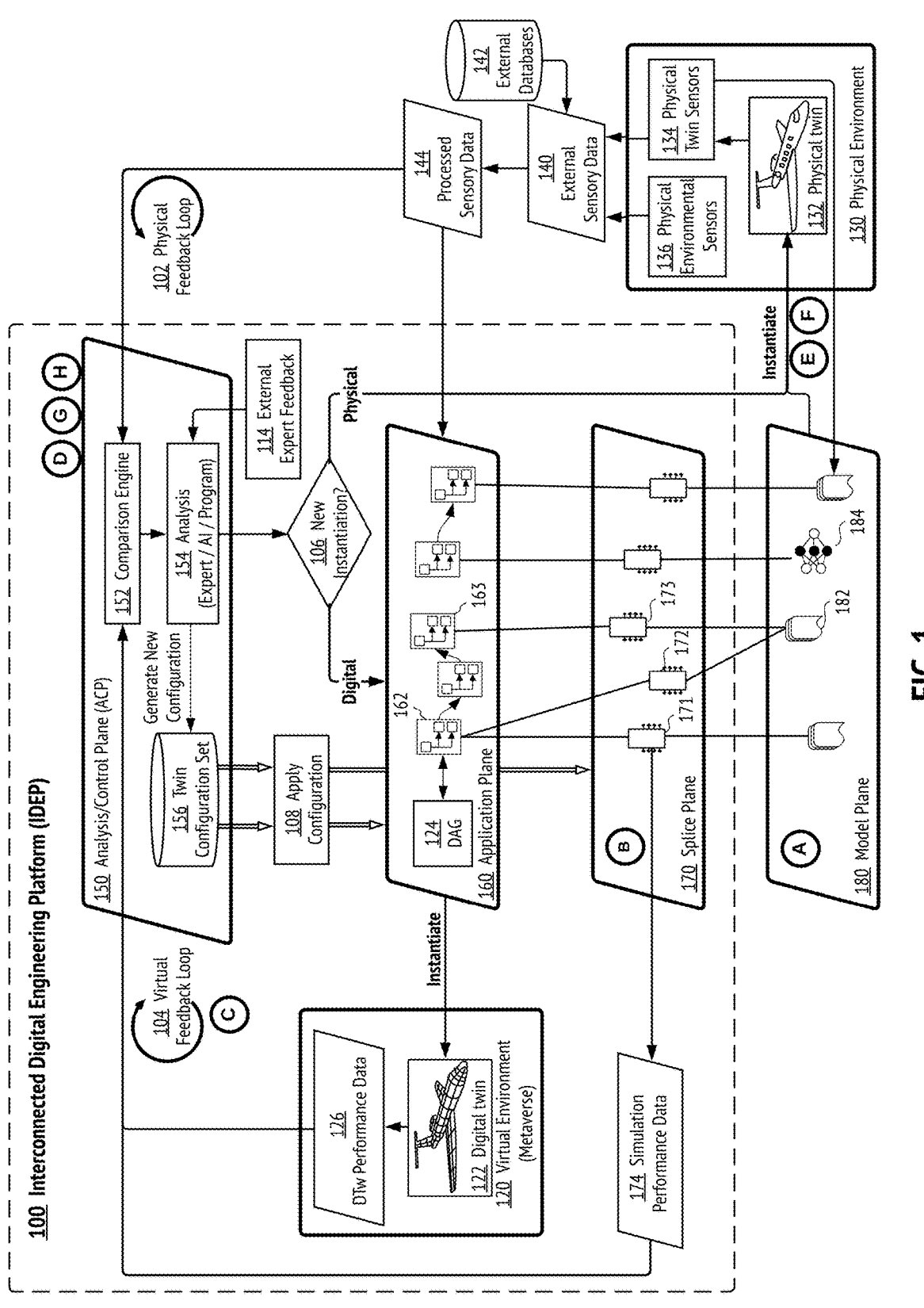

FIG. 1 shows an exemplary interconnected digital engineering (IDEP) platform architecture, in accordance with some embodiments of the present invention.

Figure 2:
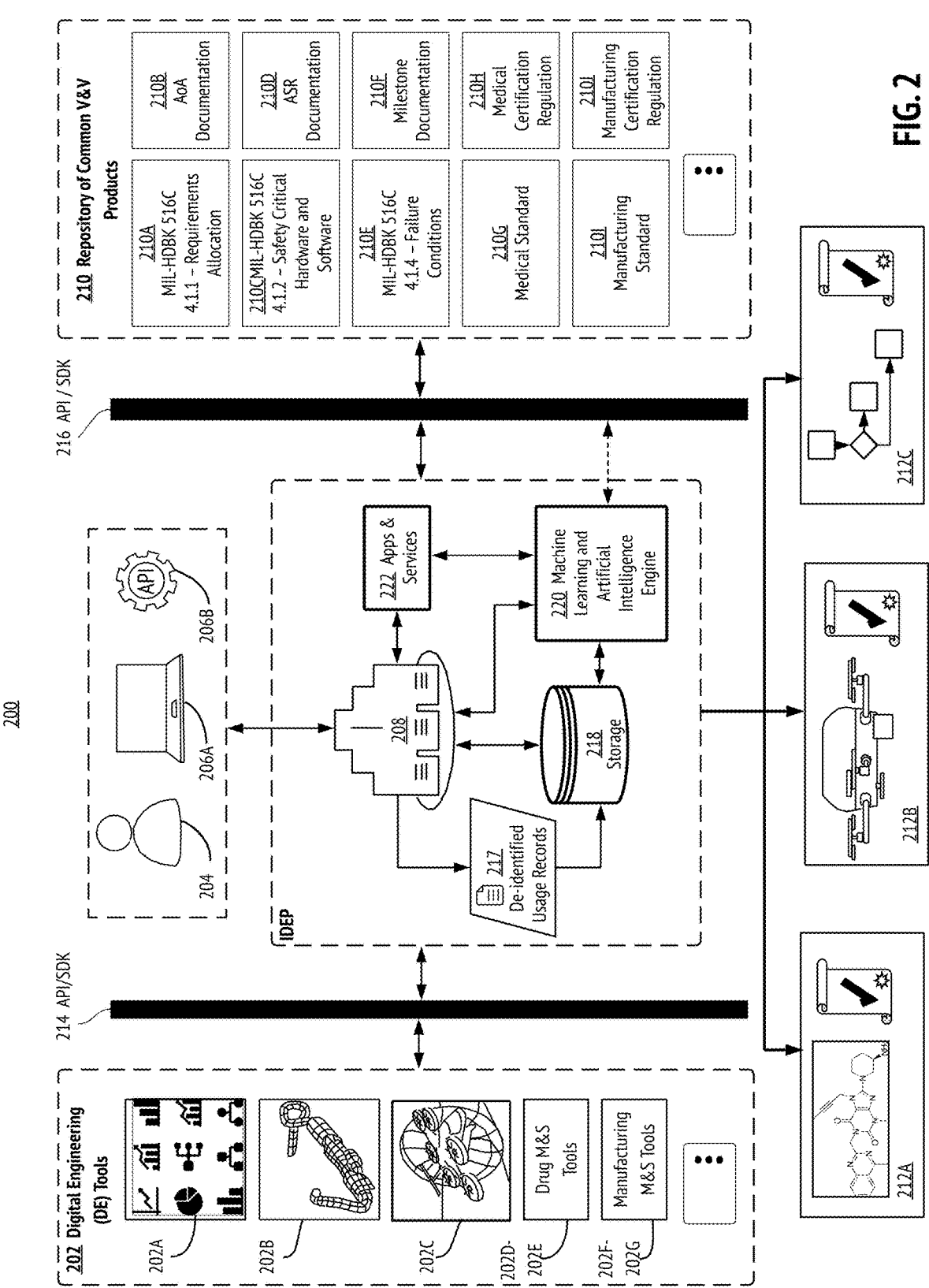

FIG. 2 shows an exemplary implementation of the IDEP as an interconnected digital engineering (DE) and certification ecosystem, and exemplary digitally certified products, in accordance with some embodiments of the present invention.

Figure 3:
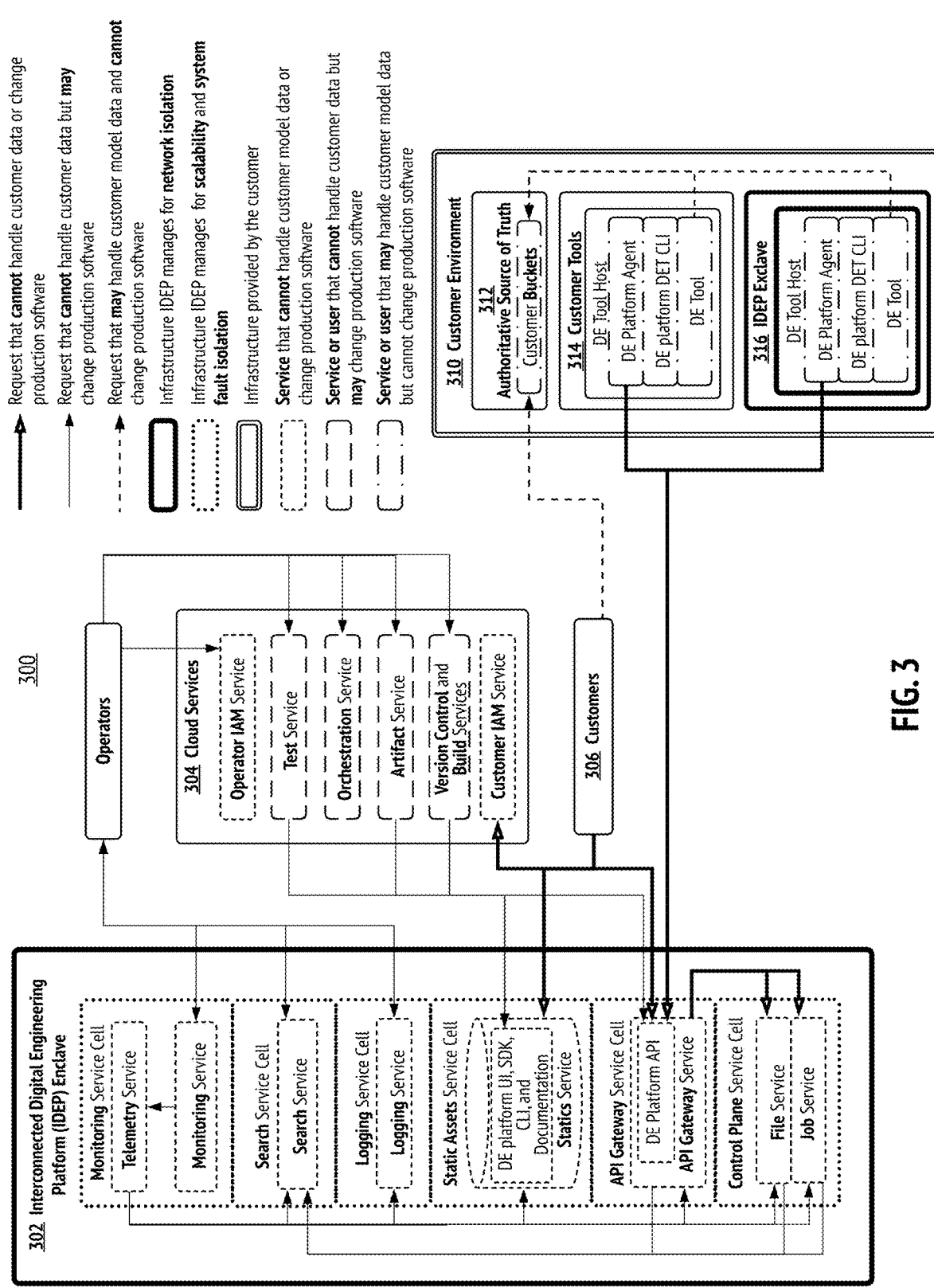

FIG. 3 shows another exemplary implementation of the IDEP illustrating its offered services and features, in accordance with some embodiments of the present invention.

Figure 4:
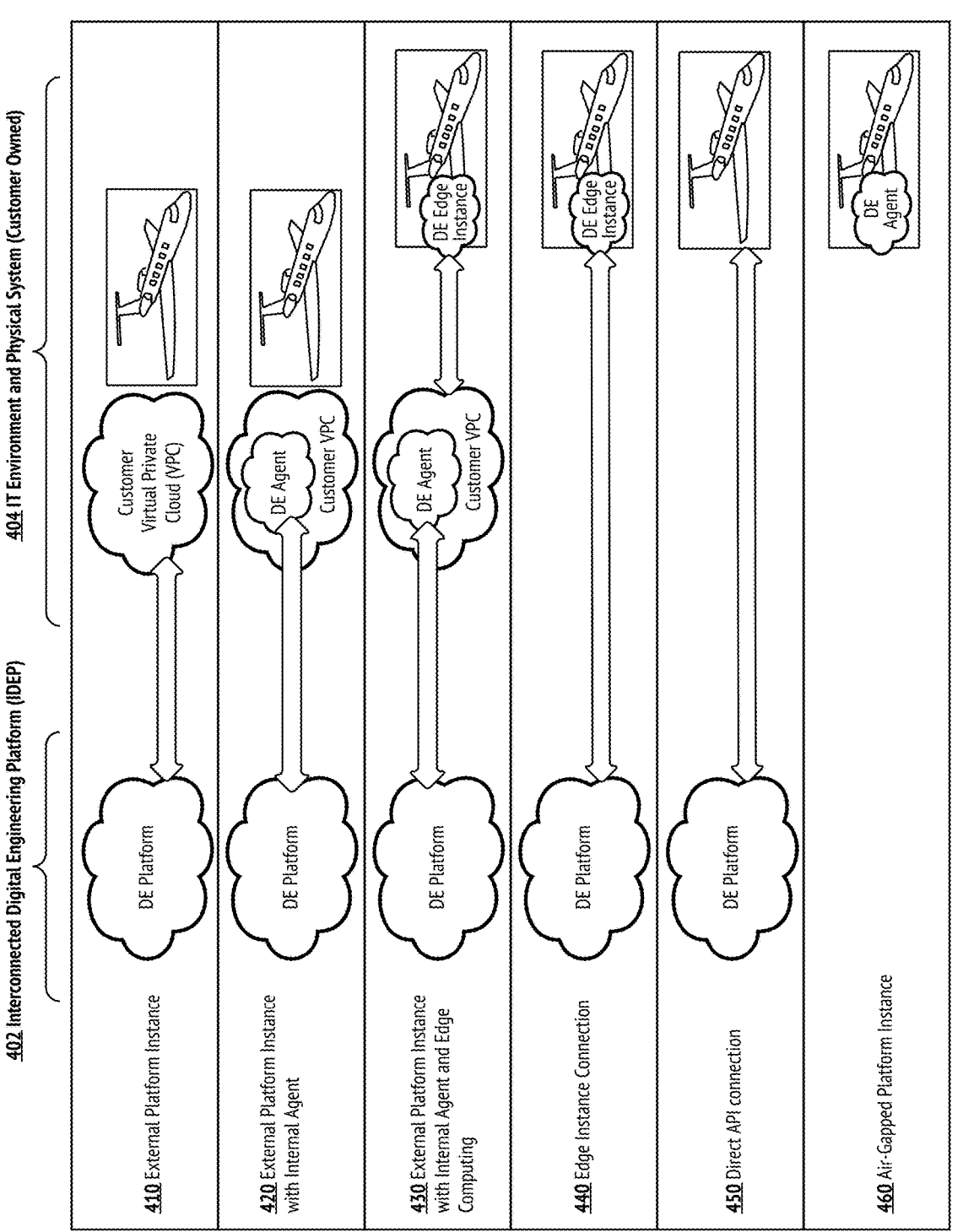

FIG. 4 shows potential scenarios for instantiating an IDEP in connection to a customer's physical system and IT environment, in accordance with some embodiments of the present invention.

Figure 5:
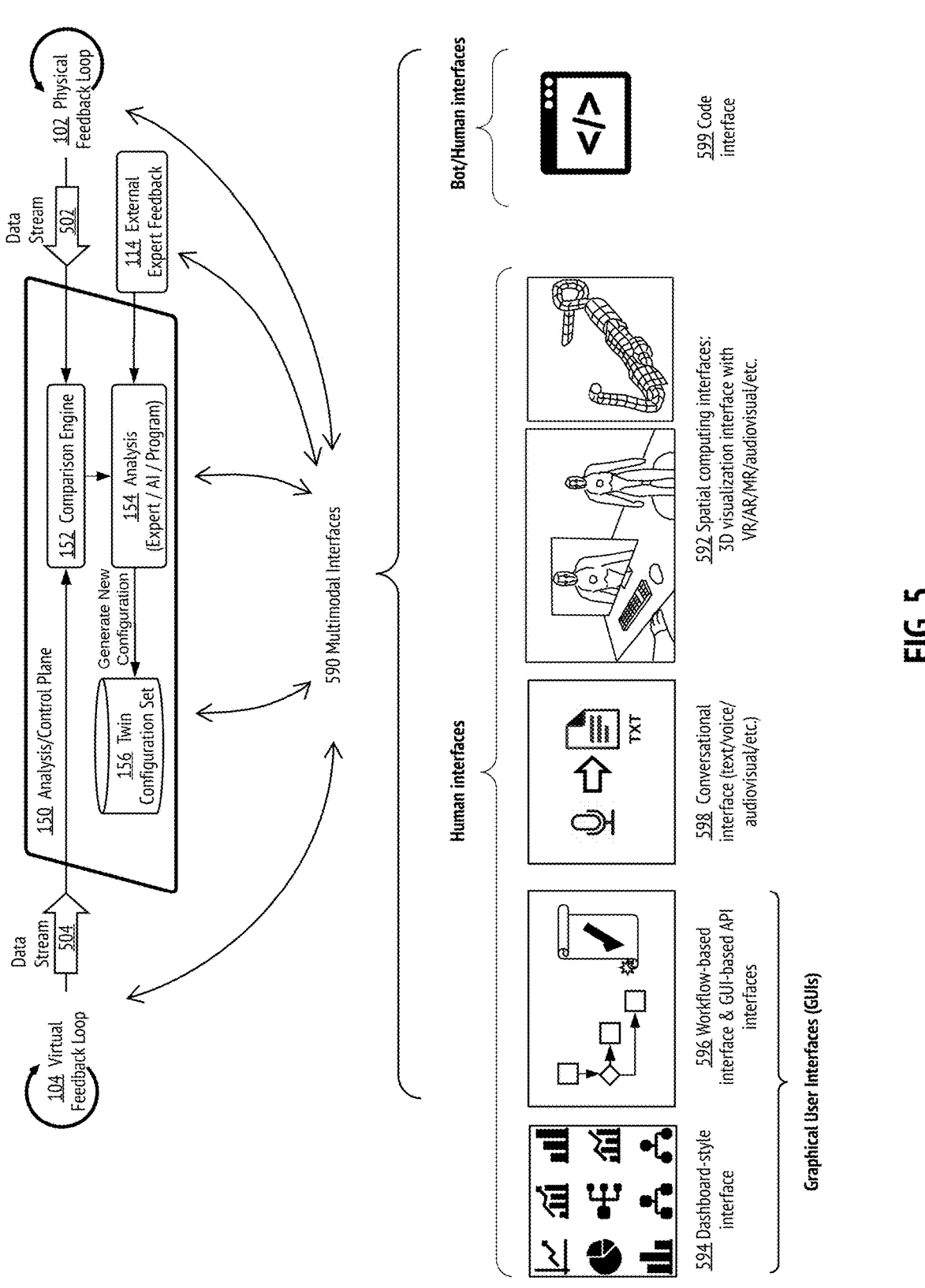

FIG. 5 shows exemplary multimodal interface designs for integration of feedback in am IDEP, in accordance with some embodiments of the present invention.

Digital Engineering Platform Links Digital Models into Digital Threads

Figure 6:
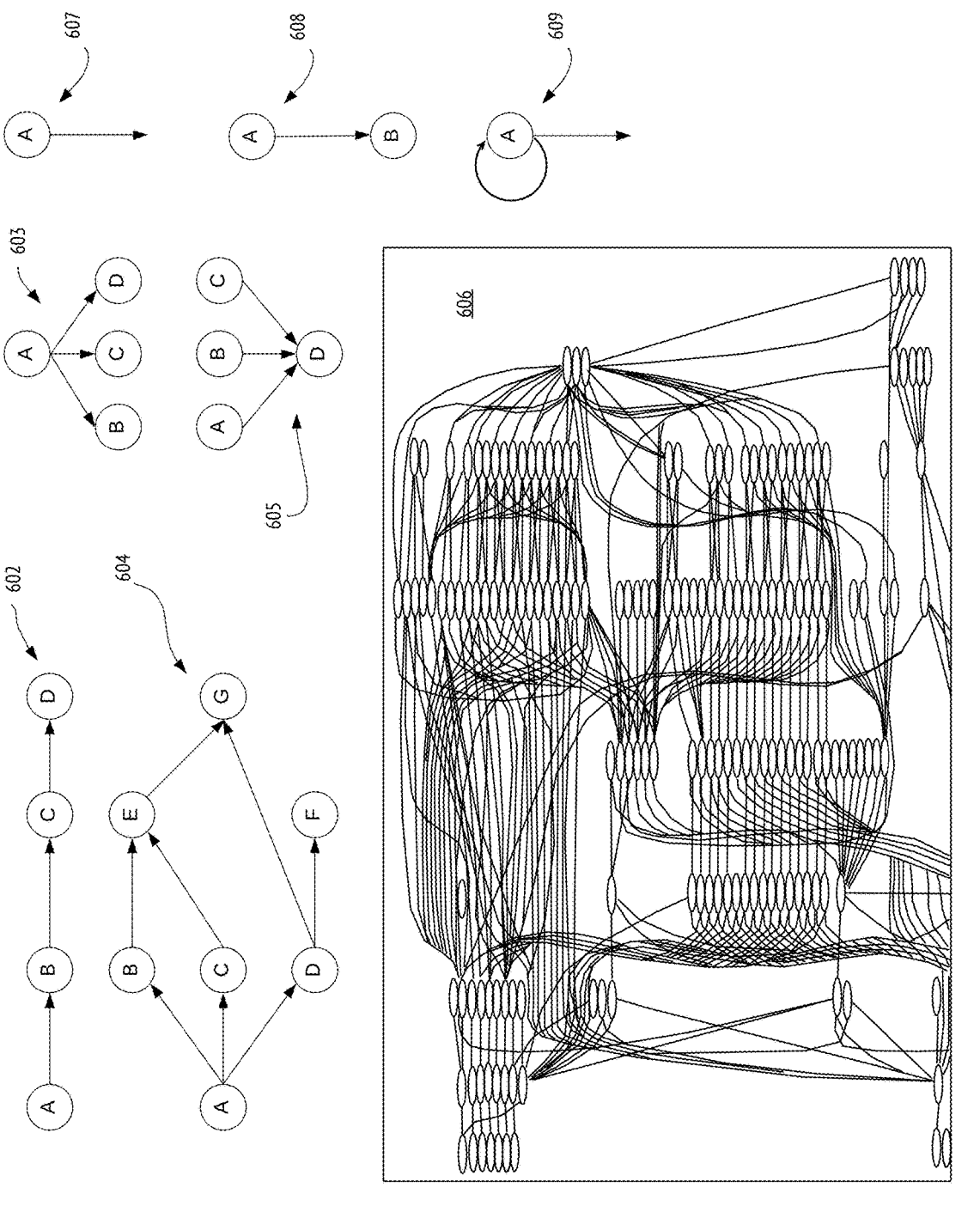

FIG. 6 is a schematic diagram comparing exemplary digital threads that connect DE models, in accordance with some embodiments of the present invention.

Figure 7:
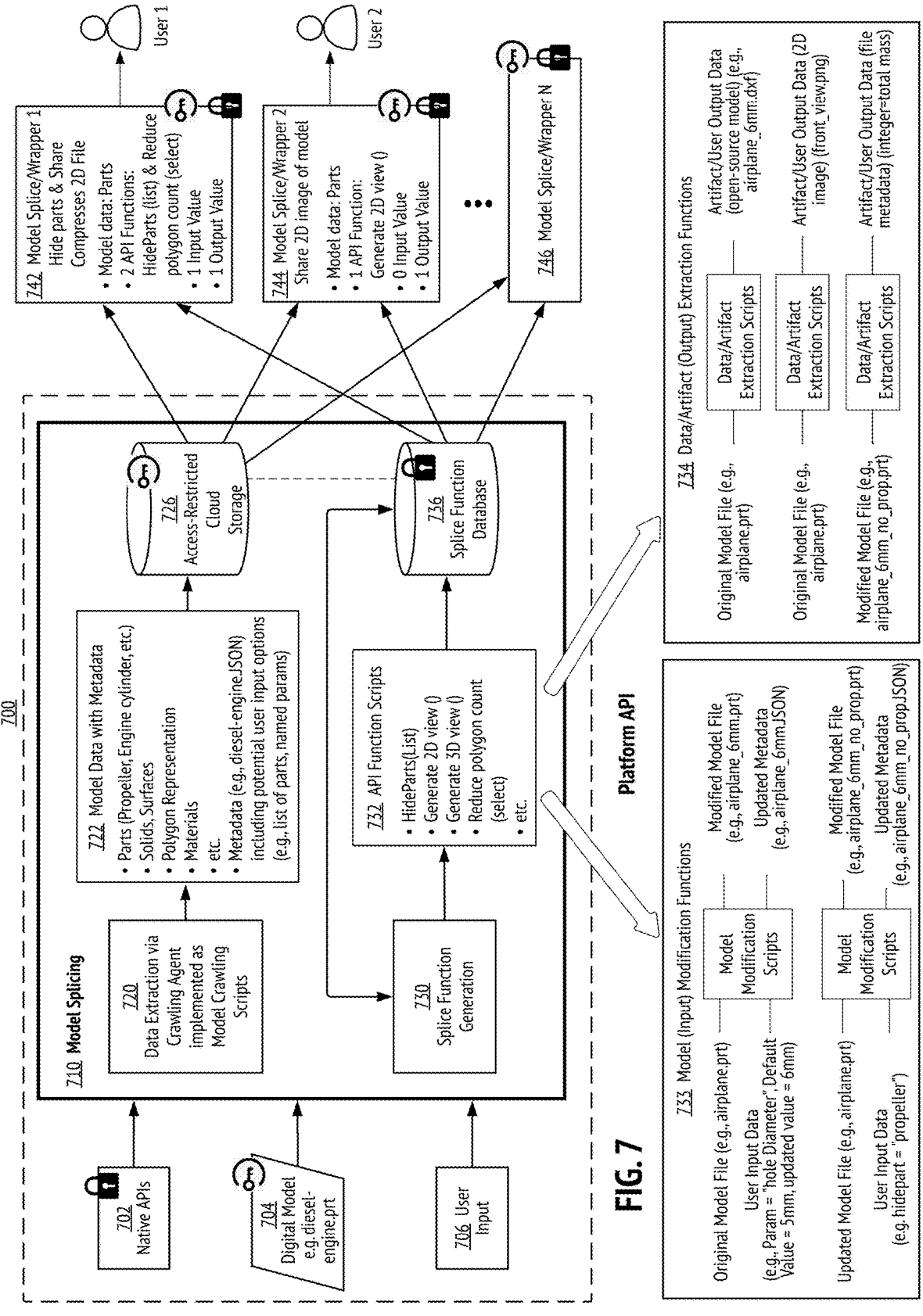

FIG. 7 is a schematic showing an exemplary DE model splicing setup, in accordance with some embodiments of the present invention.

Figure 8:
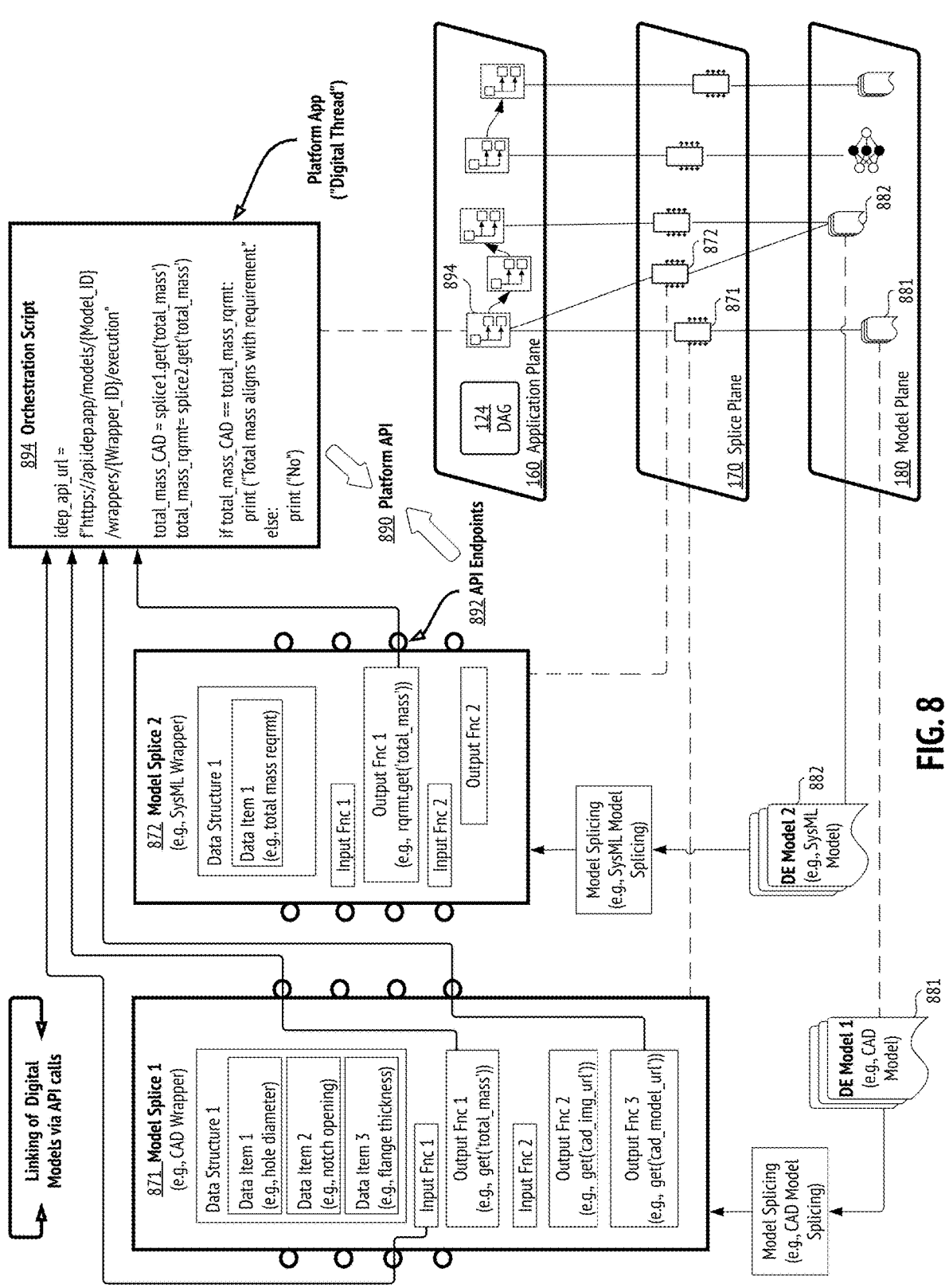

FIG. 8 is a schematic showing digital threading of DE models via model splicing, in accordance with some embodiments of the present invention.

Figure 9:
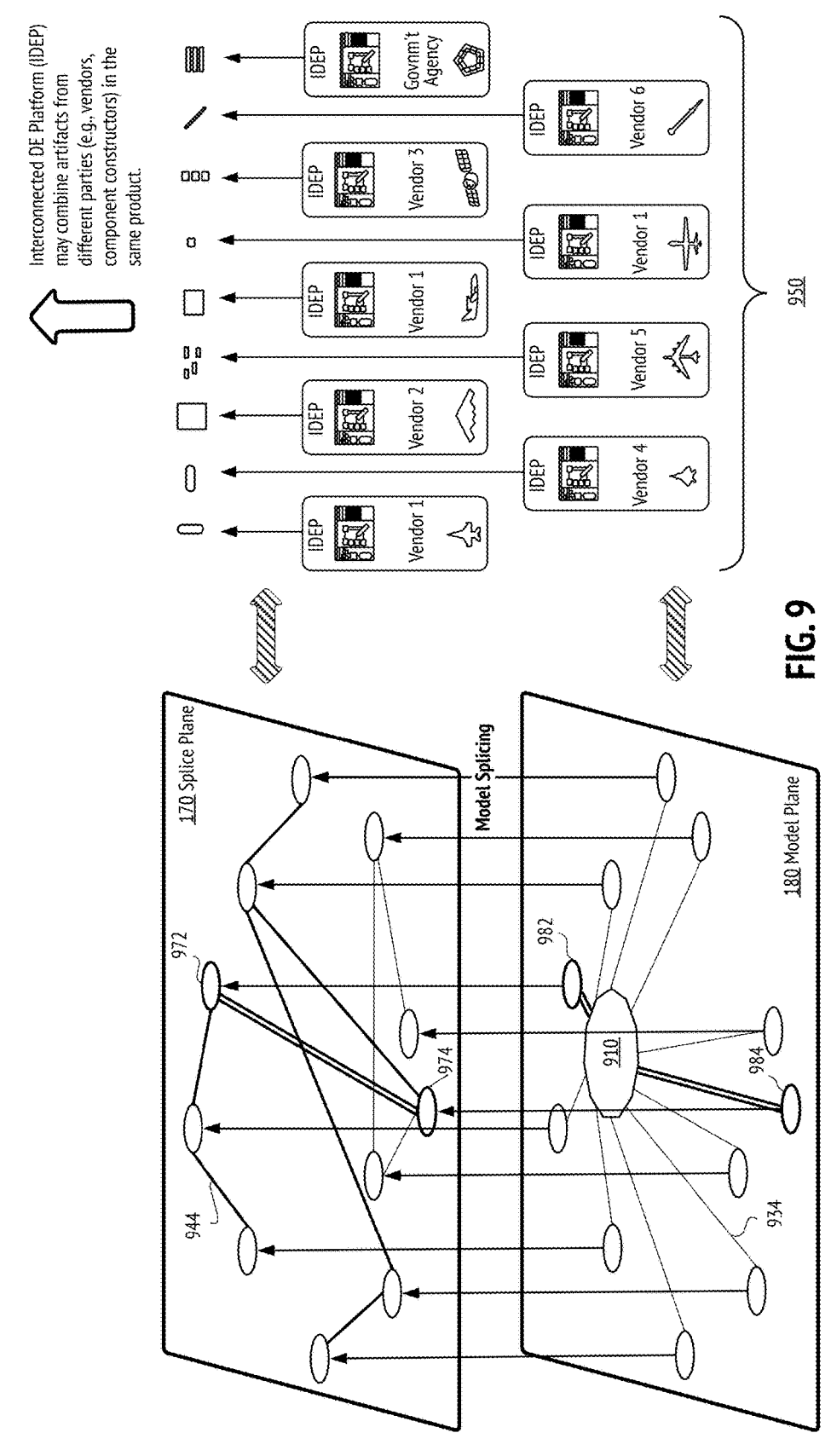

FIG. 9 is a schematic illustrating the linking of DE model splices in a splice plane and comparing digital threading with and without model splicing, in accordance with some embodiments of the present invention.

Figure 10:
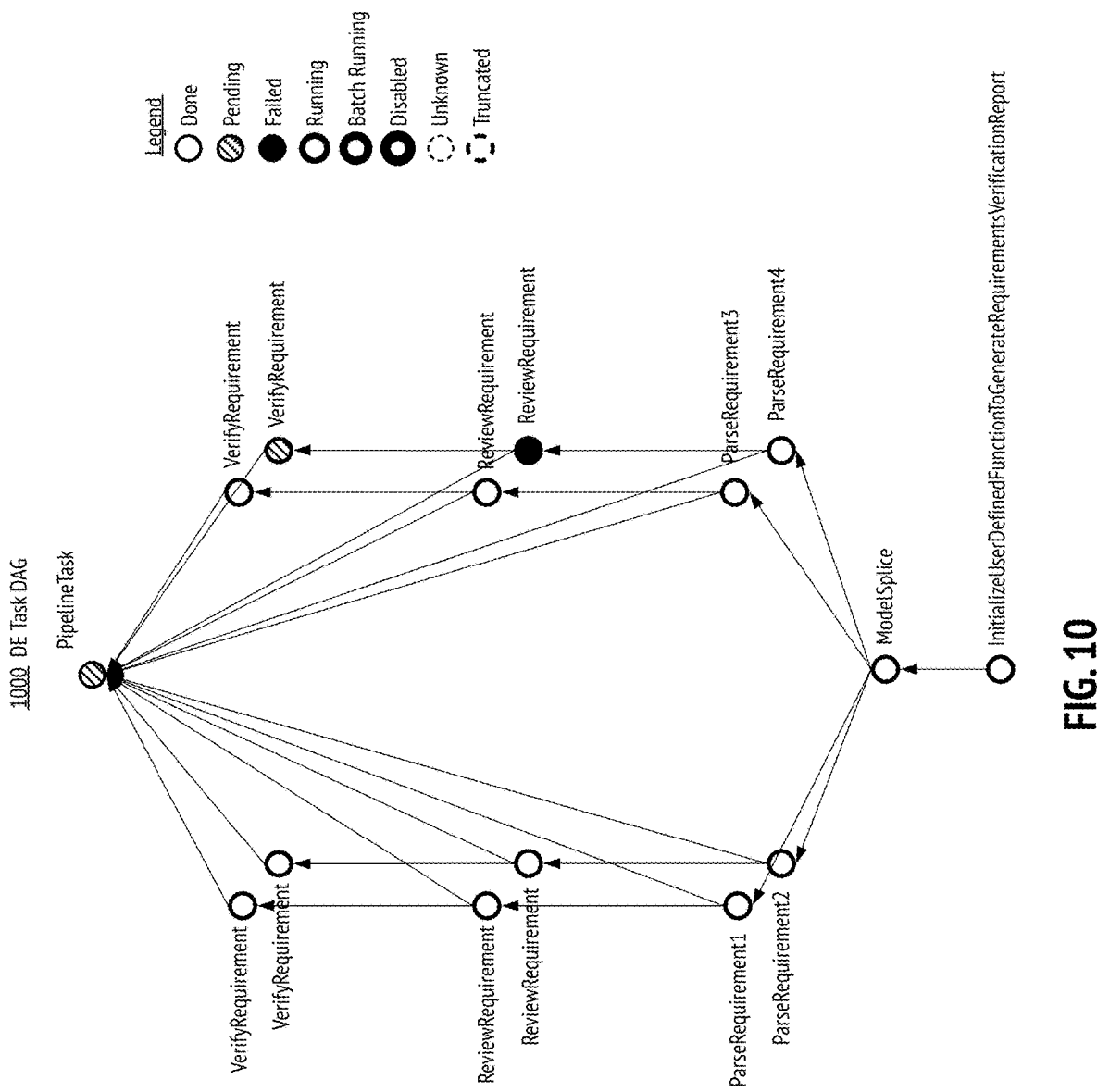

FIG. 10 shows an exemplary directed acyclic graph (DAG) representation of pipelined DE tasks related to digital threads, in accordance with some embodiments of the present invention.

Exemplary IDEP Graphical User Interfaces

Figure 11:
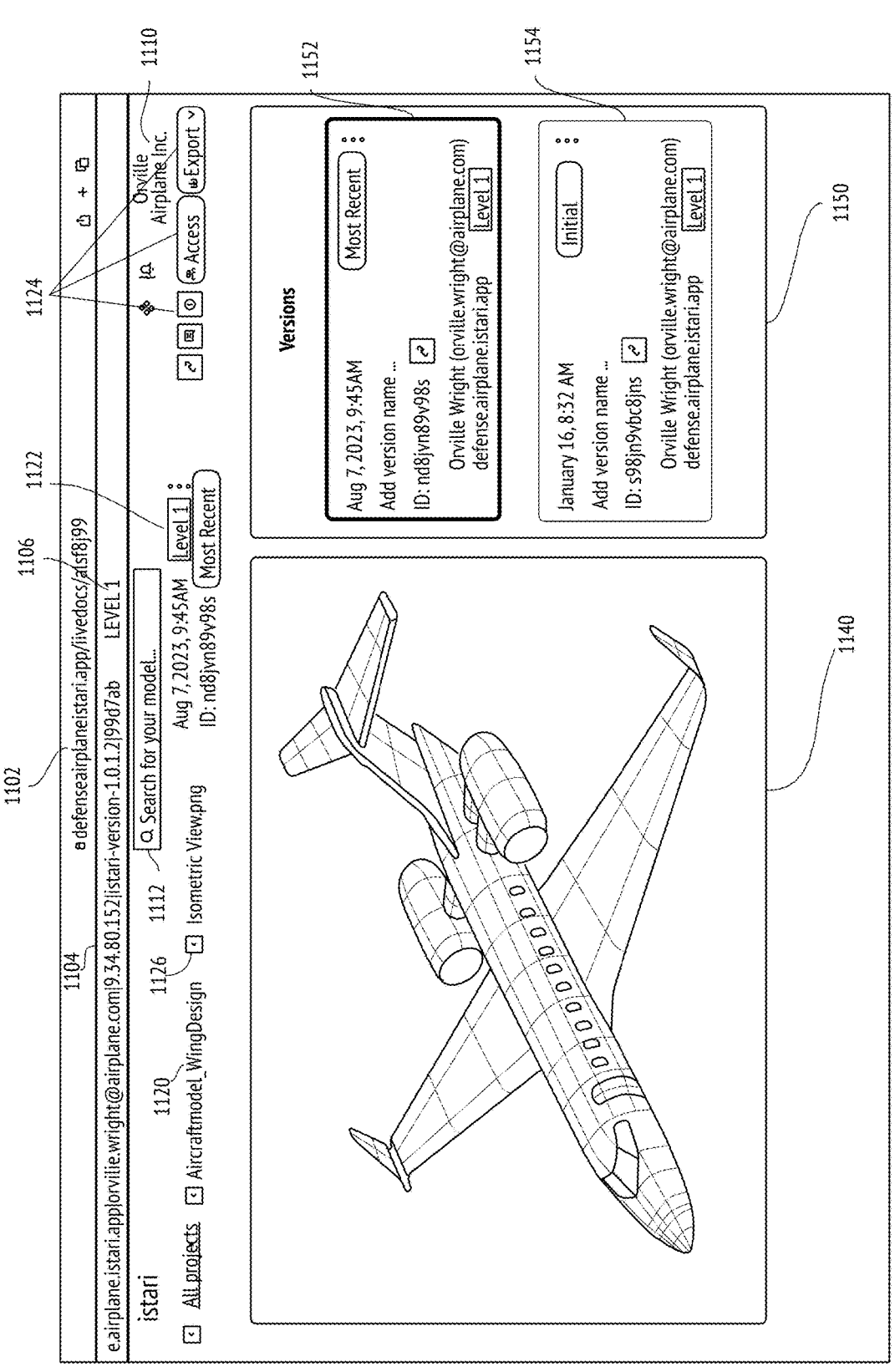

FIG. 11 shows a screenshot of an exemplary graphical user interface (GUI) used to operate a digital thread over the IDEP, according to one embodiment of the present invention.

Figure 12:
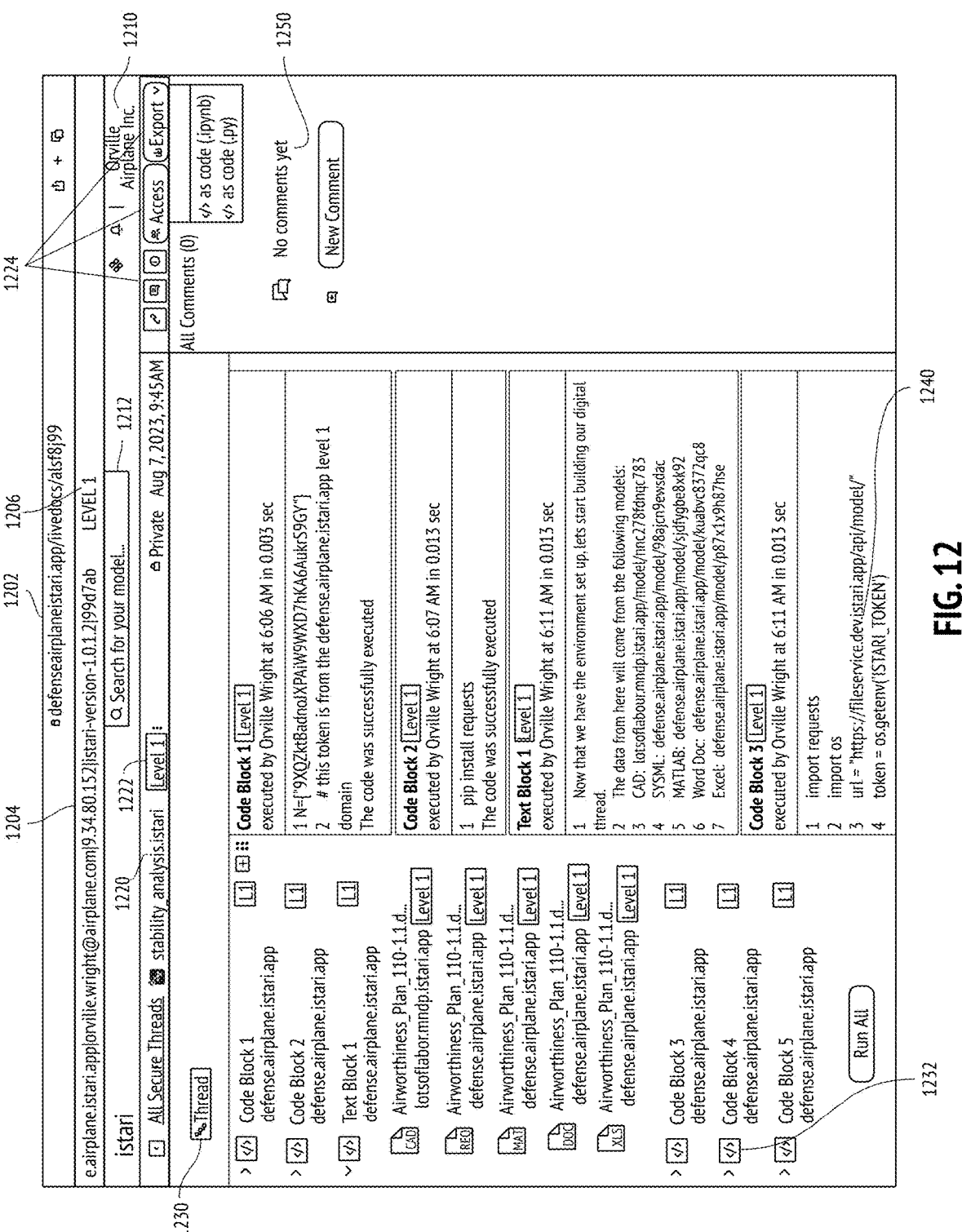

FIG. 12 shows a screenshot of another exemplary graphical user interface (GUI) used to operate a digital thread over the IDEP, according to one embodiment of the present invention.

Updating Digital Twins Over the IDEP

FIG. 13 is an exemplary flow chart showing a process for updating a digital twin within an IDEP based on external feedback, in accordance with some embodiments of the present invention.

FIG. 14 shows an exemplary flow chart for instantiating a new digital twin (DTw) within a digital engineering platform based on external feedback, in accordance with one embodiment of the present invention.

FIG. 15 is an exemplary flow chart showing another process for updating a digital twin within an IDEP based on external feedback, in accordance with some embodiments of the present invention.

Figure 16:
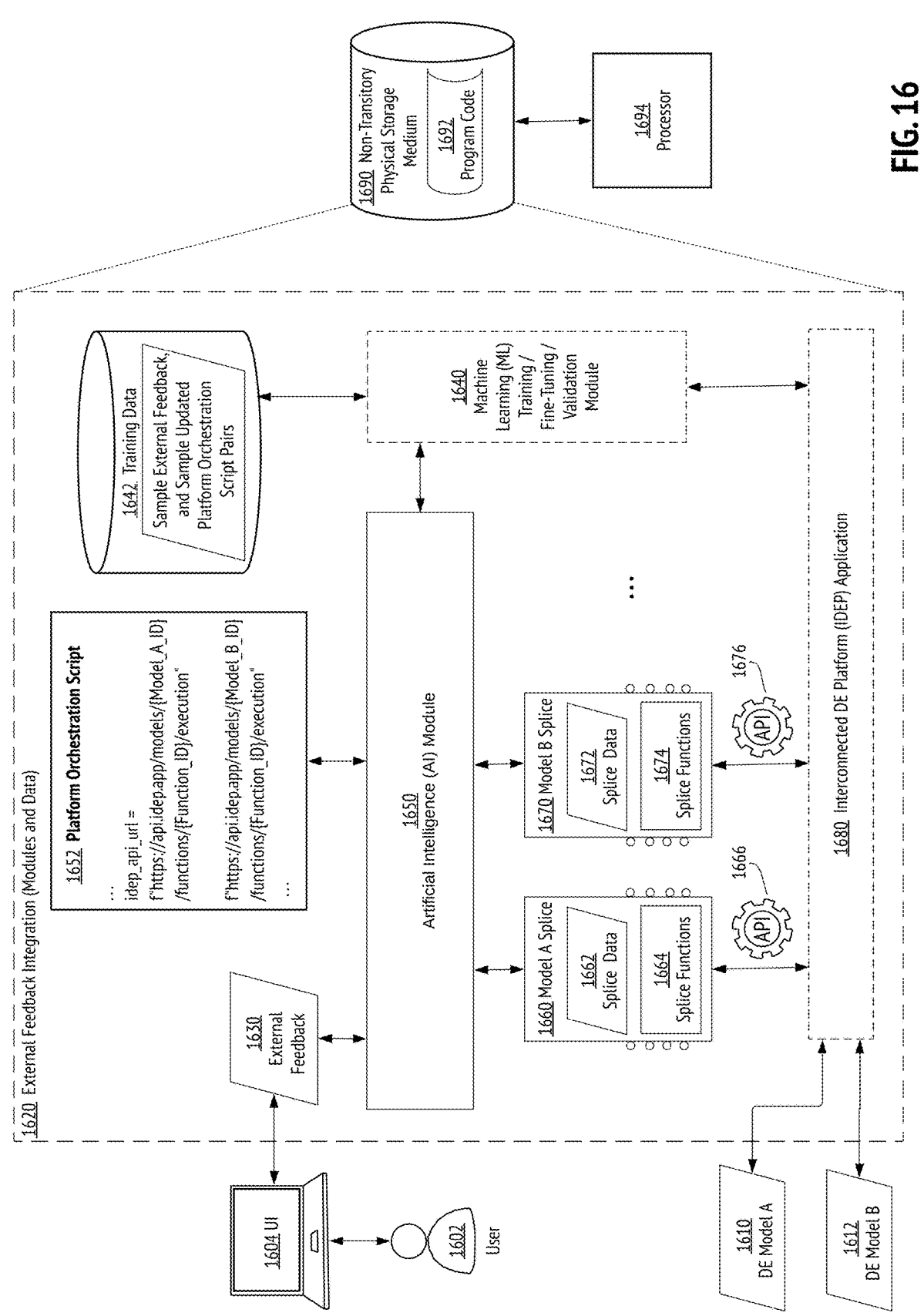

FIG. 16 is an exemplary system diagram showing a process for updating a new digital twin based on external feedback within an IDEP, in accordance with some embodiments of the present invention.

Exemplary Processing of External Feedback Through the IDEP

Figure 17:
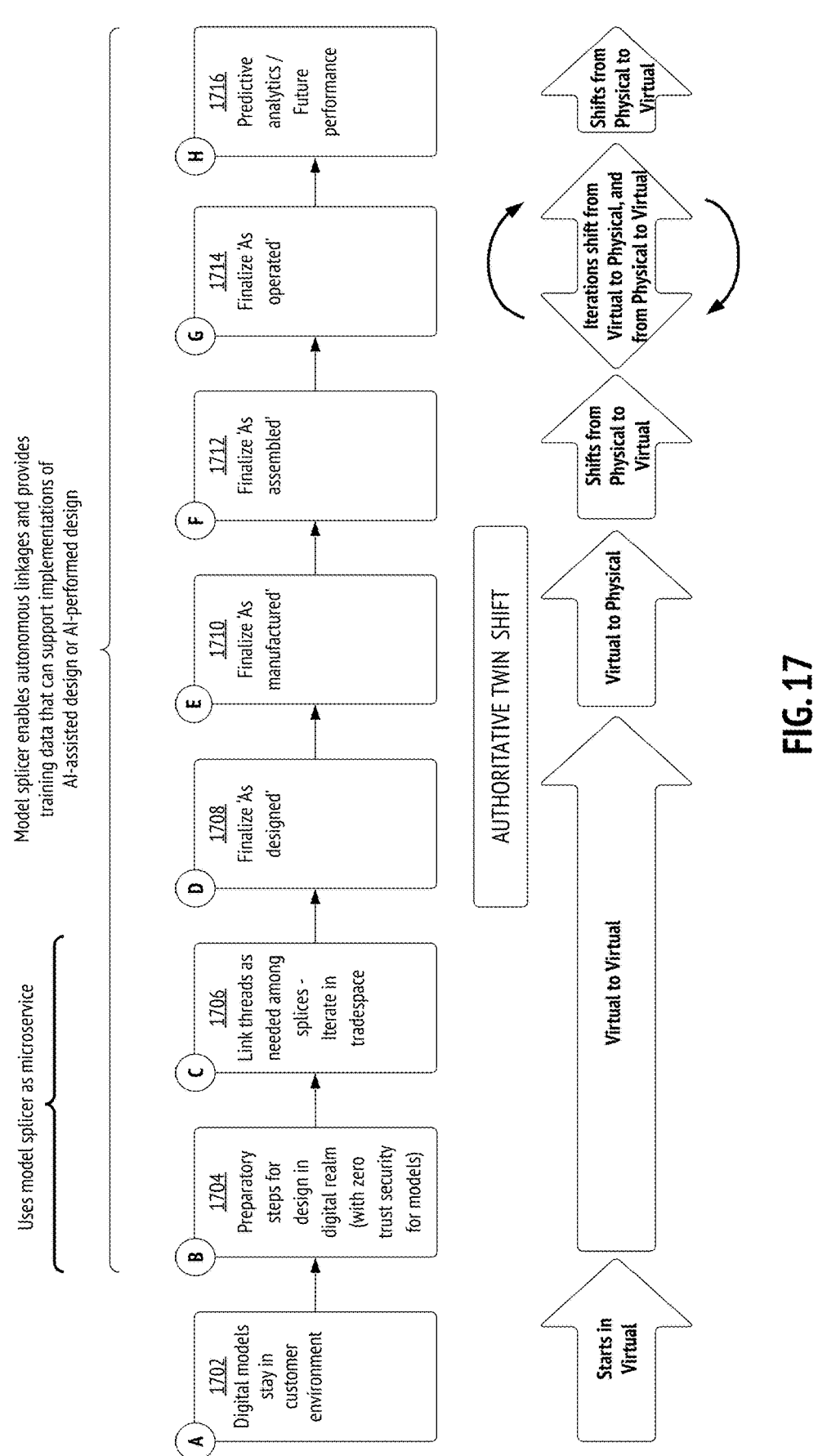

FIG. 17 shows an illustrative process flow where the authoritative twin is shifted throughout the design process, in accordance with one embodiment of the present invention.

FIG. 18 shows illustrative twin management steps carried out over the IDEP for an 'as-operated' small propeller airplane, in accordance with embodiments of the present invention.

Figure 19:
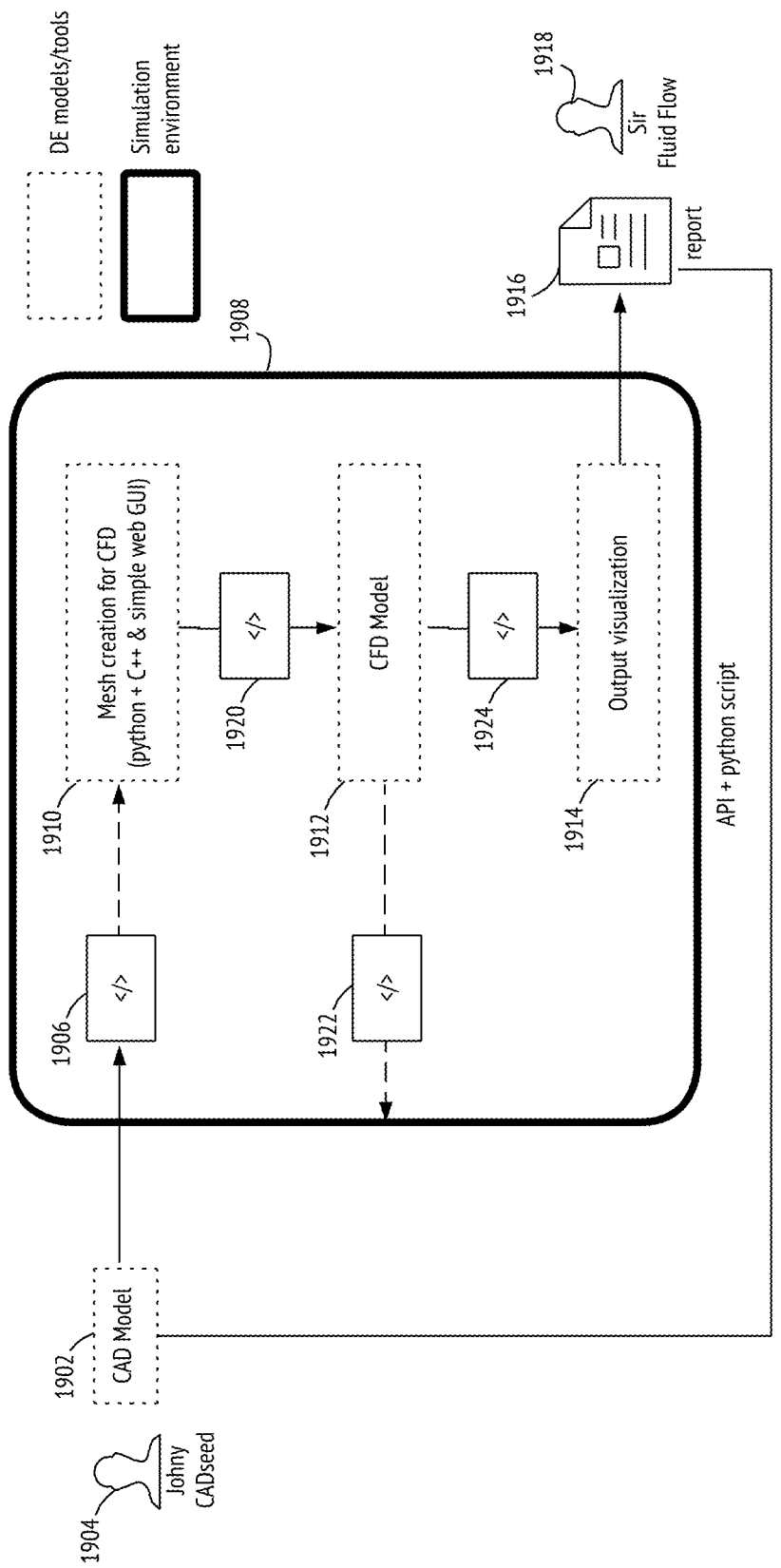

FIG. 19 shows an illustrative example of evaluating CAD models within a simulation environment.

Figure 20:
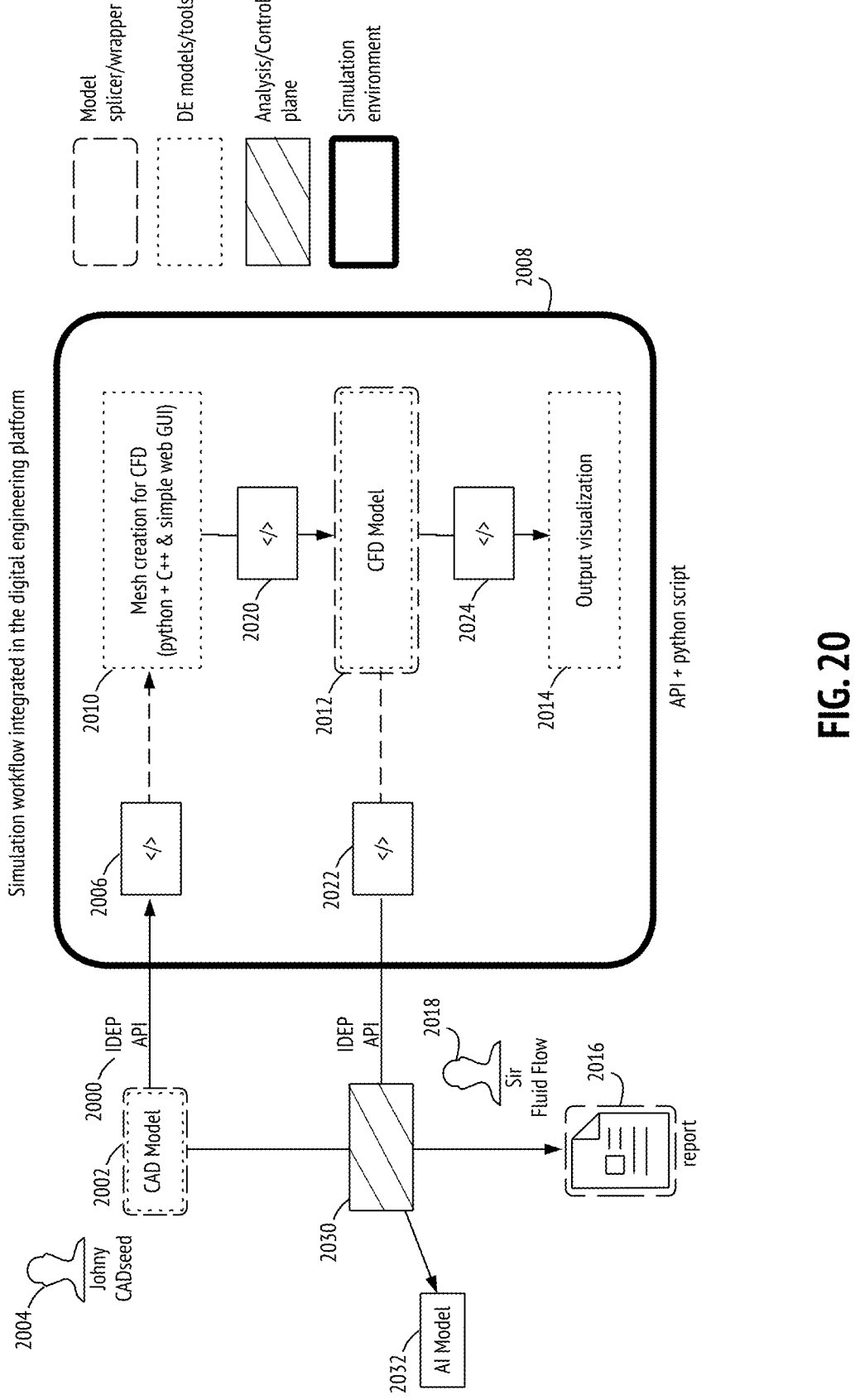

FIG. 20 shows the example of evaluating CAD models within a simulation environment as shown in FIG. 19, enhanced using an IDEP in accordance with the examples disclosed herein.

Figure 21:
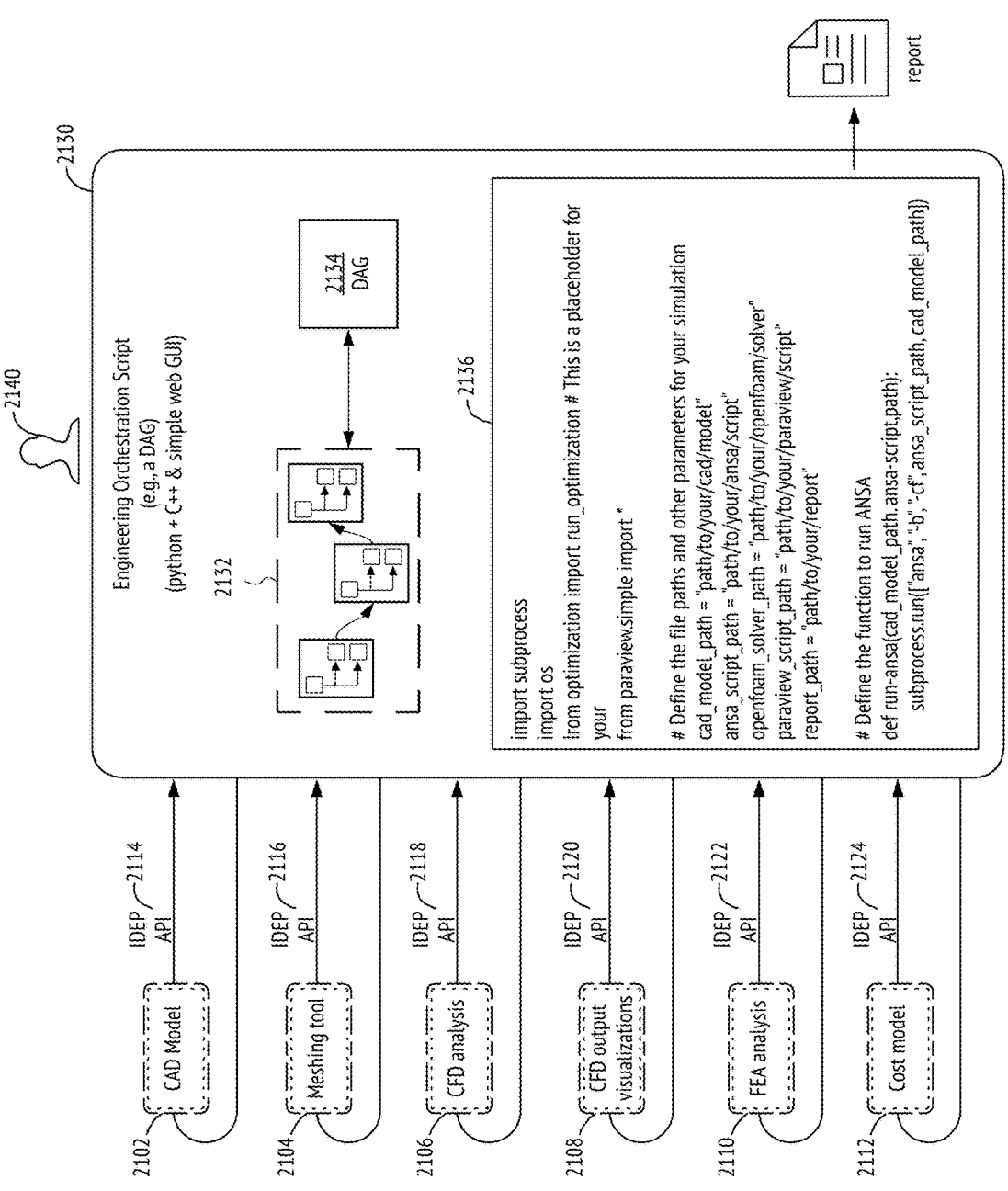

FIG. 21 shows the example of evaluating CAD models within a simulation environment as shown in FIG. 19, further enhanced through orchestrated digital threads over an IDEP, in accordance with the examples disclosed herein.

Figure 22:
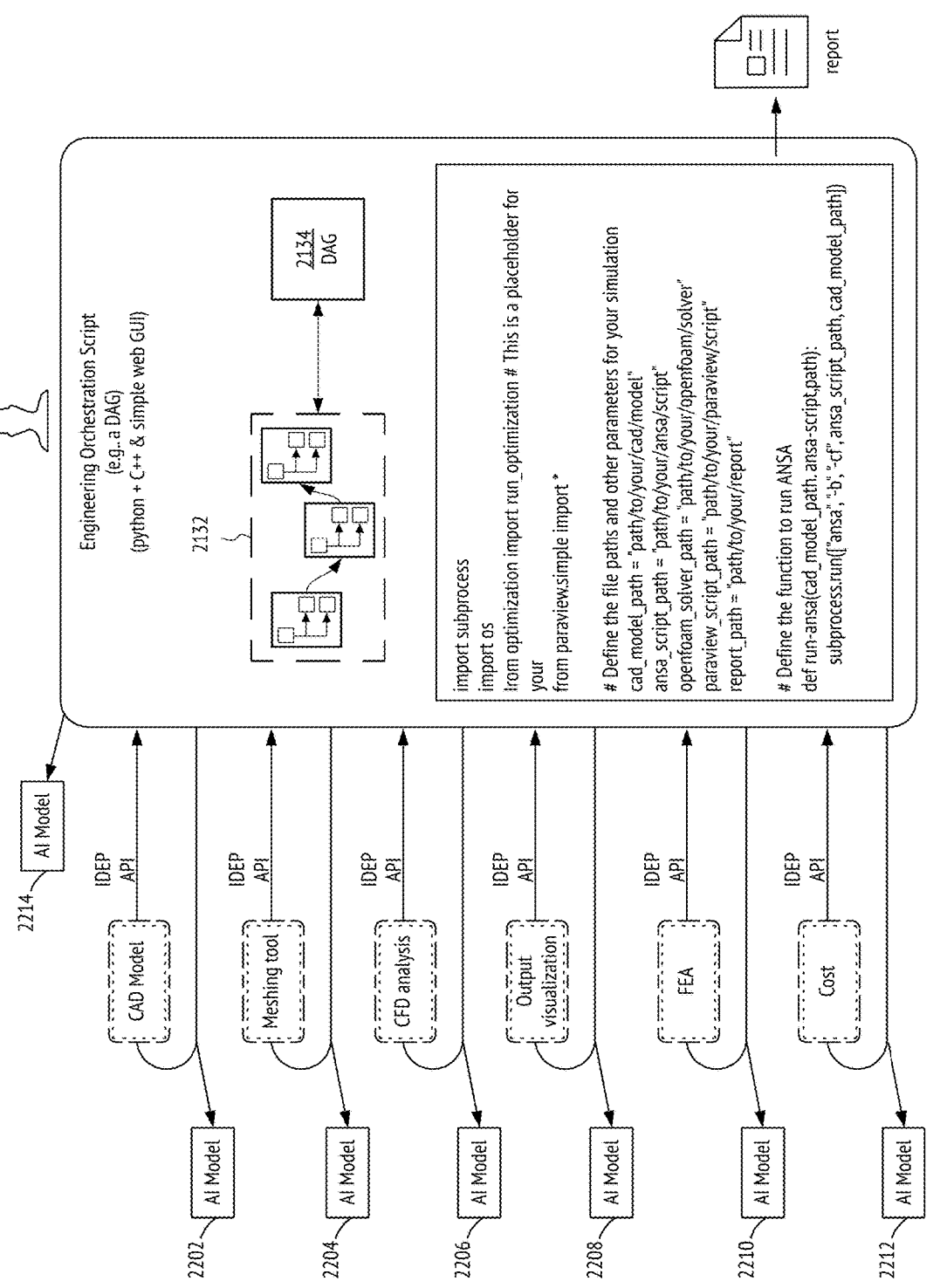

FIG. 22 shows the example of evaluating CAD models within a simulation environment as shown in FIG. 19, further enhanced through AI-enabled processes over an IDEP, in accordance with the examples disclosed herein.

Figure 23:
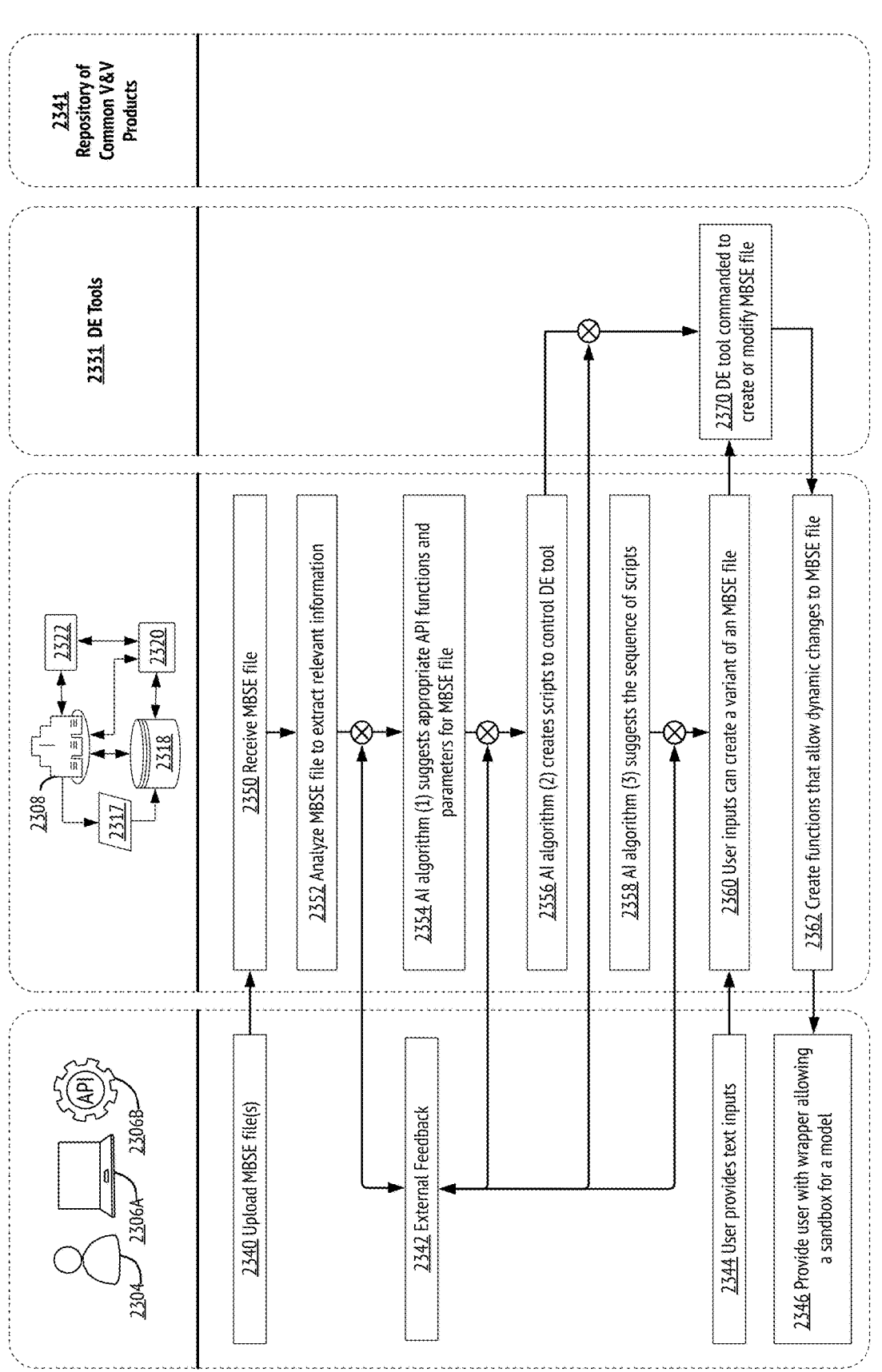

FIG. 23 shows an illustrative process for AI-assisted scalable creation of model splicers using external feedback, in accordance with the examples disclosed herein.

Figure 24:
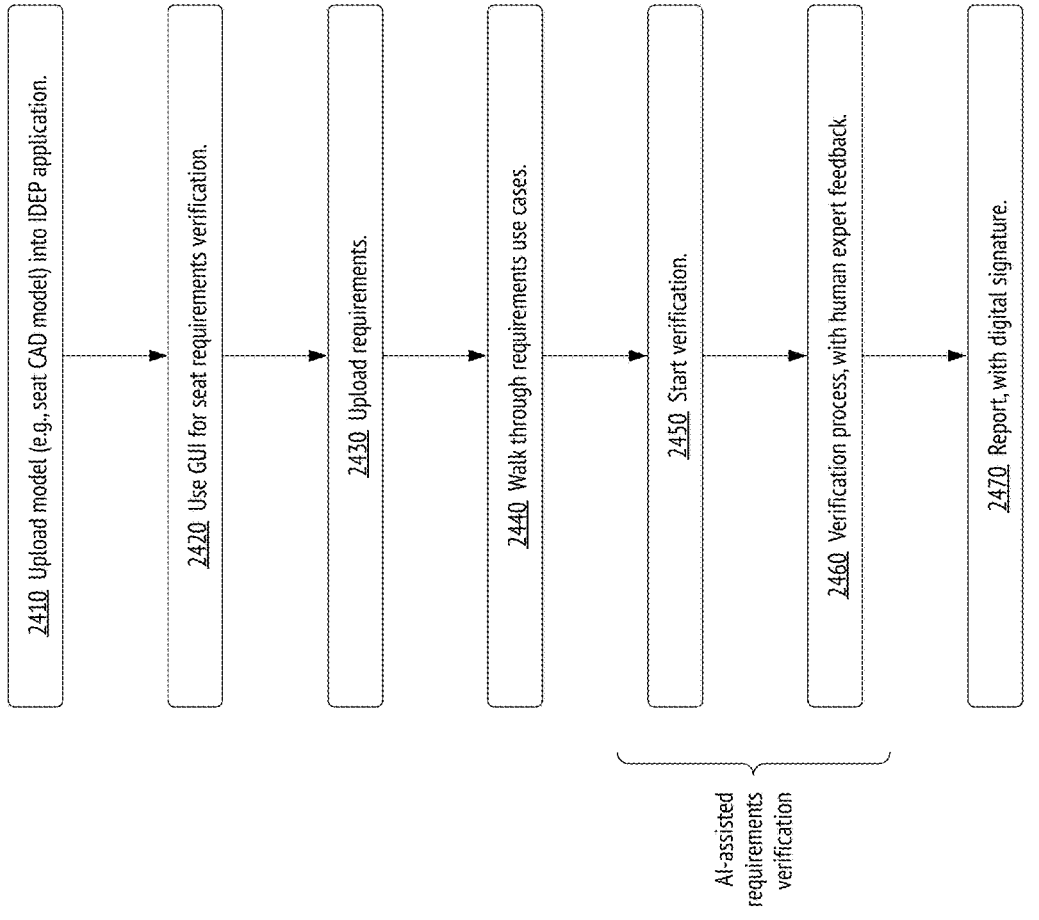

FIG. 24 shows a flow diagram for an exemplary AI-assisted requirements verification process using external feedback, according to embodiments of the present invention.

Figure 25:
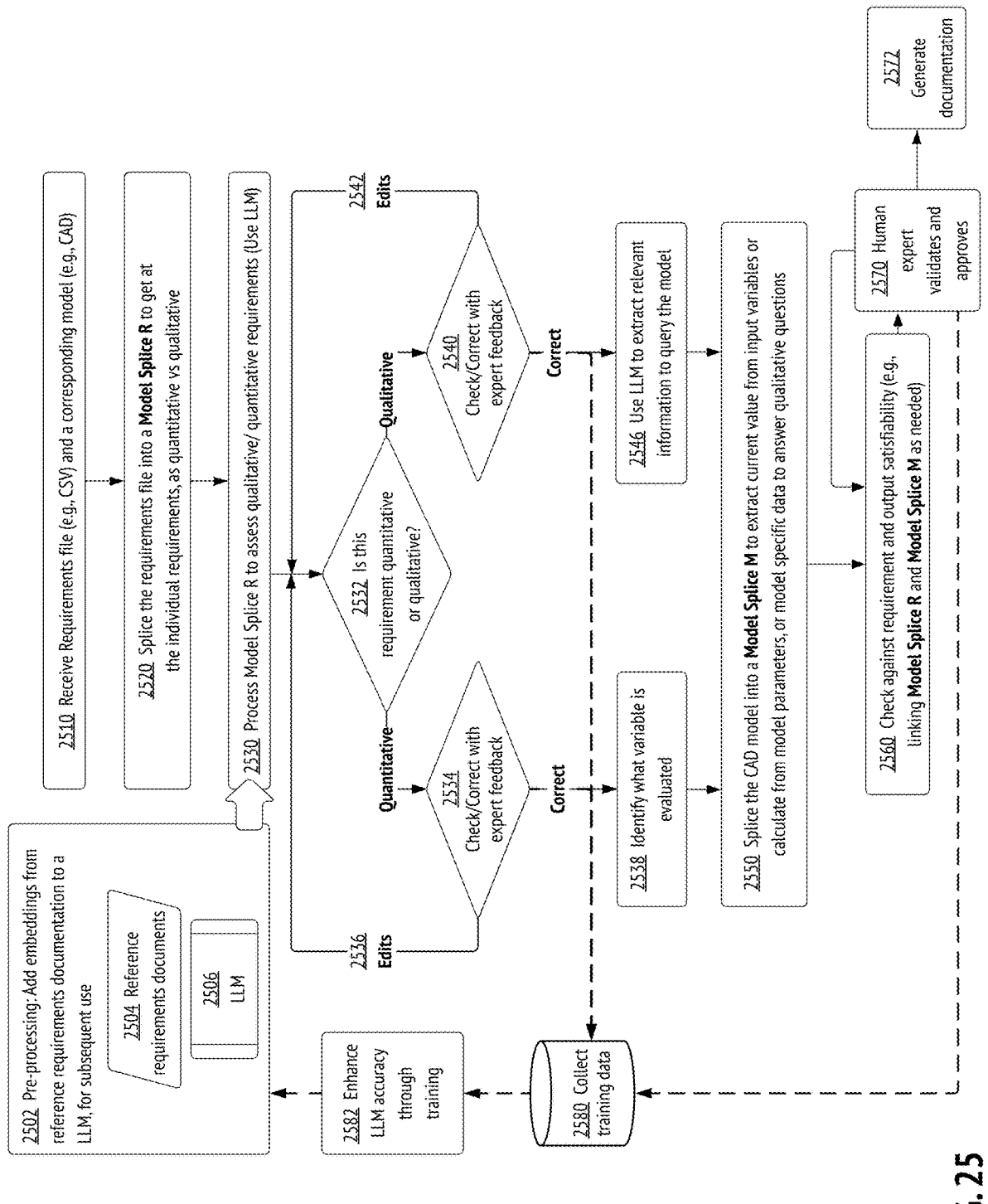

FIG. 25 shows a flow diagram of another exemplary AI-assisted requirements verification process using external feedback, according to embodiments of the present invention.

Machine Learning Implementation Architecture for IDEP Operations

Figure 26:
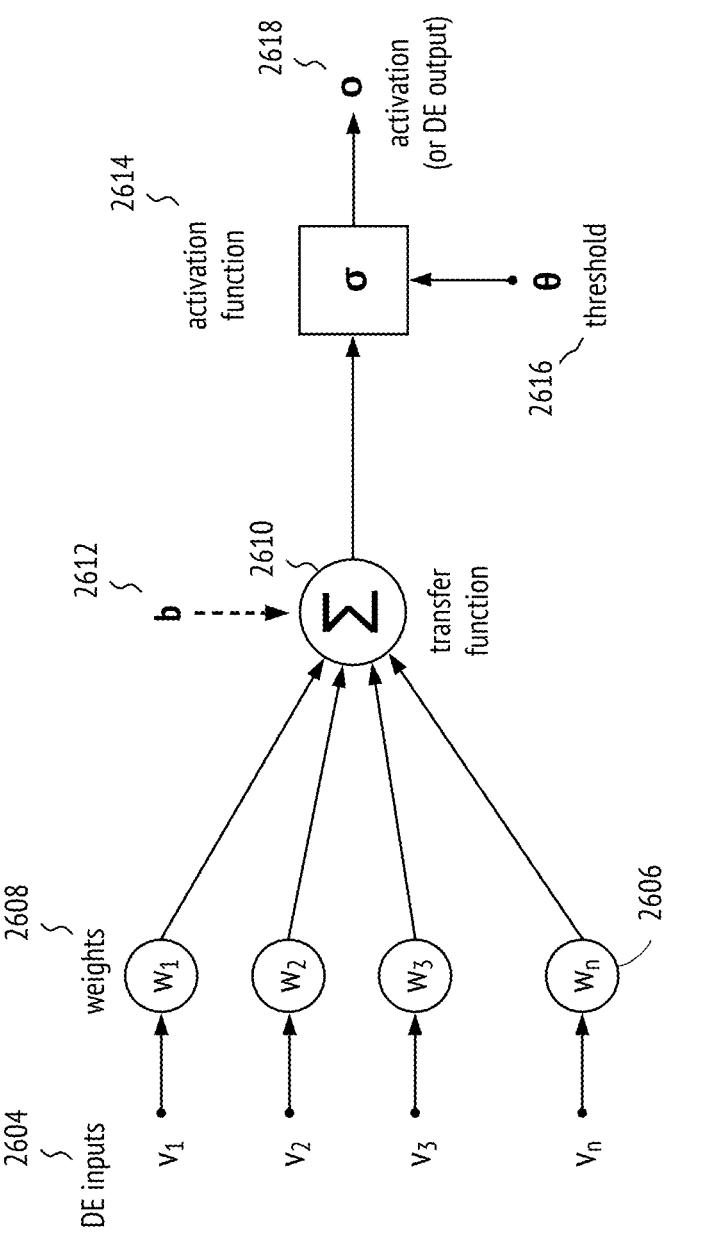

FIG. 26 describes neural network operation fundamentals, in accordance with some embodiments of the present invention.

Figure 27:
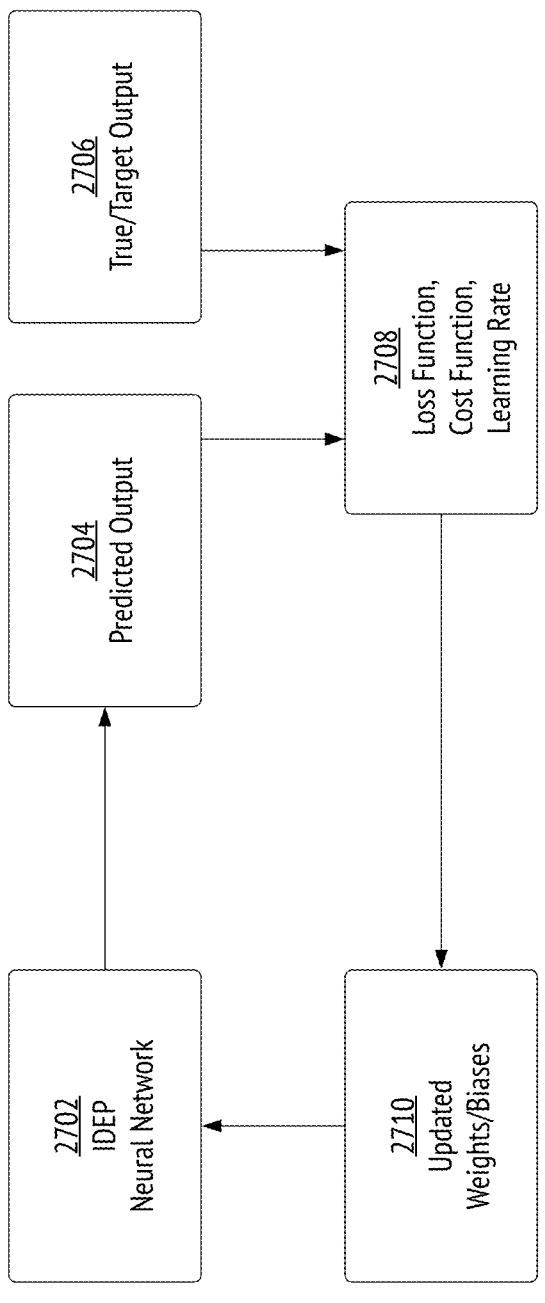

FIG. 27 shows an overview of an IDEP neural network training process, in accordance with some embodiments of the present invention.

Figure 28:
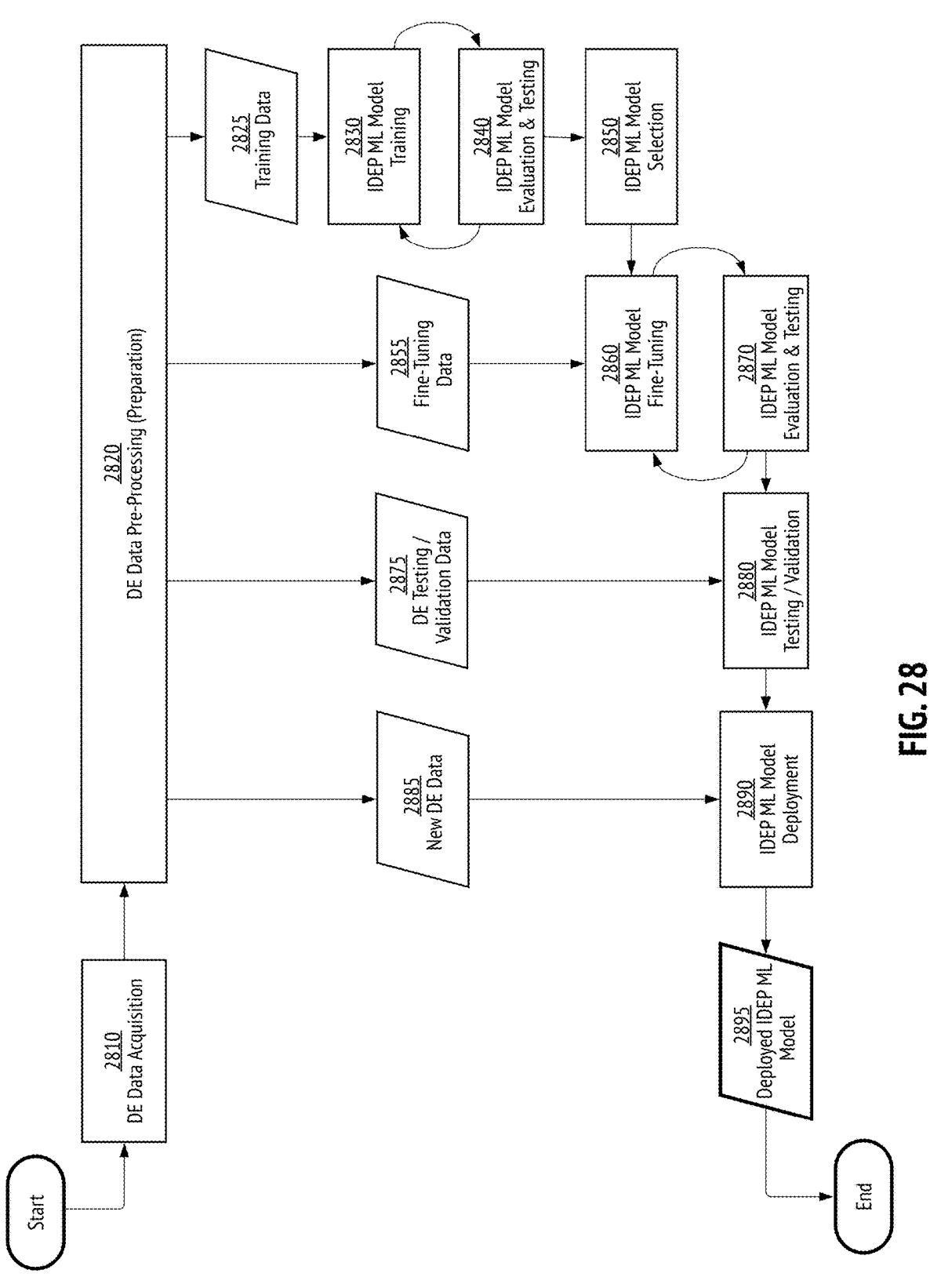

FIG. 28 is an illustrative flow diagram showing the different phases and datasets involved in training an IDEP machine learning model, in accordance with some embodiments of the present invention.

Hardware and Software Architecture for IDEP Operations

Figure 29:
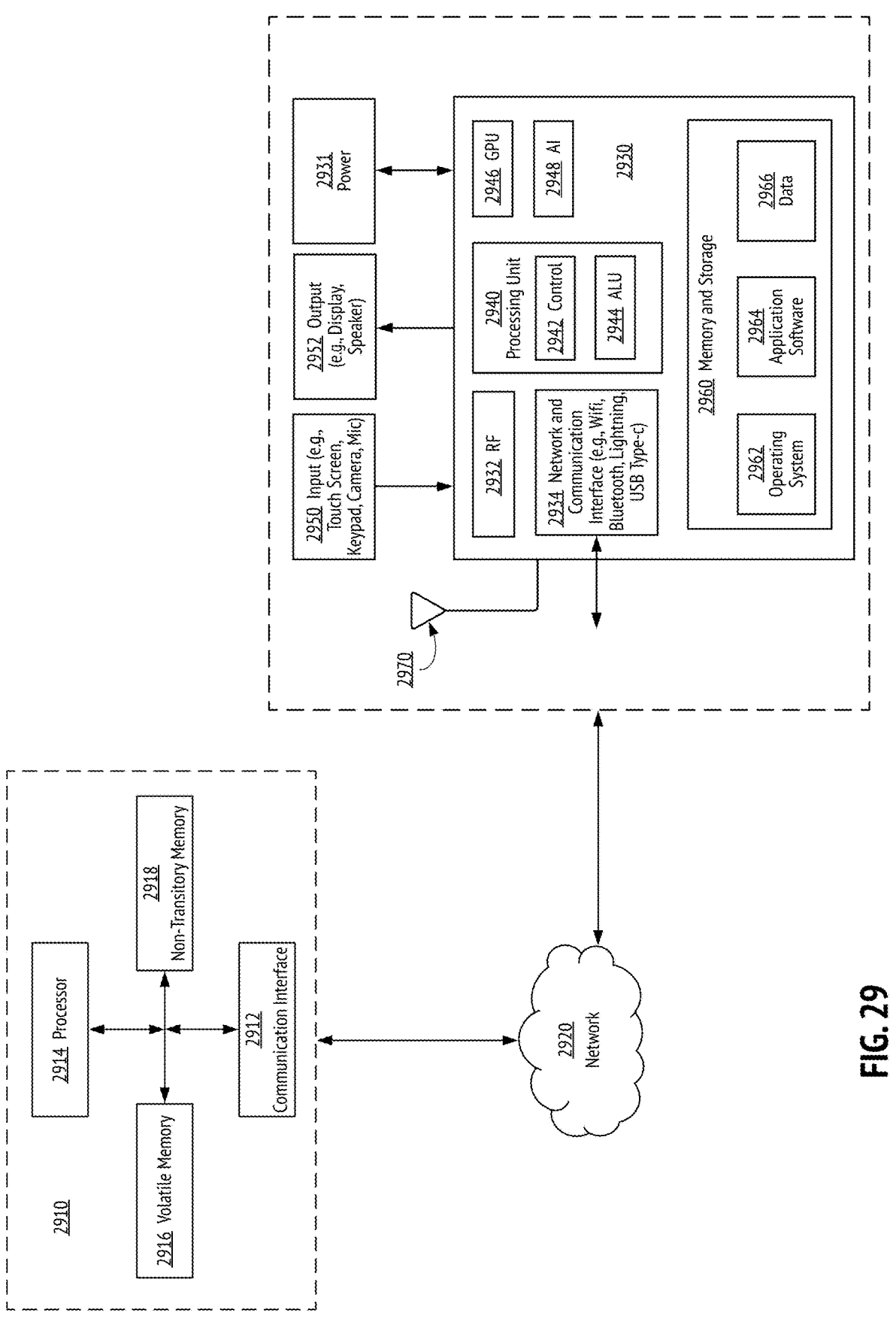

FIG. 29 provides illustrative schematics of a server (management computing entity) and a client (user computing entity) used for documentation within an IDEP, in accordance with some embodiments of the present invention.

DETAILED DESCRIPTION OF THE INVENTION

In the following description, for purposes of explanation, numerous specific details are set forth in order to provide a thorough understanding of the invention. It will be apparent, however, to one skilled in the art that the invention can be practiced without these specific details. In other instances, structures, devices, activities, methods, and processes are shown using schematics, use cases, and/or diagrams in order to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

An integrated digital model platform that enables the streamlined creation and management of digital twins and physical twins by leveraging external feedback and artificial intelligence (AI) is provided. Methods and systems for a model collaboration platform that facilitate the integration of external feedback, whether from physical, virtual, or human sources, into the streamlined design, validation, verification, certification, assembly, operations, and maintenance processes of complex systems, that could then output updated results to those external sources, including physical twins, other digital twins or models and simulations, and/or human users, are provided. External feedback includes feedback data from physical prototypes and their environment, virtual prototypes, simulations, and subject-matter experts. Embodiments are directed to integrating external feedback into the assembly and system-level assessment of digital twins, physical twins, digital threads, and the iterative design of constituting digital engineering models, including constructing, maintaining, and improving digital engineering models for the design, validation, verification, certification, operations, and maintenance of complex systems.

Embodiments of the present invention enable disparate models to be connected that enable industrial metaverses to design, manufacture, and operate physical systems before they physically exist. Embodiments also enable complex learning curves to be scaled digitally, broadly accelerating physical innovation, while lowering its cost and environmental impact. Additionally, embodiments enable AI to receive an abundant source of accurate real-time physical data to allow AI to comprehend physical reality with as much ease as traditional AI algorithms, such as for chess and go.

With reference to the figures, embodiments of the present invention are now described in detail. First, general DE system and documentation-specific terminologies are introduced. Next, the DE system (IDEP) is explained in detail. Finally, the digital documentation system, which may be considered a subsystem of the IDEP, is described in detail.

Terminology

Some illustrative terminologies used with the IDEP are provided below to assist in understanding the present invention, but these are not to be read as restricting the scope of the present invention. The terms may be used in the form of nouns, verbs, or adjectives, within the scope of the definition.

Digital engineering (DE): According to the Defense Acquisition University (DAU) and the Department of Defense (DOD) Digital Engineering Strategy published in 2018, digital engineering is "an integrated digital approach to systems engineering, using authoritative sources of systems' data and models as a continuum across disciplines to support lifecycle activities from concept through disposal." Digital engineering incorporates digital technological innovations into an integrated, model-based approach that empowers a paradigm shift from the traditional design-build-test methodology of systems engineering to a new model-analyze-build methodology, thus enabling systems design, prototyping, and testing all in a virtual environment.

DE data: Digital engineering (DE) data comprises project management, program management, product management, design review, and/or engineering data.

DE data field: A data field for DE data, for example, in a DE document template.

Phases: The stages within a DE product lifecycle, including but not limited to, stakeholder analysis, concept studies, requirements definition, preliminary design and technology review, system modeling, final design, implementation, system assembly and integration, prototyping, verification and validation on system, subsystem, and component levels, and operations and maintenance.

DE model: A computer-generated model that represents characteristics or behaviors of a complex product, system, or process. A DE model can be created or modified using a DE tool, and a DE model may be represented by one or more DE model files. A DE model file is the computer model file created or modified using the DE tool. In the present disclosure, the terms "digital model", "DE model" and "DE model file" may be used interchangeably, as the context requires. A DE model within the IDEP as disclosed herein refers to any digital file uploaded onto the platform, including documents that are appropriately interpreted, as defined below. For example, a computer-aided design (CAD) file, a Systems Modeling Language (SysML) file, a Systems Requirements Document (SDR) text file, and a Neural Network Model JSON file may each be considered a DE model, in various embodiments of the present invention. A DE model may be machine-readable only, may be human-readable as well but written in programming codes, or may be human-readable and written in natural language-based texts. For example, a word-processing document comprising a technical specification of a product, or a spreadsheet file comprising technical data about a product, may also be considered a DE model. A DE model is a type of digital model, defined below. In general, any reference to a DE model in the specification and drawings may be considered equivalent to a reference to a digital model, and vice versa.

Interconnected Digital Engineering Platform (IDEP), also referred to as a "Digital Engineering and Certification Ecosystem": According to the DAU, a "DE ecosystem" is the "interconnected infrastructure, environment, and methodology (process, methods, and tools) used to store, access, analyze, and visualize evolving systems' data and models to address the needs of the stakeholders." Embodiments of the IDEP as disclosed herein comprise software platforms running on hardware to realize the aforementioned capabilities under zero-trust principles. Specifically, an embodiment of the IDEP is a software platform that interconnects a plurality of spliced DE model files through one or more software-defined digital threads (see FIGS. 1-4). A DE and certification ecosystem performs verification and validation tasks, defined next. An IDEP is a type of Integrated Digital Model Platform (IDMP), defined below. In general, any reference to an IDEP in the specification and drawings can be considered equivalent to a reference to an IDMP, and vice versa.

Verification: According to the DAU, verification "confirms that a system element meets design-to or build-to specifications. Through the system's life cycle, design solutions at all levels of the physical architecture are verified through a cost-effective combination of analysis, examination, demonstration, and testing." Verification refers to evaluating whether a product, service, or system meets specified requirements and is fit for its intended purpose, checking externally against customer or stakeholder needs. For example, in the aerospace industry, a verification process may include testing an aircraft component to ensure it can withstand the forces and conditions it will encounter during flight.

Validation: According to the DAU, validation is "1) the review and approval of capability requirement documents by a designated validation authority. 2) The process by which the contractor (or as otherwise directed by the DoD component procuring activity) tests a publication/technical manual for technical accuracy and adequacy. 3) The process of evaluating a system or software component during, or at the end of, the development process to determine whether it satisfies specified requirements." Thus, validation refers to evaluating whether the overall performance of a product, service, or system is suitable for its intended use, including its compliance with regulatory requirements, and its ability to meet the needs of its intended users, checking internally against specifications and regulations. For example, for an industrial product manufacturing, a validation process may include consumer surveys that inform product design, modeling and simulations for validating the design, prototype testing for failure limits and feedback surveys from buyers.

Common Verification & Validation (V&V) products: Regulatory and certification standards, compliances, calculations, and tests (e.g., for the development, testing, and certification of products and/or solutions) are referred to herein as "common V&V products."

DE tool: A tool or DE tool is a DE application software (e.g., a CAD software), computer program, and/or script that creates or manipulates a DE model during at least one stage or phase of a product lifecycle. A DE tool may comprise multiple functions or methods.

Application Programming Interface (API): A software interface that provides programmatic access to services by a software program, thus allowing application software to exchange data and communicate with each other using standardized requests and responses. It allows different programs to work together without revealing the internal details of how each works. A DE tool is typically provided with an API library for code-interface access.

Script: A computer-executable sequence of instructions that is interpreted and run within or carried out by another program, without compilation into a binary file to be run by itself through a computer processor without the support of other programs.

API scripts: Scripts that implement particular functions available via the IDEP as disclosed herein. An API script may be an API function script encapsulated in a model splice, or an "orchestration script" or "platform script" that orchestrates a workflow through a digital thread built upon interconnected model splices.

Platform API or ISTARI API: A library of API scripts available on the IDEP as disclosed herein.

API function scripts, "splice functions," "splice methods," "ISTARI functions," or "function nodes": A type of API scripts. When executed, an API function script inputs into or outputs from a DE model or DE model splice. An "input" function, input method, or "input node" allows updates or modifications to an input DE model. An "output" function, output method, or "output node" allows data extraction or derivation from an input DE model via its model splice. An API function script may invoke native API function calls of native DE tools, where the terms "native" and "primal" may refer to existing DE model files, functions, and API libraries associated with specific third-party DE tools, including both proprietary and open-source ones.

Endpoints: an endpoint in the context of software and networking is a specific digital location or destination where different software systems communicate with each other. It enables external systems to access the features or data of an application, operating system, or other services. An API endpoint is the point of interaction where APIs receive requests and return data in response. A software development kit (SDK) endpoint or SDK-defined endpoint similarly provides a service handle for use with an SDK. References to API endpoints in the present disclosure are equally applicable to SDK endpoints.

Artifact: According to the DAU, a digital artifact is "an artifact produced within, or generated from, a DE ecosystem" to "provide data for alternative views to visualize, communicate, and deliver data, information, and knowledge to stakeholders." In the present disclosure, a "digital artifact" or "artifact" is an execution result from an output API function script within a model splice. Multiple artifacts may be generated from a single DE model or DE model splice.

Model splice: Within the present disclosure, a "model splice", "model wrapper", or "model graft" of a given DE model file comprises locators to or copies of (1) DE model data or digital artifacts extracted or derived from the DE model file, including model metadata, and (2) splice functions (e.g., API function scripts) that can be applied to the DE model data. The splice functions provide unified and standardized input and output API endpoints for accessing and manipulating the DE model data. The DE model data are model-type-specific, and a model splice is associated with model-type-specific input and output schemas. One or more different model splices may be generated from the same input DE model file(s), based on the particular user application under consideration, and depending on data access restrictions. In some contexts, the shorter terms "splice", "wrapper", and/or "graft" are used to refer to spliced, wrapped, and/or grafted DE models.

Model representation: Within the present disclosure, "model representation" of a given DE model includes any embodiment of the engineering model in the form of DE model file(s), model splices, or collections of digital artifacts derived from the DE model. In some embodiments, a DE model representation comprises model-type-specific locators to DE model data and metadata, potentially including standardized input and output API endpoints for accessing and manipulating the DE model data. Discussions related to the usage of model splices in the present disclosure are applicable to any other forms of model representation as well.

Model splicing or DE model splicing: A process for generating a model splice from a DE model file. DE model splicing encompasses human-readable document model splicing, where the DE model being spliced is a human-readable text-based document.

Model splicer: Program code or script (uncompiled) that performs model splicing of DE models. A DE model splicer for a given DE model type, when applied to a specific DE model file of the DE model type, retrieves, extracts, or derives DE model data associated with the DE model file, generates and/or encapsulates splice functions and instantiates API endpoints according to input/output schemas.

Model splice linking: Generally, model splice linking refers to jointly accessing two or more DE model splices via API endpoints or splice functions. For example, data may be retrieved from one splice to update another splice (e.g., an input splice function of a first model splice calls upon an output splice function of a second model splice); data may be retrieved from both splices to generate a new output (e.g., output splice functions from both model splices are called upon); data from a third splice may be used to update both a first and a second splice (e.g., input splice functions from both model splices are called upon). In the present disclosure, "model linking" and "model splice linking" may be used interchangeably, as linked model splices map to correspondingly linked DE models.

Digital thread, Software-defined digital thread, Software-code-defined digital thread, or Software digital thread: According to the DAU, a digital thread is "an extensive, configurable and component enterprise-level analytical framework that seamlessly expedites the controlled interplay of authoritative technical data, software, information, and knowledge in the enterprise data-information-knowledge systems, based on the digital system model template, to inform decision makers throughout a system's lifecycle by providing the capability to access, integrate, and transform disparate data into actionable information." Within the IDEP as disclosed herein, a digital thread is a platform script that calls upon the platform API to facilitate, manage, or orchestrate a workflow through linked model splices to provide the aforementioned capabilities. That is, a digital thread within the IDEP is a computer-executable script that connects data from one or more DE models, data sources, or physical artifacts to accomplish a specific mission or business objective, and may be termed a "software-defined digital thread" or "software digital thread" that implements a communication framework or data-driven architecture that connects traditionally siloed DE models to enable seamless information flow among the DE models via model splices. In various embodiments, a digital thread associated with a digital twin is configured to execute a scripted workflow associated with the DTw.

Tool linking: Similar to model splice linking, tool linking generally refers to jointly accessing two or more DE tools via model splices, where model splice functions that encapsulate disparate DE tool functions are called upon jointly to perform a DE task.

Zero-trust security: An information security principle based on the assumption of no implicit trust between any elements, agents, or users. Zero trust may be carried out by implementing systematic mutual authentication and least privileged access, typically through strict access control, algorithmic impartiality, and data isolation. Within the IDEP as disclosed herein, least privileged access through strict access control and data isolation may be implemented via model splicing and the IDEP system architecture.

Hyperscale capabilities: The ability of a system architecture to scale adequately when faced with massive demand.

IDEP enclave or DE platform enclave: A central command hub responsible for the management and functioning of DE platform operations. An enclave is an independent set of cloud resources that are partitioned to be accessed by a single customer (i.e., single-tenant) or market (i.e., multi-tenant) that does not take dependencies on resources in other enclaves.

IDEP exclave or DE platform exclave: A secondary hub situated within a customer environment to assist with customer DE tasks and operations. An exclave is a set of cloud resources outside enclaves managed by the IDEP, to perform work for individual customers. Examples of exclaves include virtual machines (VMs) and/or servers that the IDEP maintains to run DE tools for customers who may need such services.

Digital twin: According to the DAU, a digital twin is "a virtual replica of a physical entity that is synchronized across time. Digital twins exist to replicate configuration, performance, or history of a system. Two primary sub-categories of digital twin are digital instance and digital prototype." A digital instance is "a virtual replica of the physical configuration of an existing entity: a digital instance typically exists to replicate each individual configuration of a product as-built or as-maintained." A digital prototype is "an integrated multi-physical, multiscale, probabilistic model of a system design; a digital prototype may use sensor information and input data to simulate the performance of its corresponding physical twin; a digital prototype may exist prior to realization of its physical counterpart." Thus, a digital twin is a real-time virtual replica of a physical object or system, with bi-directional information flow between the virtual and physical domains. In some embodiments, a digital twin is a digital replica configured to run in a virtual environment and instantiated through a scripted digital thread, where the digital thread accesses data (e.g., digital artifacts) from a set of digital models through splicing. A digital twin may be instantiated, run, or executed, through a digital thread. Updating a digital twin may include the actions of modifying, deleting, and/or adding data to its twin configuration, to an associated digital thread, or to an associated digital model associated with the updated digital twin. In one embodiment, digital twins may be ephemeral and may have in-built time and space restrictions (see "twin configuration" definition below). In various embodiments, a physical twin is a physical object instantiated in a physical environment based on a set of model files through an MBSE manufacturing and/or prototyping process. In various embodiments, digital twins can be created for both physical products and physical processes. They are not limited to tangible items like machinery or vehicles; they can also simulate complex physical processes, such as manufacturing workflows or supply chain logistics, to improve efficiency and predict outcomes. This flexibility allows digital twins to be applied across various industries and scenarios.

Authoritative twin: A reference design configuration at a given stage of a product life cycle. At the design stage, an authoritative twin is the twin configuration that represents the best design target. At the operational stage, an authoritative twin is the twin configuration that best responds to the actual conditions on the ground or "ground-truths".

Admins or Administrators: Project managers or other authorized users. Admins may create templates in the documentation system and have high-level permissions to manage settings in the IDEP.

Requesters: Users who use the platform for the implementation of the modeling and simulations towards certification and other purposes, and who may generate documentation in the digital documentation system, but do not have admin privileges to alter the required templates, document formats, or other system settings.

Reviewers/Approvers: Users who review and/or approve templates, documents, or other system data.

Contributors: Users who provide comments or otherwise contribute to the IDEP.

Digital Model: A computer-generated model that represents characteristics or behaviors of a complex product, system, or process. Digital models include DE models but are not limited to the field of digital engineering. For example, digital models include medical model files used to build digital twins of patients (e.g., digital patients), such as clinical documentation, laboratory results, physiological test results, psychological test results, patient communications and reports, patient medical data, health records, remote monitoring data, and the like. Digital models also include the financial models used to build digital twins of financial assets, such as enterprise data, business financial data, process data (e.g., manufacturing, logistics, sales, supply chain), research results, etc. Other examples of digital models are also within the scope of the present invention, for example, scientific models, geophysical models, climate models, biological models, biochemical models, chemical models, drug models, petrochemical models, oceanographic models, business process models, management science models, economic models, econometric models, sociological models, population dynamics models, socioeconomic models, planetary science models, mining models, mineral models, metallurgical models, supply chain logistics models, manufacturing models, and so on. Digital models include one or more digital artifacts, where each digital artifact is accessible with a security network. A model file can be created or modified using a software tool. A model file within the IDMP as disclosed herein refers to any digital file uploaded onto the platform. All the terms and concepts defined above and included herein, including model splicing, model splices, and software-defined digital threads, apply in the context of the digital model and within the context of the IDMP.

Interconnected Digital Model Platform (IDMP): Embodiments of the IDMP as disclosed herein include interconnected infrastructure, environment, and methodology (process, methods, and tools) used to store, access, analyze, visualize, and modify data and digital models associated with a product or system. In some embodiments, IDMPs include software platforms running on hardware to realize the aforementioned capabilities under zero-trust principles. Specifically, an embodiment of the IDMP is a software platform that interconnects a plurality of spliced model files through one or more software-defined digital threads.

Security Network: A set of networked resources having identical access control restrictions (e.g., a security level), where each networked resource provides access to one or more digital model files. Information security networks are security networks that are configured to maintain the confidentiality, integrity, and availability of digital information (e.g., digital model data) through cybersecurity measures such as encryption, firewalls, intrusion detection systems, and access controls.

External Feedback: In various embodiments, external feedback comprises feedback data from at least one source external to a given digital twin, including digital twin performance data as received, analyzed or processed by the IDMP. External feedback may also include physical twin performance data, data from a virtual sensor, data from a physical sensor, user input (e.g., a user prompt, or a user response over a GUI), data from a simulation, a product certification file, or a product requirements file. In some embodiments, external feedback may also include feedback from control algorithms or processes in the IDMP that track digital twin performance (e.g., tracking error levels and/or tolerance between digital and corresponding physical twin data). External feedback data can also include feedback data that is external to the IDMP.

Twin Configuration: A twin configuration includes data specifying the configuration of a digital or a physical twin. Twin configurations may include a twin version identifier identifying the digital twin, one or more digital thread identifiers identifying the digital threads responsible for instantiating and running a twin, one or more model representation identifiers (e.g., URIs) identifying the model representations that are used by the twin, and an authoritative twin indicator (e.g., a boolean or binary variable) indicating whether the twin is an authoritative twin. The various twin configurations associated with the various physical and digital twins of a given product may be stored in a twin configuration set of the IDMP. In some embodiments, the twin configuration set acts as a specification database for the various digital and physical twins for one or more products or systems. In some embodiments, the twin configuration of a digital twin may include time and space restrictions on the associated digital twin, such as a validity time frame, a validity cutoff time, a validity space, or a validity geographical area (e.g., geofencing, proximity to another twin configuration).

An Interconnected Digital Engineering Platform (IDEP) Architecture

FIG. 1 shows an exemplary interconnected digital engineering platform (IDEP) architecture, in accordance with some embodiments of the present invention. IDEP 100 streamlines the process of product development from conception to production, by using a virtual representation or digital twin (DTw) 122 of the product to optimize and refine features before building a physical prototype or physical twin (PTw) 132, and to iteratively update DTw 122 until DTw 122 and PTw 132 are in sync to meet the product's desired performance goals.

Specifically, a product (e.g., airplane, spacecraft, exploration rover, missile system, automobile, rail system, marine vehicle, remotely operated underwater vehicle, robot, drone, medical device, biomedical device, pharmaceutical compound, drug, power generation system, smart grid metering and management system, microprocessor, integrated circuit, building, bridge, tunnel, chemical plants, oil and gas pipeline, refinery, etc.) manufacturer may use IDEP platform 100 to develop a new product. The engineering team from the manufacturer may create or instantiate digital twin (DTw)

122 of the product in a virtual environment 120, encompassing detailed computer-aided design (CAD) models and finite element analysis (FEA) or computational fluid dynamics (CFD) simulations of component systems such as fuselage, wings, engines, propellers, tail assembly, and aerodynamics. DTw 122 represents the product's design and performance characteristics virtually, allowing the team to optimize and refine features before building a physical prototype 132 in a physical environment 130. In some embodiments, PTw 132 may be an existing entity, while DTw 122 is a digital instance that replicates individual configurations of PTw 132, as-built or as-maintained. In the present disclosure, for illustrative purposes only, DTw 122 and PTw 132 are discussed in the context of building a new product, but it would be understood by persons of ordinary skill in the art that the instantiation of DTw 122 and PTw 132 may take place in any order, based on the particular use case under consideration.

Digital models (e.g., CAD models, FEA models, CFD models) used for creating DTw 122 are shown within a model plane 180 in FIG. 1. Also shown in model plane 180 is a neural network (NN) model 184, which may provide machine-learning based predictive modeling and simulation for a DE process. A DE model such as 182 may be spliced into one or more model splices, such as 172 and 173 within a splice plane 170. Individual DTws such as 122 are instantiated from splice plane 170 via an application plane 160. A model splice such as 172 may be linked to another model splice such as 171 by a platform script or application 162 on application plane 160 into a digital thread. Multiple digital threads such as 162 and 163 may be further linked across different stages or phases of a product life cycle, from concept, design, testing, to production. Digital threads further enable seamless data exchange and collaboration between departments and stakeholders, ensuring optimized and validated designs.

As model splicing provides input and output splice functions that can access and modify DE model data, design updates and DE tasks associated with the digital threads may be represented by scripted, interconnected, and pipelined tasks arranged in Directed Acyclic Graphs (DAGs) such as 124. A DE task DAG example is discussed in further detail with reference to FIG. 10.

To enhance the design, external sensory data 140 may be collected, processed, and integrated into application plane 160. This process involves linking data from different sources, such as physical sensors 134 on prototype 132, physical environmental sensors 136, and other external data streams such as simulation data from model plane 180. API endpoints provide access to digital artifacts from various environments (e.g., physical twin (PTw) sensor 134 data) and integrate them into the spliced plane 170 for the DTw 122. Model splices on the splice plane 170 enable autonomous data linkages and digital thread generation, ensuring DTw 122 accurately represents the product's real-world performance and characteristics.

To validate DTw 122's accuracy, the engineering team may build or instantiate PTw 132 based on the same twin configuration (i.e., digital design). Physical prototype 132 may be equipped with numerous sensors 134, such as accelerometers and temperature sensors, to gather real-time performance data. This data may be compared with the DTw's simulations to confirm the product's performance and verify its design.

Processed sensory data 144 may be used to estimate parameters difficult to measure directly, such as aerodynamic forces or tire contact patch forces. Such processed sensory data provide additional data for DTw 122, further refining its accuracy and reliability. Processed sensory data 144 may be generated from physical environment sensors 136 with physical environment 130, and may be retrieved from other external databases 142, as discussed below.

During development, feedback from customers and market research may be collected to identify potential improvements or adjustments to the product's design. At an analysis & control plane (ACP) 150, subject matter experts (SMEs) may analyze processed sensory data 144 and external expert feedback 114, to make informed decisions on necessary design changes. Such an analysis 154 may be enhanced or entirely enabled by algorithms (i.e., static program code) or artificial intelligence (AI) modules. Linking of digital threads such as 162, physical sensors 134 and 136, processed sensory data 144, and expert feedback data 114 occurs at ACP 150, where sensor and performance data is compared, analyzed, leading to modifications of the underlying model files through digital threads.

In particular, sensory data 144 from physical environment 130 and performance data 126 from virtual environment 120 may be fed into a comparison engine 152. Comparison engine 152 may comprise tools that enable platform users to compare various design iterations with each other and with design requirements, identify performance lapses and trends, and run verification and validation (V&V) tools.

Model splicing is discussed in further detail with reference to FIGS. 7 to 9. Model splicing enables the scripting of any DE operation involving DE model files in model plane 180, where each DE model is associated with disparate and siloed DE tools. Codification of DE models and DE operations with a unified corpus of scripts enable IDEP 100 to become an aggregator where a large space of DE activities associated with a given product (e.g., airplane, spacecraft, exploration rover, missile system, automobile, rail system, marine vehicle, remotely operated underwater vehicle, robot, drone, medical device, biomedical device, pharmaceutical compound, drug, power generation system, smart grid metering and management system, microprocessor, integrated circuit, building, bridge, tunnel, chemical plants, oil and gas pipeline, refinery, etc.) may be threaded through program code. Thus, model splicing enables the linking and manipulation of all model files (e.g., 182, 184) associated with a given product within the same interconnected DE platform or DE ecosystem 100. As a consequence, the generation and training of AI modules for the purpose of manipulating DE models (e.g., 182), digital threads (e.g., 162), and digital twins (e.g., 122) become possible over the programmable and unified IDEP 100.

Virtual and Physical Feedback Loops

FIG. 1 uses letter labels "A" to "H" to denote different stages of a product's lifecycle. At each stage, IDEP 100 enables feedback loops whereby data emanating from a PTw or a DTw is analyzed at ACP 150, leading to the generation of a new twin configuration based on design modifications. The new twin configuration may be stored in a twin configuration set and applied through the application and splice planes, yielding modified model files that are registered on the digital thread.

A virtual feedback loop 104 starts with a decision 106 to instantiate new DTw 122. A DAG of hierarchical tasks 124 allows the automated instantiation of DTw 122 within virtual environment 120, based on a twin configuration applied at a process step 108 from a twin configuration set 156. DTw 122 and/or components thereof are then tested in virtual environment 120, leading to the generation of DTw performance data 126. Concurrently, DTw 122 and/or components thereof may be tested and simulated in model plane 180 using DE software tools, giving rise to test and simulation performance data 174. Performance data 126 and 174 may be combined, compared via engine 152, and analyzed at ACP 150, potentially leading to the generation and storage of a new twin configuration. The eventual decision to instantiate a DTw from the new twin configuration completes virtual feedback loop 104.

A physical feedback loop 102 starts with a decision 106 to instantiate a new PTw 132. PTw 132 may be instantiated in a physical environment 130 from the model files of model plane 180 that are associated with an applied twin configuration from the twin configuration set 156. PTw 132 and/or components thereof are then tested in physical environment 132, leading to the generation of sensory data from PTw sensors 134 and environmental sensors 136 located in physical environment 130. This sensory data may be combined with data from external databases to yield processed sensory data 144. In one exemplary embodiment, temperature readings from environmental sensors located within the physical environment are completed, adjusted (e.g., shifted), and/or calibrated using data from external temperature databases.

Data from PTw sensors 134 may be directly added to the model files in model plane 180 by the DE software tools used in the design process of PTw 132. Alternatively, PTw sensor data may be added to digital thread 162 associated with PTw 132 directly via application plane 160. In addition, processed sensory data 144 may be integrated into IDEP 100 directly via application plane 160. For example, processed sensory data 144 may be sent to ACP 150 for analysis, potentially leading to the generation and storage of a new twin configuration. The eventual decision to instantiate a PTw from the new twin configuration completes physical feedback loop 102.

At each stage A to H of the product life cycle, the system may label one twin configuration as a current design reference, herein described as an "authoritative twin" or "authoritative reference". The authoritative twin represents the design configuration that best responds to actual conditions (i.e., the ground truth). U.S. provisional patent application No. 63/470,870 provides a more complete description of authoritative twins and their determination, and is incorporated by reference in its entirety herein.

With faster feedback loops from sensor data and expert recommendations, the system updates DTw 122 to reflect latest design changes. This update process may involve engineering teams analyzing feedback 154 and executing the changes through IDEP 100, or automated changes enabled by IDEP 100 where updates to DTw 122 are generated through programmed algorithms or AI modules. This iterative updating process continues until DTw 122 and PTw 132 are in sync and the product's performance meets desired goals. While IDEP 100 may not itself designate the authoritative reference between a DTw or a PTw, the platform provides configurable mechanisms such as policies, algorithms, voting schema, and statistical support, whereby agents may designate a new DTw as the authoritative DTw, or equivalently in what instances the PTw is the authoritative source of truth.

When significant design improvements are made, a new PTw prototype may be built based on the updated DTw. This new prototype undergoes further testing and validation, ensuring the product's performance and design align with project objectives.

Once DTw 122 and PTw 132 have been validated and optimized, the product is ready for production. A digital thread connecting all stages of development can be queried via splice plane 170 to generate documentation as needed to meet validation and verification requirements. The use of model splicing, along with the feedback architecture shown in FIG. 1, improves the efficiency of the overall product innovation process.

Interconnected DE Platform and Product Lifecycle

In FIG. 1, letter labels "A" to "H" indicate the following major steps of a product lifecycle, according to some embodiments of the current invention:

A. Digital models reside within customer environments: a product may be originally represented by model files that are accessible via software tools located within customer environments. Model plane 180 encompasses all model files (e.g., 182) associated with the product.

B. Preparatory steps for design in the digital realm: splice plane 170 encompasses model splices (e.g., 172) generated from DE model file through model splicing. Model splicing enables the integration and sharing of DE model files within a single platform, as described in detail with reference to FIGS. 7 to 9.

C. Link threads as needed among model splices: to implement a product, model splices are linked through scripts within application plane 160. A digital twin (DTw) 122 englobing as-designed product features may be generated from application plane 160 for running in virtual environment 120. The complete twin configuration of a generated DTw is saved in twin configuration set 156 located at the analysis & control plane (ACP) 150. Features or parts of DTw 122 may be simulated in model plane 180, with performance data 174 accessed through splice plane 170. In one embodiment, features or parts of PTw 132 or DTw 122 configuration may be simulated outside the platform, where performance data is received by the ACP 150 for processing, in a similar way as performance data 126 received from DTw 122.

D. Finalize "As-designed": performance data 126 from DTw 122 or simulation performance data 174 attained through model plane 180 and accessed through model splicing may be collected and sent to ACP 150 for analysis. Performance data from different iterations of DTw 122 may be compared via engine 152 to design requirements. Analysis of the differences may lead to the generation of new twin configurations that are stored at twin configuration set 156. Each twin configuration in twin configuration set 156 may be applied at application plane 160 and splice plane 170 via process step 108 to instantiate a corresponding DTw. Multiple DTws may be generated and tested, consecutively or simultaneously, against the design requirements, through comparison engine 152 and analysis module 154. Verification and validation tools may be run on the various DTw iterations.

E. Finalize "As-manufactured": once a DTw 122 satisfies the design requirements, a corresponding PTw 132 prototype may be instantiated from the spliced model files (e.g., 172). Sensor data originating from the PTw 134 or from within the physical environment 136 may be collected, combined with other external data 142 (e.g., sensor data from other physical environments). The resulting processed sensory data 144 may be sent to the analysis & control plane 150 to be compared with performance data 126 from DTws and simulations (e.g., 174), leading to further DTw 122 and PTw 132 iterations populating the twin configuration set 156. Processed sensory data 144 may also be mapped to the digital threads (e.g., 164) and model splices (e.g., 172) governing the tested PTw 132 through the application plane 160.

F. Finalize "As-assembled": once the manufacturing process is completed for the various parts, as a DTw and as a PTw, the next step is to finalize the assembled configuration. This involves creating a digital representation of the assembly to ensure it meets the specified requirements. The digital assembly takes into account the dimensions and tolerances of the "as-manufactured" parts. To verify the feasibility of the digital assembly, tests are conducted using the measured data obtained from the physical assembly and its individual components. Measurement data from the physical component parts may serve as the authoritative reference for the digital assembly, ensuring alignment with the real-world configuration. The digital assembly is compared with the actual physical assembly requirements for validation of the assembled configuration. Subsequently, the digital assembly tests and configurations serve as an authoritative reference for instructions to guide the physical assembly process and ensure accurate replication. IDEP 100 components described above may be used in the assembly process. In its authoritative iteration, DTw 122 ultimately captures the precise details of the physical assembly, enabling comprehensive analysis and control in subsequent stages of the process.

G. Finalize "As-operated": to assess the performance of the physical assembly or its individual component parts, multiple digital twins 122 may be generated as needed. These digital twins are created based on specific performance metrics and serve as virtual replicas of the physical system. Digital twins 122 are continuously updated and refined in real-time using the operational data (e.g., 144) collected from monitoring the performance of the physical assembly or its components. This data may include, but are not limited to, processed sensory data, performance indicators, and other relevant information. By incorporating this real-time operational data, digital twins 122 stay synchronized with the actual system and provide an accurate representation of its operational performance. Any changes or improvements observed via sensory data 144 during the real-world operation of the assembly are reflected in DE models within the digital twins and recorded in the twin configuration set 156. This ensures that the digital twins remain up-to-date and aligned with the current state of the physical system.

H. Predictive analytics/Future performance: The design process may continue iteratively in virtual environment 120 through new DTw 122 configurations as the product is operated. Multiple digital twins may be created to evaluate the future performance of the physical assembly or its component parts based on specific performance metrics. Simulations are conducted with various control policies to assess the impact on performance objectives and costs. The outcome of these simulations helps in deciding which specific control policies should be implemented (e.g., tail volume coefficients and sideslip angle for an airplane product). The digital twin DE models (e.g., 182) are continuously updated and refined using the latest sensor data, control policies, and performance metrics to enhance their predictive accuracy. This iterative process ensures that the digital twins (e.g., 122, 156) provide reliable predictions of future performance and assist in making informed decisions.

The hardware components making up IDEP 100 (e.g., servers, computing devices, storage devices, network links) may be centralized or distributed among various entities, including one or more DE service providers and DE clients, as further discussed in the context of FIGS. 3 and 4. FIG. 4 shows an illustration of various potential configurations for instancing a DE platform within a customer's physical system and information technology (IT) environment, usually a virtual private cloud (VPC) protected by a firewall.

DE Documentation with Live or Magic Documents

The methods and systems described herein enable the updating and generation of DE documents using the full functionality of the IDEP shown in FIG. 1. In FIG. 1, the IDEP virtual feedback loop 104 allows the scripting of program code within a digital thread 162 for the generation, storing, and updating of digital twins 122 and twin configurations 156. Similarly, the IDEP virtual feedback loop 104 also allows the scripting of program code within a digital thread 162 for the generation, storing, and updating of DE documents. This enables the creation and maintenance of so-called live digital engineering documents.

Live DE documents are more akin to a DTw than a conventional static document in that they are configured, through a digital thread, to be continuously updated to reflect the most current changes within a particular twin configuration. In particular, an authoritative live DE document is configured to reflect the latest authoritative twin configuration. The "printing" of a live DE document corresponds to the generation of a frozen (i.e., static) time-stamped version of a live DE document. Therefore, "printing"—for a live DE document—is equivalent to "instantiation" for a DTw.

Live DE documents may also be known as magic documents as changes implemented within a twin configuration (e.g., through a modification of a model file) may appear instantaneously within the relevant data fields and sections of the live DE document. Similarly, authoritative live DE documents may also be known as authoritative magic documents as they continuously reflect data from the authoritative twin, thus always representing the authoritative source of truth.

Given the massive quantities of data and potential modifications that are carried out during a product's lifecycle, the scripts implementing live DE documentation may be configured to allow for a predefined maximum delay between the modification of a model file and the execution of the corresponding changes within a live DE document. Moreover, for similar reasons, the scripts implementing live DE documentation may be restricted to operate over a specified subset of model files within a DTw, thus reflecting changes only to key parameters and configurations of the DTw.

In one embodiment of the present invention, an IDEP script (e.g., an IDEP application) having access to model data via one or more model splices and DE document templates to create and/or update a live DE document may dynamically update the live DE document using software-defined digital threads over an IDEP platform. In such an embodiment, the IDEP script may receive user interactions dynamically. In response to the user updating data for a model and/or a specific parameter setting, the IDEP script may dynamically propagate the user's updates into the DE document through a corresponding digital thread.

In another embodiment of the present invention, the IDEP script may instantiate a DE document with sufficient specification to generate a physical twin (PTw). In such an embodiment, the IDEP script may receive a digital twin configuration of a physical twin, generate a live DE document associated with the digital twin configuration, receive a predetermined timestamp, and generate a printed DE document (i.e., a static, time-stamped version of the live DE document at the predetermined timestamp). Such an operation may be referred to as the "printing of a digital twin".

In yet another embodiment of the present invention, an IDEP script may instantiate (i.e., "print") a DE document specifying an updated digital twin upon detecting the update. In such an embodiment, the IDEP script may detect a modification of a DE model or an associated digital thread. In response to detecting the modification, the IDEP script may update relevant data fields and sections of the live DE document based on the detected modification, and generate an updated printed DE document with the updated relevant data fields and sections based on the always-updated live DE document.

In various embodiments, a software-defined digital thread can be associated with a companion magic document (or "magic doc") that encompasses live updates for one or more core parameters of the digital thread. In one embodiment, the magic doc includes key parameters describing the implementation of a user's intent. For example, In one embodiment, a companion magic doc for a given digital thread may include key data points and key orchestration script examples illustrating a user's intent (e.g., "increase a drone's wing span by 1%"). In one embodiment, a script-generating ML model receiving as input pseudocode or detailed user instructions derived from a user's intent, is trained on prior IDEP digital threads and documents. In addition to generating a digital thread (with orchestration scripts and comments), the script-generating ML model is also configured to generate a magic doc that explains how the generated digital thread addresses the user intent.

In some embodiments, receiving user interactions with a DE model, modifications to a DE model, or modifications to an associated digital thread, may be carried out through a push configuration, where a model splicer or a script of the digital thread sends any occurring relevant updates to the IDEP script immediately or within a specified maximum time delay. In other embodiments, receiving user interactions with a DE model, modifications of a DE model, or modifications of an associated digital thread, may be carried out through a pull configuration, where a model splicer or a script of the digital thread flag recent modifications until the IDEP script queries relevant DE models (via their model splices) or associated digital threads, for flagged modification. In these embodiments, the IDEP script may extract the modified information from the modified DE models (via their model splices) or the modified digital threads, in order to update a live DE document. In yet other embodiments, receiving user interactions with a DE model, modifications of a DE model, or modifications of an associated digital thread, may be carried out through a pull configuration, where the IDEP script regularly checks relevant DE models (via their model splices) or associated digital threads, for modified data fields, by comparing the data found in the live DE document with regularly extracted model and digital thread data. In these embodiments, the IDEP script may use the modified data to update the live DE document.

Dynamic Document Updates

Some embodiments described herein center around documentation, or document preparation and update and on document management (e.g., for reviews). As discussed, some embodiments of the system allow for dynamic updates to documents, which pertain to software-defined digital threads in the IDEP platform and the accompanying documentation.

Use of an ML engine with the model data and templates to create and/or update documents almost instantaneously as a one-time action have been presented. Furthermore, the digital engineering platform interacts dynamically with the user. As the user interacts with the system and updates data for a model or a specific parameter setting, these changes may be propagated through the corresponding digital threads and to the associated documentation. The AI architectures involved include locally-instanced large language model (LLMs, for data security reasons) as well as non-LLM approaches (e.g., NLP-based), in order to create, update, or predict documentation in the form of sentences, paragraphs, and whole documents. At the same time, trying to update the entire system of digital threads for every update may be prohibitively slow and may present security risks to the system. Generating live DE documents that are updated based on a subset of a system's DE models and within a maximum time delay may therefore be more efficient.

Interconnected Digital Engineering and Certification Ecosystem

FIG. 2 shows an exemplary implementation of the IDEP as an interconnected digital engineering (DE) and certification ecosystem 200, and exemplary digitally certified products, in accordance with some embodiments of the present invention. Interconnected DE and certification ecosystem 200 may be viewed as a particular instantiation or implementation of IDEP 100 shown in FIG. 1. The IDEP may also be referred to as a "DE Metaverse."

Interconnected DE and certification ecosystem 200 is a computer-based system that links models and simulation tools with their relevant requirements in order to meet verification, validation, and certification purposes. Verification refers to methods of evaluating whether a product, service, or system meets specified requirements and is fit for its intended purpose. For example, in the aerospace industry, a verification process may include testing an aircraft component to ensure it can withstand the forces and conditions it will encounter during flight. Verification also includes checking externally against customer or stakeholder needs. Validation refers to methods of evaluating whether the overall performance of a product, service, or system is suitable for its intended use, including its compliance with regulatory requirements and its ability to meet the needs of its intended users. Validation also includes checking internally against specifications and regulations. Interconnected DE and certification ecosystem 200 as disclosed herein is designed to connect and bridge large numbers of disparate DE tools and models from multitudes of engineering domains and fields, or from separate organizations who may want to share models with each other but have no interactions otherwise. In various embodiments, the system implements a robust, scalable, and efficient DE model collaboration platform, with extensible model splices having data structures and accompanying functions for widely distributed DE model types and DE tools, an application layer that links or connects DE models via APIs, digital threads that connect live engineering model files for collaboration and sharing, digital documentation management to assist with the preparation of engineering and certification documents appropriate for verification and validation (V&V) purposes, and AI-assistance with the functionalities of the aforementioned system components.

More specifically, FIG. 2 shows an example of an interconnected DE and certification ecosystem and examples of digitally certified products 212A, 212B, and 212C (collectively referred to as digitally certified products 212). For example, in some implementations, digitally certified product 212A may be an unmanned aerial vehicle (UAV) or other aircraft, digitally certified product 212B may be a drug or other chemical or biologic compound, and the digitally certified product 212C may be a process such as a manufacturing process. In general, the digitally certified products 212 can include any product, process, or solution that can be developed, tested, or certified (partially or entirely) using DE tools such as 202. In some implementations, digitally certified products 212 may not be limited to physical products, but can include non-physical products such as methodologies, processes and software, etc. While physical and physically-interacting systems often require multiple DE tools to assess for compliance with common V&V products simply by virtue of the need for modeling and simulation (M&S), many complex non-physical systems may also require multiple DE tools for product development, testing, and/or certification. With this in mind, various other possibilities for digitally certified products will be recognized by one of ordinary skills in the art. The inclusion of regulatory and certification standards, compliances, calculations, and tests (e.g., for the development, testing, and certification of products and/or solutions) enables users to incorporate relevant regulatory and certification standards, compliances, calculations, and test data directly into their DE workflow. Regulatory and certification standards, compliances, calculations, and tests are sometimes referred to herein as "common validation and verification (V&V) products."

Digitally certified products 212 in FIG. 2 may be designed and/or certified using interconnected DE and certification ecosystem 200. Interconnected DE and certification ecosystem 200 may include a user device 206A, API 206B, or other similar human-to-machine, or machine-to-machine communication interfaces operated by a user. A user may be a human 204 of various skill levels, or artificial users such as algorithms, artificial intelligence, or other software that interface with ecosystem 200 through API 206B. Ecosystem 200 may further comprise a computing and control system 208 ("computing system 208" hereinafter) connected to and/or including a data storage unit 218, an artificial intelligence (AI) engine 220, and an application and service layer 222. In some embodiments, the artificial intelligence (AI) engine 220 is a machine learning (ML) engine. References to "machine learning engine 220" or "ML engine 220" may be extended to artificial intelligence (AI) engines 220 more generally. For the purposes of clarity, any user selected from various potential human or artificial users are referred to herein simply as the user 204. In some implementations, computing system 208 may be a centralized computing system; in some implementations, computing system 208 may be a distributed computing system. In some cases, user 204 may be considered part of ecosystem 200, while in other implementations, user 204 may be considered separately from ecosystem 200. Ecosystem 200 may include one or more DE tools 202, such as data analysis tool 202A, computer-aided design (CAD) and finite element analysis (FEA) tool 202B, simulation tool 202C, drug modeling and simulation (M&S) tools 202D-202E, manufacturing M&S tools 202F-202G, etc. Ecosystem 200 may also include a repository of common V&V products 210, such as regulatory standards 210A-210F related to the development and certification of a UAV, medical standard 210G (e.g., CE marking (Europe), FCC Declaration of Conformity (USA), IECEE CB Scheme (Europe, North America, parts of Asia & Australia), CDSCO (India), FDA (USA), etc.), medical certification regulation 210H (e.g., ISO 13485, ISO 14971, ISO 9001, ISO 62304, ISO 10993, ISO 15223, ISO 11135, ISO 11137, ISO 11607, IEC 60601, etc.), manufacturing standard 210I (e.g., ISO 9001, ISO 9013, ISO 10204, EN 1090, ISO 14004, etc.), and manufacturing certification regulation 210J (e.g., General Certification of Conformity (GCC), etc.), etc.

In FIG. 2, computing system 208 is centrally disposed within the architecture and is configured to communicate with (e.g., receive data from and transmit data to) user device 206A or API 206B such as an API associated with an artificial user, DE tools 202 via an API or software development kit (SDK) 214, and repository of common V&V products 210 via an API/SDK interface 216. For example, computing system 208 may be configured to communicate with user device 206A and/or API 206B to send or receive data corresponding to a prototype of a design, information about a user (e.g., user credentials), engineering-related inputs/outputs associated with DE tools 202, digitized common V&V products, an evaluation of a product design, user instructions (e.g., search requests, data processing instructions, etc.), and more. Computing system 208 may also be configured to communicate with one or more DE tools 202 to send engineering-related inputs for executing analyses, models, simulations, tests, etc. and to receive engineering-related outputs associated with the results. Computing system 208 may also be configured to communicate with repository of common V&V products 210 to retrieve data corresponding to one or more digitized common V&V products 210 and/or upload new common V&V products, such as those received from user 204, to repository of common V&V products 210. All communications may be transmitted and corroborated securely, for example, using methods relying on zero-trust security. In some implementations, the computing system of the ecosystem may interface with regulatory and/or certification authorities (e.g., via websites operated by the authorities) to retrieve digitized common V&V products published by the regulatory authorities that may be relevant for a product that a user is designing. In some implementations, the user may upload digitized common V&V products to the ecosystem themselves.

Computing and control system 208 may process and/or store the data that it receives to perform analysis and control functionalities, and in some implementations, may access machine learning engine 220 and/or application and service layer 222, to identify useful insights based on the data, as further described herein. The central disposition of computing system 208 within the architecture of the ecosystem has many advantages including reducing the technical complexity of integrating the various DE tools; improving the product development experience of user 204; intelligently connecting common V&V products such as standards 210A-210F to DE tools 202 most useful for satisfying requirements associated with the common V&V products; and enabling the monitoring, storing, and analysis of the various data that flows between the elements of the ecosystem throughout the product development process. In some implementations, the data flowing through and potentially stored by the computing system 208 can also be auditable to prevent a security breach, to perform data quality control, etc. Similarly, any analysis and control functions performed via computing system 208 may be tracked for auditability and traceability considerations.

Referring to one particular example shown in FIG. 2, user 204 may use the DE and certification ecosystem to produce a digitally certified UAV 212B. For example, user 204 may be primarily concerned with certifying the UAV as satisfying the requirements of a particular regulatory standard 210E relating to failure conditions of the UAV (e.g., "MIL-HDBK 516C 4.1.4—Failure Conditions"). In this usage scenario, user 204 may develop a digital prototype of the UAV on user device 206A or using API 206B and may transmit prototype data (e.g., as at least one of a CAD file, a MBSE file, etc.) to computing system 208. Along with the prototype data, user 204 can transmit, via user device 206A, additional data including an indication of the common V&V product that user 204 is interested in certifying the product for (e.g., regulatory standard 210E), user credential information for accessing one or more capabilities of computing system 208, and/or instructions for running one or more digital models, tests, and/or simulations using a subset of DE tools 202.

Referring to another example shown in FIG. 2, user 204 can use the DE and certification ecosystem to produce a digitally certified drug, chemical compound, or biologic 212A. For example, user 204 may be primarily concerned with certifying drug, chemical compound, or biologic 212A as satisfying the requirements of a particular medical standard 210G and medical certification regulation 210H. In this usage scenario, user 204 can develop a digital prototype of the drug, chemical compound, or biologic on user device 206A or using API 206B and can transmit the prototype data (e.g., as a molecular modeling file) to computing system 208. Along with the prototype data, user 204 can transmit, via user device 206A, additional data including an indication of the common V&V products that user 204 is interested in certifying the product for (e.g., medical standard 210G and medical certification regulation 210H), user credential information for accessing one or more capabilities of computing system 208, and/or instructions for running one or more digital models, tests, and/or simulations using a subset of DE tools 202 (e.g., drug M&S tools 202D-202E).

Referring to yet another example shown in FIG. 2, user 204 can use the digital engineering and certification ecosystem to produce a digitally certified manufacturing process 212C. For example, user 204 may be primarily concerned with certifying manufacturing process 212C as satisfying the requirements of a particular manufacturing standard 210I and manufacturing certification regulation 210J. In this usage scenario, user 204 can develop a digital prototype of the manufacturing process on user device 206A or using API 206B and can transmit the prototype data to computing system 208. Along with the prototype data, user 204 can transmit, via the user device 206A, additional data including an indication of the common V&V products that user 204 is interested in certifying the process for (e.g., manufacturing standard 210I and manufacturing certification regulation 210J), user credential information for accessing one or more capabilities of computing system 208, and/or instructions for running one or more digital models, tests, and/or simulations using a subset of DE tools 202 (e.g., manufacturing M&S tools 202F-202G).

In any of the aforementioned examples, computing system 208 can receive the data transmitted from user device 206A and/or API 206B and can process the data to evaluate whether the common V&V product of interest (e.g., regulatory standard 210E, medical standard 210G, medical certification regulation 210H, manufacturing standard 210I, manufacturing certification regulation 210J, etc.) is satisfied by the user's digital prototype, in the context of analysis and control plane 150 shown in FIG. 1. For example, this can involve communicating with the repository of common V&V products 210 via the API/SDK 216 to retrieve the relevant common V&V product of interest and processing the regulatory and/or certification data associated with the common V&V product to identify one or more requirements for the UAV prototype; the drug, chemical compound, or biologic prototype; the manufacturing process prototype; etc. In some implementations, repository of common V&V products 210 can be hosted by a regulatory and/or certification authority (or another third party), and retrieving the regulatory and/or certification data can involve using API/SDK 216 to interface with one or more data resources maintained by the regulatory and/or certification authority (or the another third party). In some implementations, the regulatory and/or certification data can be provided directly by user 204 via user device 206A and/or API 206B (e.g., along with the prototype data).

Evaluating whether the common V&V product of interest is satisfied by the user's digital prototype can also involve processing the prototype data received from user device 206A or API 206B to determine if the one or more identified requirements are actually satisfied. In some implementations, computing system 208 can include one or more plugins, local applications, etc. to process the prototype data directly at the computing system 208. For example, model splicing and digital threading applications are discussed in detail later with reference to FIGS. 6 to 9. In some implementations, the computing system can simply pre-process the received prototype data (e.g., to derive inputs for DE tools 202) and can then transmit instructions and/or input data to a subset of DE tools 202 via API/SDK 214 for further processing.

Not all DE tools 202 are necessarily required for the satisfaction of particular regulatory and/or certification standards. Therefore, in the UAV example provided in FIG. 2, computing system 208 may determine that only a data analysis tool 202A and a finite element analysis tool 202B are required to satisfy regulatory standard 210E for failure conditions. In the drug, chemical compound, or biologic example provided in FIG. 2, computing system 208 may determine that only drug M&S tools 202D-202E are required to satisfy medical standard 210G and medical certification regulation 210H. In the manufacturing process example provided in FIG. 2, computing system 208 may determine that only manufacturing M&S tools 202F-202G are required to satisfy manufacturing standard 210I and manufacturing certification regulation 210J. In other implementations, user 204 may themselves identify the particular subset of DE tools 202 that should be used to satisfy the common V&V product of interest, provided that user 204 is a qualified subject matter expert (SME). In other implementations, user 204 may input to computing system 208 some suggested DE tools 202 to satisfy a common V&V product of interest, and computing system 208 can recommend to user 204 a modified subset of DE tools 202 for final approval by user 204, provided that user 204 is a qualified SME. After a subset of DE tools 202 has been identified, computing system 208 can then transmit instructions and/or input data to the identified subset of DE tools 202 to run one or more models, tests, and/or simulations. The results (or "engineering-related data outputs" or "digital artifacts") of these models, tests, and/or simulations can be transmitted back and received at computing system 208.

In still other implementations, user 204 may input a required DE tool such as 202F for meeting a common V&V product 210I, and the computing system 208 can determine that another DE tool such as 102G is also required to satisfy common V&V product 210I. The computing system can then transmit instructions and/or input data to both DE tools (e.g., 202F and 202G), and the outputs of these DE tools can be transmitted and received at computing system 208. In some cases, the input data submitted to one of the DE tools (e.g., 202G) can be derived (e.g., by computing system 208) from the output of another of the DE tools (e.g., 202F).

After receiving engineering-related data outputs or digital artifacts from DE tools 202, computing system 208 can then process the received engineering-related data outputs to evaluate whether or not the requirements identified in the common V&V product of interest (e.g., regulatory standard 210E, medical standard 2110G, medical certification regulation 210H, manufacturing standard 210I, manufacturing certification regulation 210J, etc.) are satisfied. For example, applications and services 222 may provide instructions for orchestrating validation or verification activities. In some implementations, computing system 208 can generate a report summarizing the results of the evaluation and can transmit the report to device 206A or API 206B for review by user 204. If all of the requirements are satisfied, then the prototype can be certified, resulting in digitally certified product 212 (e.g., digitally certified drug, chemical compound, or biologic 212A; digitally certified UAV 212B; digitally certified manufacturing process 212C, etc.). However, if some of the regulatory requirements are not satisfied, then additional steps may need to be taken by user 204 to certify the prototype of the product. In some implementations, the report that is transmitted to the user can include recommendations for these additional steps (e.g., suggesting one or more design changes, suggesting the replacement of one or more components with a previously designed solution, suggesting one or more adjustments to the inputs of the models, tests, and/or simulations, etc.). If the requirements of a common V&V product are partially met, or are beyond the collective capabilities of distributed engineering tools 202, computing systems 208 may provide user 204 with a report recommending partial certification, compliance, or fulfillment of a subset of the common V&V products (e.g., digital certification of a subsystem or a sub-process of the prototype). The process of generating recommendations for user 204 is described in further detail below.

In response to reviewing the report, user 204 can make design changes to the digital prototype locally and/or can send one or more instructions to computing system 208 via user device 206A or API 206B. These instructions can include, for example, instructions for computing system 208 to re-evaluate an updated prototype design, use one or more different DE tools 202 for the evaluation process, and/or modify the inputs to DE tools 202. Computing system 208 can, in turn, receive the user instructions, perform one or more additional data manipulations in accordance with these instructions, and provide user 204 with an updated report. Through this iterative process, user 204 can utilize the interconnected digital engineering and certification ecosystem to design and ultimately certify (e.g., by providing certification compliance information) the prototype (e.g., the UAV prototype, drug prototype, manufacturing process prototype, etc.) with respect to the common V&V product of interest. Importantly, since all of these steps occur in the digital world (e.g., with digital prototypes, digital models/tests/simulations, and digital certification), significant amount of time, cost, and materials can be saved in comparison to a process that would involve the physical prototyping, evaluation and/or certification of a similar UAV, drug, manufacturing process, etc. If the requirements associated with a common V&V product are partially met, or are beyond the collective capabilities of DE tools 202, computing system 208 may provide user 204 with a report recommending partial certification, compliance or fulfillment of a subset of the common V&V products (e.g., digital certification of a subsystem or a sub-process of the prototype).

While the examples described above focus on the use of the interconnected digital engineering and certification ecosystem by a single user, additional advantages of the ecosystem can be realized through the repeated use of the ecosystem by multiple users. As mentioned above, the central positioning of computing system 208 within the architecture of the ecosystem enables computing system 208 to monitor and store the various data flows through the ecosystem. Thus, as an increasing number of users utilize the ecosystem for digital product development, data associated with each use of the ecosystem can be stored (e.g., in storage 218), traced (e.g., with metadata), and analyzed to yield various insights, which can be used to further automate the digital product development process and to make the digital product development process easier to navigate for non-subject matter experts.

Indeed, in some implementations, user credentials for user 204 can be indicative of the skill level of user 204, and can control the amount of automated assistance the user is provided. For example, non-subject matter experts may only be allowed to utilize the ecosystem to browse pre-made designs and/or solutions, to use DE tools 202 with certain default parameters, and/or to follow a predetermined workflow with automated assistance directing user 204 through the product development process. Meanwhile, more skilled users may still be provided with automated assistance, but may be provided with more opportunities to override default or suggested workflows and settings.

In some implementations, computing system 208 can host applications and services 222 that automate or partially automate components of common V&V products; expected or common data transmissions, including components of data transmissions, from user 204; expected or common interfaces and/or data exchanges, including components of interfaces, between various DE tools 202; expected or common interfaces and/or data exchanges, including components of interfaces, with machine learning (ML) models implemented on computing system 208 (e.g., models trained and/or implemented by the ML engine 220); and expected or common interfaces and/or data exchanges between the applications and services themselves (e.g., within applications and services layer 222).

In some implementations, the data from multiple uses of the ecosystem (or a portion of said data) can be aggregated to develop a training dataset. For example, usage records 217 collected via computing system 208 may be de-identified or anonymized, before being added to the training set. Such usage records may comprise model parameters and metadata, tool configurations, common V&V product matching to specific models or tools, user interactions with the system including inputs and actions, and other user-defined or system-defined configurations or decisions in using the ecosystem for digital engineering and certification. For instance, an exemplary de-identified usage record may comprise the combination of a specific DE tool, a specific target metric, a specific quantity deviation, and a corresponding specific user update to a DE model under this configuration. Another exemplary de-identified usage record may comprise a user-identified subset of DE tools 202 that should be used to satisfy a common V&V product of interest.

This training dataset can then be used to train ML models (e.g., using ML engine 220) to learn the steps and actions for certification processes and to perform a variety of tasks including the identification of which of DE tools 202 to use to satisfy a particular common V&V product; the identification of specific models, tests, and/or simulations (including inputs to them) that should be performed using DE tools 202; the identification of the common V&V products that need to be considered for a product of a particular type; the identification of one or more recommended actions for user 204 to take in response to a failed regulatory requirement; the estimation of model/test/simulation sensitivity to particular inputs; etc. The outputs of the trained ML models can be used to implement various features of the interconnected digital engineering and certification ecosystem including automatically suggesting inputs (e.g., inputs to DE tools 202) based on previously entered inputs, forecasting time and cost requirements for developing a product, predictively estimating the results of sensitivity analyses, and even suggesting design changes, original designs or design alternatives (e.g., via assistive or generative AI) to a user's prototype to overcome one or more requirements (e.g., regulatory and/or certification requirements) associated with a common V&V product. In some implementations, with enough training data, ML engine 220 may generate new designs, models, simulations, tests, common V&V products and/or digital threads on its own based on data collected from multiple uses of the ecosystem. Furthermore, such new designs, models, simulations, tests, common V&V products and digital threads generated by ML engine 220, once approved and adjusted by a user, may be added to the training set for further fine-tuning of ML algorithms in a reinforcement learning setup.

As shall be discussed in the context of FIGS. 7 to 9, the aforementioned collection of training datasets and the training of ML and AI modules including ML engine 220 may be enabled by model splicing technologies. Model splicing, as described herein, allows the scripting of DE model operations encompassing disparate DE tools into a corpus of normative program code, and facilitates the code-defined digital threading of a large space of DE activities involving DE models across different disciplines. ML and AI techniques may be used to create scripts to carry out almost any DE task and to execute any digital thread, allowing for programmable, machine-learnable, and dynamic changes to DE model files, digital threads, and ultimately to digital or physical twins, throughout the product life cycle. For example, in the embodiment shown in FIG. 2. ML engine 220 may manage or orchestrate the interactions between spliced DE models, DE tools, and common V&V products (e.g., DE requirements), based on digital thread options specific to user's intent and input. Sample DE tasks that may be carried out by ML engine 220 include, but are not limited to, (1) aligning models/analysis to certification lifecycle requirement steps, (2) optimizing compute by determining the appropriate fidelity of each model, (3) optimizing compute resources for specific tools/models, or (4) optimizing compute resources across multiple models. ML-enabled executions of DE tasks are not limited to certification or resource optimization, but encompass the whole DE space of operations. Rather, ML engine 220 may act as an AI multiplexer for the DE platform.

In addition to storing usage data to enable the development of ML models, previous prototype designs and/or solutions (e.g., previously designed components, systems, models, simulations and/or other engineering representations thereof) can be stored within the ecosystem (e.g., in storage 218) to enable users to search for and build upon the work of others. For example, previously designed components, systems, models, simulations and/or other engineering representations thereof can be searched for by user 204 and/or suggested to user 204 by computing system 208 in order to satisfy one or more requirements associated with a common V&V product. The previously designed components, systems, models, simulations and/or other engineering representations thereof can be utilized by user 204 as is, or can be utilized as a starting point for additional modifications. This store, or repository, of previously designed components, systems, models, simulations and/or other engineering representations thereof (whether or not they were ultimately certified) can be monetized to create a marketplace of digital products, which can be utilized to save time during the digital product development process, inspire users with alternative design ideas, avoid duplicative efforts, and more. In some implementations, data corresponding to previous designs and/or solutions may only be stored if the user who developed the design and/or solution opts to share the data. In some implementations, the repository of previous designs and/or solutions can be containerized for private usage within a single company, team, organizational entity, or technical field for private usage (e.g., to avoid the unwanted disclosure of confidential information). In some implementations, user credentials associated with user 204 can be checked by computing system 208 to determine which designs and/or solutions stored in the repository can be accessed by user 204. In some implementations, usage of the previously designed components, systems, models, simulations and/or other engineering representations thereof may be available only to other users who pay a fee for a usage.

Exemplary IDEP Implementation Architecture with Services and Features

FIG. 3 shows another exemplary implementation of the IDEP illustrating its offered services and features, in accordance with some embodiments of the present invention. Specifically, an exemplary implementation architecture diagram 300 is shown in FIG. 3 to include multiple illustrative components: an IDEP enclave 302, cloud services 304, and a customer environment 310 which optionally includes an IDEP exclave 316. This exemplary architecture 300 for the IDEP is designed in accordance with zero-trust security principles and is further designed to support scalability as well as robust and resilient operations. IDEP enclave 302 and IDEP exclave 316 together instantiate IDEP 100 shown in FIG. 1, with IDEP exclave 316 implementing model splicing and splice plane 170 in some embodiments of the present invention. An enclave is an independent set of cloud resources that are partitioned to be accessed by a single customer (i.e., single-tenant) or market (i.e., multi-tenant) that does not take dependencies on resources in other enclaves. An exclave is a set of cloud resources outside enclaves managed by the IDEP, to perform work for individual customers. Examples of exclaves include virtual machines (VMs) and/or servers that the IDEP maintains to run DE tools for customers who need such services.

In particular, IDEP enclave or DE platform enclave 302 may serve as a starting point for services rendered by the IDEP, and may be visualized as a central command and control hub responsible for the management and orchestration of all platform operations. For example, enclave 302 may be implemented using computer system 208 of the interconnected DE and certification ecosystem shown in FIG. 2. DE platform enclave 302 is designed to integrate both zero-trust security models and hyperscale capabilities, resulting in a secure and scalable processing environment tailored to individual customer needs. Zero-trust security features include, but are not limited to, strict access control, algorithmic impartiality, and data isolation. Enclave 302 also supports an ML engine such as 220 for real-time analytics, auto-scaling features for workload adaptability, and API-based interoperability with third-party services. Security and resource optimization are enhanced through multi-tenancy support, role-based access control, and data encryption both at rest and in transit. DE platform enclave 302 may also include one or more of the features described below.

First, IDEP enclave 302 may be designed in accordance with zero-trust security principles. In particular, DE platform enclave 302 may employ zero-trust principles to ensure that no implicit trust is assumed between any elements, such as digital models, platform agents or individual users (e.g., users 204) or their actions, within the system. That is, no agent may be inherently trusted and the system may always authenticate or authorize for specific jobs. The model is further strengthened through strict access control mechanisms, limiting even the administrative team (e.g., a team of individuals associated with the platform provider) to predetermined, restricted access to enclave resources. To augment this robust security stance, data encryption is applied both at rest and in transit, effectively mitigating risks of unauthorized access and data breaches.

IDEP enclave 302 can also be designed to maintain isolation and independence. A key aspect of the enclave's architecture is its focus on impartiality and isolation. DE enclave 302 disallows cryptographic dependencies from external enclaves and enforces strong isolation policies. The enclave's design also allows for both single-tenant and multi-tenant configurations, further strengthening data and process isolation between customers 306 (e.g., users 204). Additionally, DE enclave 302 is designed with decoupled resource sets, minimizing interdependencies and thereby promoting system efficiency and autonomy.

IDEP enclave 302 can further be designed for scalability and adaptability, aligning well with varying operational requirements. For example, the enclave 302 can incorporate hyperscale-like properties in conjunction with zero-trust principles to enable scalable growth and to handle high-performance workloads effectively.

IDEP enclave 302 can further be designed for workflow adaptability, accommodating varying customer workflows and DE models through strict access control mechanisms. This configurability allows for a modular approach to integrate different functionalities ranging from data ingestion to algorithm execution, without compromising on the zero-trust security posture. Platform 300's adaptability makes it highly versatile for a multitude of use-cases, while ensuring consistent performance and robust security.

IDEP enclave 302 can further be designed to enable analytics for robust platform operations. At the core of the enclave's operational efficiency is a machine learning engine (e.g., machine learning engine 220) capable of performing real-time analytics. This enhances decision-making and operational efficiency across platform 300. Auto-scaling mechanisms can also be included to enable dynamic resource allocation based on workload demand, further adding to the platform's responsiveness and efficiency.

In the exemplary embodiment shown in FIG. 3, IDEP enclave 302 includes several components as described in further detail herein.

A "Monitoring Service Cell. may provide "Monitoring Service" and "Telemetry Service." A cell may refer to a set of microservices, for example, a set of microservices executing within a kubernetes pod. These components focus on maintaining, tracking and analyzing the performance of platform 300 to ensure good service delivery, including advanced machine learning capabilities for real-time analytics. A "Search Service Cell" provides "Search Service" to aid in the efficient retrieval of information from DE platform

300, adding to its overall functionality. A "Logging Service Cell" and a "Control Plane Service Cell" provides "Logging Service," "File Service", and "Job Service" to record and manage operational events and information flow within platform 300, and instrumental in the functioning of plat- form 300. A "Static Assets Service Cell," provides "Statics Service", and may house user interface, SDKs, command line interface (CLI), and documentation for platform 300. An "API Gateway Service Cell" provides "API Gateway Service," and may provide DE platform API(s) (e.g., APIs 214, 216) and act as a mediator for requests between the client applications (e.g., DE tools 202, the repository of common V&V products 210, etc.) and the platform services. In some embodiments, the API gateway service cell may receive and respond to requests from agents such as DE platform exclave 316 to provide splice functions for model splicing purposes.

As shown in FIG. 3, the architecture of DE platform 300 may also include a cloud services 304 that provide services which cannot interact with customer data but can modify the software for the orchestration of DE platform operations. In example implementations, several cloud resources provide support and foundational services to the platform. For example, in the embodiment of the DE platform 300 shown in FIG. 3, cloud services 304 includes a "Customer Identity and Access Management (IAM) Service" that ensures secure and controlled access to platform 300. Cloud services 304 also includes a "Test Service" that tests tools to validate platform operations. Cloud services 304 may also include an "Orchestration Service" that controls and manages the life- cycle of containers on the platform 300. Cloud services 304 may also include an "Artifact Service" and "Version Control and Build Services," which may be used to maintain the evolution of projects, codes, and instances in the system, while also managing artifacts produced during the product development process.

As shown in FIG. 3, the architecture of DE platform 300 may also include a customer environment 310 with an "Authoritative Source of Truth" 312, customer tools 314, and an optional DE platform exclave 316. Customer envi- ronment 310 is where customer data resides and is processed in a zero-trust manner by DE platform 300. As described previously, DE platform enclave 302, by focusing on both zero-trust principles and hyperscale-like properties, pro- vides a robust and scalable environment for the secure processing of significant workloads, according to the cus- tomer's unique needs. In some examples, DE platform exclave 316 may be situated within customer environment 310 in order to assist the customer(s) 306 with their DE tasks and operations, including model splicing and digital thread- ing.

When a customer 306 (e.g., user 204) intends to perform a DE task using DE platform 300 (e.g., IDEP 100), typical operations may include secure data ingestion and controlled data retrieval. Derivative data generated through the DE operations, such as updated digital model files or revisions to digital model parameters, may be stored only within customer environment 310, and DE platform 300 may provide tools to access the metadata of the derivative data. Here metadata refers to data that can be viewed without opening the original data, and may comprise versioning information, time stamps, access control properties, and the like. Example implementations may include secure data ingestion, which utilizes zero-trust principles to ensure cus- tomer data is securely uploaded to customer environment 310 through a pre-validated secure tunnel, such as Secure Socket Layer (SSL) tunnel. This can enable direct and secure file transfer to a designated cloud storage, such as a simple storage service (S3) bucket, within customer envi- ronment 310. Example implementations may also include controlled data retrieval, in which temporary, pre-authenti- cated URLs generated via secure token-based mechanisms are used for controlled data access, thereby minimizing the risk of unauthorized interactions. Example implementations may also include immutable derivative data, with trans- formed data generated through operations like data extrac- tion being securely stored within customer environment 310 while adhering to zero-trust security protocols. Example implementations may also include tokenization utility, in which a specialized DE platform tool referred to as a "tokenizer" is deployed within customer environment 310 for secure management of derivative metadata, conforming to zero-trust guidelines.

Customer environment 310 may interact with other ele- ments of secure DE platform 300 and includes multiple features that handle data storage and secure interactions with platform 300. For example, one element of the customer environment 310 is "Authoritative Source of Truth" 312, which is a principal repository for customer data, ensuring data integrity and accuracy. Nested within this are "Cus- tomer Buckets" where data is securely stored with strict access controls, limiting data access to authorized users or processes through pre-authenticated URL links. This setup ensures uncompromising data security within customer environment 310 while providing smooth interactions with other elements of DE platform 300.

Customer environment 310 may also include additional software tools such as customer tools 314 that can be utilized based on specific customer requirements. For example, a "DE Tool Host" component may handle necessary DE applications for working with customer data. It may include a DE Tools Command-Line Interface (DET CLI), enabling user-friendly command-line operation of DE tools (e.g., DE tools 102). A "DE platform Agent" ensures smooth commu- nication and management between customer environment 310 and elements of DE platform 300. Furthermore, there can be another set of optional DE tools designed to assist customer-specific DE workflows. Native DE tools are typi- cally access-restricted by proprietary licenses and end-user license agreements paid for by the customer. IDEP platform functions call upon native DE tools that are executed within customer environment 310, therefore closely adhering to the zero-trust principle of the system design. Exemplary DE tools include, but are not limited to, proprietary and open- source versions of model-based systems engineering (MBSE) tools, augmented reality (AR) tools, computer aided design (CAD) tools, data analytics tools, modeling and simulation (M&S) tools, product lifecycle management (PLM) tools, multi-attribute trade-space tools, simulation engines, requirements model tools, electronics model tools, test-plan model tools, cost-model tools, schedule model tools, supply-chain model tools, manufacturing model tools, cyber security model tools, or mission effects model tools.

In some cases, an optional "IDEP Exclave" 316 may be employed within customer environment 310 to assist with customer DE tasks and operations, supervise data process- ing, and rigorously adhering to zero-trust principles while delivering hyperscale-like platform performance. IDEP exclave 316 is maintained by the IDEP to run DE tools for customers who need such services. IDEP exclave 316 may contain a "DE Tool Host" that runs DE tools and a "DE Platform Agent" necessary for the operation. Again, native DE tools are typically access-restricted by proprietary licenses and end-user license agreements paid for by the customer. IDEP exclave 316 utilities and manages propri-
etary DE tools hosted with customer environment 310, for
example, to implement model splicing and digital threading
functionalities.

In some embodiments, the machine learning (ML) models
and artificial intelligence (AI) assistance approaches as
described herein adapt to suit different customer instances of
the IDEP (see FIG. 4) and the availability of training data.
In an example, a pre-trained ML or AI model (e.g., within
the IDEP enclave 302) is deployed in instances where there
are restrictions around sharing customer data. In another
example, AI models are deployed in a federated manner
adjacent to DE agents and DE tools in the customer envi-
ronment (e.g., within IDEP exclave 316). In another
example, an AI model deployed inside the customer envi-
ronment is trained behind its firewalls. In yet another
example, the customer may allow sharing of subsets of their
metadata for a training database located within the IDEP
enclave.

IDEP Deployment Scenarios

FIG. 4 shows potential scenarios for instantiating an IDEP
in connection to a customer's physical system and IT
environment, in accordance with some embodiments of the
present invention. Specifically, FIG. 4 illustrates various
potential configurations for instancing or instantiating an
IDEP ("DE platform) 402 in connection to a customer's IT
environment and physical system 404. The IT environment
may be located on a virtual private cloud (VPC) protected by
a firewall. The physical system may refer to a physical twin
as discussed with reference to FIG. 1. In some embodiments,
IDEP 402 may be instanced as an enclave such as 302 shown
in FIG. 3. For example, IDEP 402 may be instanced on the
cloud, possibly in a software-as-a-service (SaaS) configu-
ration. The platform instances in these embodiments include
software and algorithms, and may be described as follows:

1. External Platform Instance 410: This option showcases
   the IDEP as a separate platform instance. The platform
   interacts with the physical system through the custom-
   er's virtual environment, or a Customer Virtual Private
   Cloud ("Customer VPC"), which is connected to the
   physical system.
2. External Platform Instance with Internal Agent 420:
   The IDEP is instantiated as a separate platform, con-
   nected to an internal agent ("DE Agent") wholly
   instanced within the Customer VPC. For example, the
   IDEP may be instantiated as enclave 302, and the DE
   agent may be instantiated as exclave 316 within the
   Customer VPC linked to the physical system.
3. External Platform Instance with Internal Agent and
   Edge Computing 430: This scenario displays the IDEP
   as a separate instantiation, connected to an internal DE
   Agent wholly instanced within the Customer VPC,
   which is further linked to an edge instance ("DE Edge
   Instance") on the physical system. The DE agent is
   nested within the customer environment, with a smaller
   edge computing instance attached to the physical sys-
   tem.
4. Edge Instance Connection 440: This option shows the
   DE platform linked directly to a DE edge instance on
   the physical system. The DE platform and the physical
   system are depicted separately, connected by an edge
   computing instance in the middle, indicating the flow
   of data.
5. Direct API Connection 450: This deployment scenario
   shows the DE platform connecting directly to the
   physical system via API calls. In this depiction, an arrow extends directly from the platform sphere to the
physical system sphere, signifying a direct interaction
through API.

6. Air-Gapped Platform Instance 460: This scenario illus-
   trates the IDEP being completely instanced on an
   air-gapped, or isolated, physical system as a DE agent.
   The platform operates independently from any net-
   works or Internet connections, providing an additional
   layer of security by eliminating external access points
   and potential threats. Interaction with the platform in
   this context would occur directly on the physical sys-
   tem, with any data exchange outside the physical
   system being controlled following strict security pro-
   tocols to maintain the air-gapped environment.

Across these deployment scenarios, the IDEP plays an
important role in bridging the gap between a digital twin
(DTw) established through the IDEP and its physical coun-
terpart. Regardless of how the IDEP is instantiated, it
interacts with the physical system, directly or through the
customer's virtual environment. The use of edge computing
instances in some scenarios demonstrates the need for
localized data processing and the trade-offs between real-
time analytics and more precise insights in digital-physical
system management. Furthermore, the ability of the plat-
form to connect directly to the physical system through API
calls underscores the importance of interoperability in facili-
tating efficient data exchange between the digital and physi-
cal worlds. In all cases, the DE platform operates with robust
security measures.

In some embodiments, the IDEP deployment for the same
physical system can comprise a combination of the deploy-
ment scenarios described above. For example, for the same
customer, some physical systems may have direct API
connections to the DE platform (scenario 5), while other
physical systems may have an edge instance connection
(scenario 4).

Multimodal User Interfaces

FIG. 5 illustrates the use of multimodal user interfaces
590 for the interconnected DE platform, which can handle
various input and output modalities such as Virtual Reality
(VR), Mixed Reality (MR), auditory, text, and code. These
interfaces are designed to manage the complexity of data
streams and decision-making processes, and provide deci-
sion support including option visualization, impact predic-
tion, and specific decision invocation. Specifically, data
streams 502 and 504 are processed in the Analysis & Control
Plane (ACP) 150 of FIG. 1. The user interface may receive
data streams from physical and virtual feedback loops 102
and 104, as well as external expert feedback 114, analysis
module 154, and twin configuration set 156 of ACP 150.

The multimodal interfaces illustrated in FIG. 5 are con-
figured to carry out all the DE tasks and actions described in
the context of FIG. 1, by catering to both humans and
bots/algorithms, handling the intricacies of data stream
frequency and complexity, decision-making time scales, and
latency impacts. In the case of human decision makers, the
user interface may need to manage inputs and outputs while
for algorithmic decision making, the user interface may need
to present rationale and decision analysis to human users.
Some examples of human interfaces include a dashboard-
style interface 594, a workflow-based interface 596, con-
versational interfaces 598, spatial computer interfaces 592,
and code interfaces 599.

Dashboard-style interface 594 offers a customizable over-
view of data visualizations, performance metrics, and sys-
tem status indicators. It enables monitoring of relevant
information, sectional review of documents, and decision-making based on dynamic data updates and external feedback. Such an interface may be accessible via web browsers and standalone applications on various devices.

Workflow-based interface 596 guides users through the decision-making process, presenting relevant data, options, and contextual information at each stage. It integrates external feedback and is designed as a progressive web app or a mobile app. In the context of alternative tool selection, workflow-based interface 596 may provide options on individual tools at each stage, or provide combinations of tool selections through various stages to achieve better accuracy or efficiency for the overall workflow.

Conversational interfaces 598 are based on the conversion of various input formats such as text, prompt, voice, audio-visual, etc. into input text, then integrating the resulting input text within the DE platform workflow. Outputs from the DE platform may undergo the reverse process. This enables interoperability with the DE platform, and specifically the manipulation of model splices. In the broad context of audio-visual inputs, the conversational interfaces may comprise data sonification, which involves using sound to represent data, information, or events, and using auditory cues or patterns to communicate important information to users, operators, or reviewers. Sonified alerts (e.g., alerts sent via sound, e.g., via a speaker) are especially useful when individuals need to process information quickly without having to visually focus on a screen. For example, sonified alerts can be used to notify security analysts of potential threats or breaches.

FIG. 5 also illustrates the use of spatial computing interfaces 592 and code interfaces 599 in the management of DTws and PTws. Spatial computing interfaces allow for more immersive and intuitive user experiences, and enable real-time synchronization between DTws and PTws. Code interfaces allow bots and digital engineers to interact with the DE platform through scripting and code. It also allows the collection of user preference, task history, and tool usage patterns for alternative tool selection purposes.

Digital Threads and Autonomous Data Linkages

As discussed previously, a "digital thread" is intended to connect two or more digital engineering (DE) models for traceability across the systems engineering lifecycle, and collaboration and sharing among individuals performing DE tasks. In a digital thread, appropriate outputs from a preceding digital model may be provided as the inputs to a subsequent digital model, allowing for information and process flow. That is, a digital thread may be viewed as a communication framework or data-driven architecture that connects traditionally siloed elements to enable the flow of information and actions between digital models.

FIG. 6 describes the architecture and inherent complexity of digital threads, in accordance with the examples disclosed herein. Specifically, FIG. 6 is a schematic diagram comparing exemplary digital threads 600 of various complexities that manipulate and/or connect DE models, in accordance with some embodiments of the present invention. In the most basic sense, a digital thread may "thread" together DE models into a simple daisy-chain architecture 602 where modifications in any upstream DE model will affect all DE models downstream from the modified DE model. For example, a modification of any parameter or process of a DE model B will cause changes in DE model C, which in turn will cause changes in DE model D. Cause-and-effect changes will therefore cascade downstream. As another example, diagram 604 represents a more complex digital thread where a change in one DE model may affect more than one downstream model. In both 602 and 604, digital threads are represented by a directed acyclic graph (DAG).

DAGs are frequently used in many kinds of data processing and structuring tasks, such as scheduling tasks, data compression algorithms, and more. In the context of service platforms and network complexities, a DAG might be used to represent the relationships between different components or services within the platform. In digital thread 604, different models may depend on each other in different ways. Model A may affect models B. C. and D, with models B and C affecting model E, and models D and E affecting model G. Such dependencies are denoted as a DAG, where each node is associated with a component (e.g., a model), and each directed edge represents a dependency.

A major issue with dealing with interdependent DE models is that graph consistencies can be polynomial, and potentially exponential, in complexity. Hence, if a node fails (e.g., a model is unreliable), this can have a cascading effect on the rest of the digital thread, disrupting the entire design. Furthermore, adding nodes or dependencies to the graph does not yield a linear increase in complexity because of the interdependencies between models. If a new model is added that affects or depends on several existing models, the resulting increase in graph complexity is multiplicative in nature, hence potentially exponential. The multiplicative nature of digital thread consistencies is compounded by the sheer number of interconnected models, which may number in the hundreds or thousands. Diagram 606 is a partial representation of a real-world digital thread, illustrating the complexity of digital threads and its multiplicative growth.

FIG. 6 further shows special cases 603, 605, 607, 608, and 609 of exemplary simple digital threads. Diagram 607 represents a degenerate digital thread where data is shared from a single DE model. Diagram 608 represents a model-to-document digital thread where data (e.g., system attributes, performance attributes) extracted from a single DE model may be used to generate or update a text-based document (e.g., a Capability Development Document (CDD)). Diagrams 603 and 605 are generalized from 608 to represent cases where data extracted from a single model may be used to update multiple models, or vice versa. Specifically, diagram 605 may represent the dynamic updates of live or magic documents discussed in the context of FIG. 1. Here, the logic to connect the DE models shown is clear: data are extracted from multiple DE models A, B, and C to update a document model D. There are no interactions between the extracted data. Furthermore, diagram 609 shows a special case of a digital thread where data is loaded to and extracted from only a single model A. For example, as discussed in the context of FIG. 7 next, input splice functions of the model A shown in 609 may be executed to update the model, and output splice functions of model A shown in 609 may be executed to produce digital artifacts for sharing. For these special simple threads, the IDEP may provide a GUI-based interface to the user to connect the models and execute the digital threads. For complex threads such as 606, a code-based interface may be necessary.

Model Splicing for Digital Threading and Digital Twin Generation

As disclosed herein, model splicing encapsulates and compartmentalizes digital engineering (DE) model data and model data manipulation and access functionalities. As such, model splices provide access to selective model data within a DE model file without exposing the entire DE model file, with access control to the encapsulated model data based on user access permissions. Model splicing also provides the DE model with a common, externally-accessible Application Programming Interface (API) for the programmatic execution of DE models. Model splices thus generated may be shared, executed, revised, or further spliced independently of the native DE tool and development platform used to generate the input digital model. The standardization of DE model data and the generalization of API interfaces and functions allow the access of DE model type files outside of their native software environments, and enable the linking of different DE model type files that may not previously be interoperable. Model splicing further enables the scripting and codification of DE operations encompassing disparate DE tools into a corpus of normative program code, facilitating the generation and training of artificial intelligence (AI) and machine learning (ML) models for the purpose of manipulating DE models through various DE tools across different stages of a DE process, DE workflow, or a DE life cycle.

Digital threads are created through user-directed and/or autonomous linking of model splices. A digital thread is intended to connect two or more DE models for traceability across the systems engineering life cycle, and collaboration and sharing among individuals performing DE tasks. In a digital thread, appropriate outputs from a preceding digital model are provided as inputs to a subsequent digital model, allowing for information flow. That is, a digital thread may be viewed as a communication framework or data-driven architecture that connects traditionally siloed elements to enable the flow of information between digital models. The extensibility of model splicing over many different types of DE models and DE tools enables the scaling and generalization of digital threads to represent each and every stage of the DE life cycle.

A digital twin (DTw) is a real-time virtual replica of a physical object or system, with bi-directional information flow between the virtual and physical domains, allowing for monitoring, analysis, and optimization. Model splicing allows for making individual DE model files into executable splices that can be autonomously and securely linked, thus enabling the management of a large number of DE models as a unified digital thread. Such a capability extends to link previously non-interoperable DE models to create digital threads, receive external performance and sensor data streams (e.g., data that is aggregated from DE models or linked from physical sensor data), calibrate digital twins with data streams from physical sensors outside of native DTw environments, and receive expert feedback that provides opportunity to refine simulations and model parameters.

Unlike a DTw, a virtual replica, or simulation, is a mathematical model that imitates real-world behavior to predict outcomes and test strategies. Digital twins use real-time data and have bidirectional communication, while simulations focus on analyzing scenarios and predicting results. In other words, a DTw reflects the state of a physical system in time and space. A simulation is a set of operations done on digital models that reflects the potential future states or outcomes that the digital models can progress to in the future. A simulation model is a DE model within the context of the IDEP as disclosed herein.

When testing different designs, such as variations in wing length or chord dimensions, multiple DTws (sometimes numbering in 100s to 1,000s) may be created, as a bridge between design specifications and real-world implementations of a system, allowing for seamless updates and tracking of variations through vast numbers of variables, as detailed in the context of FIG. 1. As an example, if three variations of a system are made, each one would have its own DTw with specific measurements. These DTws may be accessed and updated via API function scripts, which allow for easy input of new measurements from the physical parts during the manufacturing process. By autonomous linking with appropriate data, a DTw may be updated to reflect the actual measurements of the parts, maintaining traceability and ensuring accurate data representation through hundreds or thousands of models.

Exemplary Model Splicing Setup

FIG. 7 is a schematic showing an exemplary model splicing setup, according to some embodiments of the present invention. Specifically, FIG. 7 is a schematic showing an embedded CAD model splicing example.

In the present disclosure, a "model splice", "model wrapper", or "model graft" of a given DE model file comprises locators to or copies of (1) DE model data or digital artifacts extracted or derived from the DE model file, including model metadata, and (2) splice functions (e.g., API function scripts) that can be applied to the DE model data. A model splice may take on the form of a digital file or a group of digital files. A locator refers to links, addresses, pointers, indexes, access keys, Uniform Resource Locators (URL) or similar references to the aforementioned DE digital artifacts and splice functions, which themselves may be stored in access-controlled databases, cloud-based storage buckets, or other types of secure storage environments. The splice functions provide unified and standardized input and output API or SDK endpoints for accessing and manipulating the DE model data. The DE model data are model-type-specific, and a model splice is associated with model-type-specific input and output schemas. One or more different model splices may be generated from the same input DE model file, based on the particular user application under consideration, and depending on data access restrictions. In some contexts, the shorter terms "splice", "wrapper", and/or "graft" are used to refer to spliced, wrapped, and/or grafted models.

Model splicing is the process of generating a model splice from a DE model file. Correspondingly, model splicers are program codes or uncompiled scripts that perform model splicing of DE models. A DE model splicer for a given DE model type, when applied to a specific DE model file of the DE model type, retrieves, extracts, and/or derives DE model data associated with the DE model file, generates and/or encapsulates splice functions, and instantiates API or SDK endpoints to the DE model according to input/output schemas. In some embodiments, a model splicer comprises a collection of API function scripts that can be used as templates to generate DE model splices. "Model splicer generation" refers to the process of setting up a model splicer, including establishing an all-encompassing framework or template, from which individual model splices may be deduced.

Thus, a DE model type-specific model splicer extracts or derives model data from a DE model file and/or stores such model data in a model type-specific data structure. A DE model splicer further generates or enumerates splice functions that may call upon native DE tools and API functions for application on DE model data. A DE model splice for a given user application contains or wraps DE model data and splice functions that are specific to the user application, allowing only access to and enabling modifications of limited portions of the original DE model file for collaboration and sharing with stakeholders of the given user application.

Additionally, a document splicer is a particular type of DE model splicer, specific to document models. A "document" is an electronic file that provides information as an official record. Documents include human-readable files that can be read without specialized software, as well as machine-readable documents that can be viewed and manipulated by a human with the help of specialized software such as word processor and/or web services. Thus, a document may contain natural language-based text and/or graphics that are directly readable by a human without the need of additional machine compilation, rendering, visualization, or interpretation. A "document splice", "document model splice" or "document wrapper" for a given user application can be generated by wrapping document data and splice functions (e.g., API function scripts) that are specific to the user application, thus revealing text at the component or part (e.g., title, table of contents, chapter, section, paragraph) level via API or SDK endpoints, and allowing access to and enabling modifications of portions of an original document or document template for collaboration and sharing with stakeholders of the given user application, while minimizing manual referencing and human errors.

In the CAD model splicing example shown in FIG. 7, a CAD model file diesel-engine.prt 704 proceeds through a model splicing process 710 that comprises a data extraction step 720 and a splice function generation step 730. This input DE model 704 is in a file format (.prt) native to certain DE tools. Data extraction may be performed via a DE model crawling agent implemented as model crawling scripts within a model splicer to crawl through the input DE model file and to distill model data with metadata 722. Metadata are data that can be viewed without opening the entire input DE model file, and may include entries such as file name, file size, file version, last modified date and time, and potential user input options as identified from a user input 706. Model data are extracted and/or derived from the input DE model, and may include but are not limited to, parts (e.g., propeller, engine cylinder, engine cap, engine radiator, etc.), solids, surfaces, polygon representation, and materials, etc. When a model splicer crawls through the model file, it determines how model data may be organized and accessed, as fundamentally defined by a DE tool 702 that is being used in splicing the DE model, and establishes a model data schema. This data schema describes the structure and format of the model data, some of which are translated into, or used to create input/output API endpoints with corresponding input/output schemas. In some embodiments, model data with metadata 722 may be stored in an access-restricted storage 726, such as the "customer buckets" 312 within customer environment 310 in FIG. 3, so that model splices such as 742, 744, and 746 may be generated on-demand once an input DE model 704 has been crawled through.

The model splicer further generates splice functions (e.g., API function scripts) 732 from native APIs 702 associated with the input CAD model. In the present disclosure, "native" and "primal" refer to existing DE model files, functions, and API libraries associated with specific third-party DE tools, including both proprietary and open-source ones. Native API 702 may be provided by a proprietary or open-source DE tool. For example, the model splicer may generate API function scripts that call upon native APIs of native DE tools to perform functions such as: HideParts (parts_list), Generate2DView( ) etc. These model-type-specific splice functions may be stored in a splice function database 736, again for on-demand generation of individual model splices. A catalog or specification of splice functions provided by different model splices supported by the IDEP, and orchestration scripts that link multiple model splices, constitutes a Platform API. This platform API is a common, universal, and externally-accessible platform interface that masks native API 702 of any native DE tool integrated into the IDEP, thus enabling engineers from different disciplines to interact with unfamiliar DE tools, and previously non-interoperable DE tools to interoperate freely.

Next, based on user input or desired user application 706, one or more model splices or wrappers 742, 744, and 746 may be generated, wrapping a subset or all of the model data needed for the user application with splice functions or API function scripts that can be applied to the original input model and/or wrapped model data to perform desired operations and complete user-requested tasks. In various embodiments, a model splice may take on the form of a digital file or a group of digital files, and a model splice may comprise locators to or copies of the aforementioned DE digital artifacts and splice functions, in any combination or permutation. Any number of model splices/wrappers may be generated by combining a selective portion of the model data such as 722 and the API function scripts such as 732. As the API function scripts provide unified and standardized input and output API endpoints for accessing and manipulating the DE model and DE model data, such API handles or endpoints may be used to execute the model splice and establish links with other model splices without directly calling upon native APIs. Such API endpoints may be formatted according to an input/output scheme tailored to the DE model file and/or DE tool being used, and may be accessed by orchestration scripts or platform applications that act on multiple DE models.

In some embodiments, when executed, an API function script inputs into or outputs from a DE model or DE model splice. "Input" splice functions or "input nodes" such as 733 are model modification scripts that allow updates or modifications to an input DE model. For example, a model update may comprise changes made via an input splice function to model parameters or configurations. "Output" splice functions or "output nodes" 734 are data/artifact extraction scripts that allow data extraction or derivation from a DE model via its model splice. An API function script may invoke native API function calls of native DE tools. An artifact is an execution result from an output API function script within a model splice. Multiple artifacts may be generated from a single DE model or DE model splice. Artifacts may be stored in access-restricted cloud storage 726, or other similar access-restricted customer buckets.

One advantage of model splicing is its inherent minimal privileged access control capabilities for zero-trust implementations of the IDEP as disclosed herein. In various deployment scenarios discussed with reference to FIG. 4, and within the context of IDEP implementation architecture discussed with reference to FIG. 3, original DE input model 704 and model data storage 726 may be located within customer buckets 312 in customer environment 310 of FIG. 3. Splice functions 732 stored in database 736 call upon native APIs 702. The execution or invocation of splice functions 732 may rely on job-specific authentication or authorization via proprietary licenses of DE tools (e.g., residing within customer environment 310 of FIG. 3 and/or information security clearance levels of the requesting user. Thus, model splicing unbundles monolithic access to digital model-type files as whole files and instead provides specific access to a subset of functions that allow limited, purposeful, and auditable interactions with subsets of the model-type files built from component parts or atomic units that assemble to parts.

Digital Threading of DE Models Via Model Splicing

FIG. 8 is a schematic showing digital threading of DE models via model splicing, according to some embodiments of the present invention. A digital thread is intended to connect two or more DE models for traceability across the systems engineering lifecycle, and collaboration and sharing among individuals performing DE tasks.

Linking of model splices generally refers to jointly accessing two or more DE model splices via API endpoints or splice functions. For example, data may be retrieved from one splice to update another splice (e.g., an input splice function of a first model splice calls upon an output splice function of a second model splice); data may be retrieved from both splices to generate a new output (e.g., output splice functions from both model splices are called upon); data from a third splice may be used to update both a first splice and a second splice (e.g., input splice functions from both model splices are called upon). In the present disclosure, "model linking" and "model splice linking" may be used interchangeably, as linked model splices map to correspondingly linked DE models. Similarly, linking of DE tools generally refers to jointly accessing two or more DE tools via model splices, where model splice functions that encapsulate disparate DE tool functions may interoperate and call each other, or be called upon jointly by an orchestration script to perform a DE task.

Thus, model splicing allows for making individual digital model files into model splices that can be autonomously and securely linked, enabling the management of a large number of digital models as a unified digital thread written in scripts. Within the IDEP as disclosed herein, a digital thread is a platform script that calls upon the platform API to facilitate, manage, or orchestrate a workflow through linked model splices. Model splice linking provides a communication framework or data-driven architecture that connects traditionally siloed elements to enable the flow of information between digital models via corresponding model splices. The extensibility of model splicing over many different types of digital models enables the scaling and generalization of digital threads to represent each and every stage of the DE lifecycle and to instantiate and update DTws as needed.

In the particular example shown in FIG. 8, an orchestration script 894 is written in Python code and designed to interact via API endpoints such as 892 to determine if a CAD model meets a total mass requirement. API endpoint 892 is an output splice function and part of a platform API 890. Platform API 890 comprises not only splice functions but also platform scripts or orchestration scripts such as 894 itself.

Orchestration script 894 is divided into three main steps:
1. Get Data From a CAD Model Splice: A POST request may be sent via the IDEP platform API to execute a computer-aided design (CAD) model splice 871. This model splice provides a uniform interface to modify and retrieve information about a CAD model 881. The parameters for the CAD model, such as hole diameter, notch opening, flange thickness, etc., may be sent in the request and set via an input splice function. The total mass of the CAD model may be derived from model parameters and retrieved via an output splice function. The response from the platform API includes the total mass of CAD model 881, and a Uniform Resource Identifier/Locator (URL) for the CAD model. The response may further comprise a URL for an image of the CAD model.
2. Get Data From a SysML Model Splice: Another POST request may be sent via the IDEP platform API to execute a Systems Modeling Language (SysML) model splice 872. SysML is a general-purpose modeling language used for systems engineering. Output function 892 of model splice 872 retrieves the total mass requirements for the system from a SysML model 882. The response from the platform API includes the total mass requirement for the system.
3. Align the Variables and Check If Requirement Met: The total mass from CAD model 881 is compared with the total mass requirement from SysML model 882. If the two values are equal, a message is printed indicating that the CAD model aligns with the requirement. Otherwise, a message is printed indicating that the CAD model does not align with the requirement.

In short, orchestration script 894, which may be implemented in application plane 160 of IDEP 100 shown in FIG. 1, links digital models 881 and 882 via model splice API calls. Orchestration script 894 is a scripted platform application that modifies a CAD model, retrieves the total mass of the modified CAD model, retrieves the total mass requirement from a SysML model, and compares the two values to check if the CAD model meets the requirement. In some embodiments, a platform application within IDEP 100 utilizes sets of functions to act upon more than one DE model. Model Splice Plane FIG. 9 is a schematic illustrating the linking of DE model splices in a splice plane and comparing digital threading with and without model splicing, according to some embodiments of the present invention. The bottom model plane 180 demonstrates current digital threading practices, where each small oval represents a DE model, and the linking between any two DE models, such as models 982 and 984, requires respective connections to a central platform 910, and potential additional linkages from every model to every other model. The central platform 910 comprises program code that is able to interpret and manipulate original DE models of distinct model types. For example, platform 910 under the control of a subject matter expert may prepare data from digital model 982 into formats that can be accessed by digital model 984 via digital model 984's native APIs, thus allowing modifications of digital model 982 to be propagated to digital model 984. Any feedback from digital model 984 to digital model 982 would require similar processing via platform 910 so that data from digital model 984 are converted into formats that can be accessed by digital model 982 via digital model 982's native APIs. This hub-and-spoke architecture 934 is not scalable to the sheer number (e.g., hundreds or thousands) of digital models involved within typical large-scale DE projects, as model updates and feedback are only possible through central platform 910.

In contrast, once the DE models are spliced, each original model is represented by a model splice comprising relevant model data, unified and standardized API endpoints for input/output, as shown in the upper splice plane 170. Splices within splice plane 170 may be connected through scripts (e.g., python scripts) that call upon API endpoints or API function scripts and may follow a DAG architecture, as described with reference to FIG. 1 and FIG. 6. Note that in FIG. 1, only the set of generated splices are shown within splice plane 170, while in FIG. 9, scripts that link model splices are also shown for illustrative purposes within the splice plane. Such scripts are referred to as orchestration scripts or platform scripts in this disclosure, as they orchestrate workflow through a digital thread built upon interconnected DE model splices. Further note that while splice plane 170 is shown in FIG. 1 as part of IDEP 100 for illustrative purposes, in some embodiments, splice plane 170 may be implemented behind a customer firewall and be part of an agent of the DE platform, as discussed in various deployment scenarios shown in FIG. 4. That is, individual API function scripts generated via model splicing by a DE platform agent may be tailored to call upon proprietary tools the customer has access to in its private environment. No centralized platform 910 with proprietary access to all native tools associated with all individual digital models shown in FIG. 9 is needed. Instead, orchestration scripts call upon universal API function scripts that may be implemented differently in different customer environments.

Hence, model splicing allows model splices such as model splice 972 from digital model 982 and model splice 974 from digital model 984 to access each other's data purposefully and directly, thus enabling the creation of a model-based "digital mesh" 944 via platform scripts and allowing autonomous linking without input from subject matter experts.

An added advantage of moving from the model plane 180 to the splice plane 170 is that the DE platform enables the creation of multiple splices per native model (e.g., see FIG. 7), each with different subsets of model data and API endpoints tailored to the splice's targeted use. For example, model splices may be used to generate multiple digital twins (DTws) that map a physical product or process or object design into the virtual space. Two-way data exchanges between a physical object and its digital object twin enable the testing, optimization, verification, and validation of the physical object in the virtual world, by choosing optimal digital model configuration and/or architecture combinations from parallel digital twins built upon model splices, each reacting potentially differently to the same feedback from the physical object.

Supported by model splicing, digital threading, and digital twining capabilities, the IDEP as disclosed herein connects DE models and DE tools to enable simple and secure collaboration on digital engineering data across engineering disciplines, tool vendors, networks, and model sources such as government agencies and institutions, special program offices, contractors, small businesses, Federally Funded Research and Development Centers (FFRDC), University Affiliated Research Centers (UARC), and the like. An application example 950 for the IDEP is shown on the right side of FIG. 9, illustrating how data from many different organizations may be integrated to enable cross-domain collaboration while maintaining data security, traceability, and auditability. Here DE models from multiple vendors or component constructors are spliced or wrapped by IDEP agents, and data artifacts are extracted with data protection. Turning DE models into data artifacts enables cross-domain data transfer and allows for the protection of critical information, so that model owners retain complete control over their DE models using their existing security and IT stack, continue to use DE tools that best fit their purposes, and also preserve the same modeling schema/ontology/profile that best fit their purposes. The IDEP turns DE models into micro-services to provide minimally privileged data bits that traverse to relevant stakeholders without the DE models ever leaving their home servers or being duplicated or surrogate. The IDEP also provides simple data access and digital threading options via secure web applications or secure APIs.

DAG Representation of Threaded Tasks

Model splicing provides a unified interface among DE models, allowing model and system updates to be represented by interconnected and pipelined DE tasks. FIG. 10 shows an exemplary directed acyclic graph (DAG) representation 1000 of pipelined DE tasks related to digital threads, in accordance with some embodiments of the present invention. In diagram 1000, tasks performed through a digital thread orchestration script (e.g., 894) are structured as nodes within a DAG. Actions are therefore interconnected and carried out in a pipeline linking the DE model splices with a range of corresponding parameter values. Therefore, a digital thread can be created by establishing, via interpretable DE platform scripts, the right connections between any model splices for their corresponding models at the relevant endpoints.

Referring to FIGS. 1 and 8, DAGs of threaded tasks are built from digital threads and are part of the DE platform's application plane 160. Different DAGs may target different DE actions. For example, in FIG. 1, building or updating a DTw 122 in the virtual environment 120 has its own DAG 124. Model splicing turns DE models into data structures that can be accessed via API, thus enabling the use of software development tools, from simple python scripts to complex DAGs, in order to execute DE actions. A digital thread of model splices eliminates the scalability issue of digital thread management, and speeds up the digital design process, including design updates based on external feedback.

Following the above description of the basic elements and core aspects of the IDEP as disclosed herein, the systems and methods for integrating external feedback within an interconnected digital engineering platform (IDEP) are described in detail next.

Exemplary IDEP Graphical User Interfaces

Exemplary GUI for Digital Artifacts in a Digital Thread

FIG. 11 shows a screenshot of an exemplary graphical user interface (GUI) used to operate a digital thread over the IDEP, according to one embodiment of the present invention. The GUI provides the user of the interconnected digital engineering platform (IDEP) with the ability to select and view digital artifacts that they are authorized to access, including the initial version, most recent version, and any intermediate versions. FIG. 11 shows a browser window header 1102 which includes a digital thread link for easy navigation. Below the header, a domain and security level banner 1104 displays the domain, platform software version, and security level, ensuring that users are aware of the domain they are operating in and the security protocols in place. The security level indicator 1106 displays the user's maximum security access level within the platform (e.g., "Level 1"). The security level indicator is interchangeably referred to as "info security tag", "infosec tag" or "info sec tag", herein.

The interface also includes a search bar 1112, allowing the user to carry out comprehensive cross-platform searches through the IDEP for digital engineering models, files, and documents, thus facilitating efficient retrieval of information across the platform. Adjacent to this, the user & domain field 1110 provides information on the user's domain (e.g., client name). The user and domain field may allow the user to login and to access user profile and subscription information.

The top menu of the GUI offers additional functionalities. For example, the digital artifact name field 1120 displays the digital model or document's name, and may include its version. In addition, the digital thread artifact field 1126 displays the digital artifact name. The digital artifact security level indicator 1122 displays the security level (e.g., "Level 1") of the digital artifact being accessed. In one embodiment, using an expandable security level menu adjacent to the digital artifact security level indicator 1122, the user may select the digital artifact's target security access level "view", thus filtering only the parts of the digital artifact accessible through a given security level. In other embodiments, the user may also use the digital artifact security level indicator 1122 to down-select the security level while sharing the digital artifact, thus sharing portions of the digital artifact that correspond to the specified security level. Only security access levels below the user's security level (e.g., "Level 1" in FIG. 11) would be available for the user to view and share. The user interface buttons 1124 include options to copy the digital artifact link, open a comment section, access digital artifact information, manage sharing access, and export the digital artifact.

In some embodiments, the granular dynamic info security tags (e.g., 1106 and 1122, and the like), are important elements of the digital thread and magic system and its associated GUI. The model splicer and the IDEP system enable the granular dynamic information security tags 1106 and 1122. In some embodiments, the digital thread system in the IDEP uses metadata of DE models or documents to cross-reference against authorizations, licenses, or regulations to update. In some embodiments, the granular dynamic information security tags 1106 and 1122 are dynamic, and are refreshed ahead of any digital thread updates to confirm the right authenticated user has the right authorized access to the digital artifacts and data to perform or view the updates.

At the center of FIG. 11, the digital artifact viewer 1140 displays the digital artifact that the user is authorized to access at the right info sec level. Lastly, on the right of FIG. 11, the version pane 1150 exhibits the version history of the digital artifact within the digital thread. In the exemplary GUI of FIG. 11, the version card 1152 shows that the user is viewing the 'Most Recent' version of a digital artifact shown in the viewer. The version card 1154 shows the option to select the 'Initial' version of the digital artifact. In some embodiments, all versions of the artifact that the user is allowed to view at their infosec level are accessible through a versions menu in the version pane 1150.

Revisions of digital artifacts are highly likely during the course of execution of a digital thread associated with complex DE tasks. The Versioning GUI illustrated in FIG. 11 presents an example of how the IDEP can provide users with the ability to track versions with the right security controls and access controls.

Exemplary GUI for Orchestration Scripts in Digital Threads

FIG. 12 shows a screenshot of another exemplary graphical user interface (GUI) used to operate a digital thread over the IDEP, according to one embodiment of the present invention. The GUI provides the user of the interconnected digital engineering platform (IDEP) with the digital thread creation capabilities described herein. FIG. 12 shows a browser window header 1202 which includes a digital thread link for easy navigation. Below the header, a domain and security level banner 1204 displays the domain, platform software version, and security level, ensuring that users are aware of the domain they are operating in and the security protocols in place. The security level indicator 1206 displays the user's maximum security access level within the platform (e.g., "Level 1").

The interface also includes a search bar 1212, allowing the user to carry out comprehensive cross-platform searches through the IDEP for digital engineering models, files, digital threads and documents, thus facilitating efficient retrieval of information across the platform. Adjacent to this, the user & domain field 1210 provides information on the user's domain (e.g., client name). The user and domain field may allow the user to login and to access user profile and subscription information.

The top menu of the GUI offers additional functionalities. For example, the digital thread name field 1220 displays the digital thread's name, and may include its version. The digital thread security level indicator 1222 displays the security level (e.g., "Level 1") of the digital thread being accessed. In one embodiment, using an expandable security level menu adjacent to the digital thread security level indicator 1222, the user may select the digital thread's target security access level "view", thus filtering only the parts of the digital thread accessible through a given security level. In other embodiments, the user may also use the digital thread security level indicator 1222 to down-select the security level while sharing the digital thread or an associated magic document for the digital thread, thus sharing portions of the digital thread that correspond to the specified security level. Only security access levels below the user's security level (e.g., "Level 1" in FIG. 12) would be available for the user to view and share. The user interface buttons 1224 include options to copy the digital thread link, open a comment section, access digital thread information, manage sharing access, and export the digital thread.

In some embodiments, the granular dynamic info security tags (e.g., 1206 and 1222, and the like) are an important element of the digital thread and magic doc system, as well as its associated GUI. The model splicer and the IDEP system enable the granular dynamic information security tags 1206 and 1222. In various embodiments, the digital thread system in the IDEP uses metadata of DE models or documents to cross-reference against authorizations, licenses, or regulations to update. In some embodiments, the granular dynamic information security tags 1206 and 1222 are dynamic, and are refreshed ahead of any digital thread updates to confirm the right authenticated user has the right authorized access to the digital artifacts and data to perform or view the updates.

As discussed above, digital threads are a set of orchestration scripts to orchestrate the selective exchange of data among documents and DE model files. Digital threads therefore link all the resources relevant to accomplishing a given DE task, including the various sections of an orchestration script, the relevant DE models, as well as relevant context information and metadata.

For a secure digital thread organization and navigation, the illustrative GUI of FIG. 12 features a digital thread outline viewer 1230 on the left of FIG. 12, providing links to the digital thread's individual sections, including code blocks that may carry out individual subtasks within the orchestration script, text blocks that may provide contextual, parametric, requirement-related, and/or certification-related information on linked DE models. Text blocks may also include text paragraphs and/or orchestration code comments and data sources. Within the digital thread outline viewer 1230, a digital thread detailed viewer 1232 shows sections of the secure digital thread along with the linked digital engineering (DE) model(s), the associated magic documents, the source IT domain, and the last update timestamp, each tagged with the appropriate information security level (e.g., "L1" or "Level 1"). In some embodiments, the information security tag on a code block indicates a restriction on executing the code block. That is, a code block may only be run by an user entity with an equal or higher information security level. In some embodiments, the information security tag may indicate a viewing privilege, so the code block is only presented and viewable by an user entity with an equal or higher information security level.

In some embodiments, if sections of a secure digital thread contain content requiring a higher security level for viewing, the user may be presented with an option to request access. Were the user to request such access, an authorized user with access at a higher security level is notified for their review. In other embodiments, if sections of a digital thread contain content requiring a higher security level for viewing, such sections will not be shown for display, nor will the user be provided with any prompt for requesting access.

At the center of FIG. 12, the section viewer 1240 displays the content of each secure digital thread section and ensures that every orchestration script code, code comment, and text block is updated based on the data of the DE models that are linked to it. The model data and associated security access may be provided through model splicing, as discussed previously. Lastly, on the right of FIG. 12, the comment pane 1250 exhibits the digital thread comments and may include functionalities for comment sharing and resolution.

Updating Digital Twins Over the IDEP

FIG. 13 is an exemplary flow chart showing a process for updating a digital twin within an IDEP based on external feedback, in accordance with some embodiments of the present invention. The process for updating the digital twin starts at step 1310.

At step 1320, external feedback related to a digital twin (DTw) of a physical product is received from a twin configuration set, where the digital twin was instantiated by executing a software-code-defined digital thread written as a script, where the script connects one or more model splices, where each given model splice includes one or more splice data items, one or more splice data structures, and at least one splice function that is configured to generate a digital artifact from a given model file in a native format, and where the twin configuration set identifies the script and one or more associated model files associated with the DTw from an IDEP library.

At step 1330, the DTw is updated based on the received external feedback, where updating the DTw includes at least one of the following steps:

At step 1340, updating the DTw according to step 1330 includes updating the software-code-defined digital thread by making one or more updates to the script through the IDEP, At step 1350, updating the DTw according to step 1330 includes updating at least one of the one or more model splices, where updating a given model splice includes updating a splice feature of the given model splice selected from the group of splice features consisting of a splice data item, a splice data structure, and a splice function, and At step 1360, updating the DTw according to step 1330 includes updating the twin configuration set, where updating a given twin configuration set identifying a given script and a set of given associated model files associated with a given DTw from the IDEP library, includes updating the given script and/or the given associated model files associated with the given DTw.

The process for integrating external feedback within an IDEP ends at step 1370.

FIG. 14 shows an exemplary flow chart for instantiating a new digital twin (DTw) within a digital engineering platform based on external feedback, in accordance with one embodiment of the present invention. At step 1402, the system receives performance data related to running a digital twin (DTw) from a twin configuration set in the virtual environment. At step 1404, the system analyzes the performance of the DTw by comparing at least one performance variable of the DTw with a required performance level.

The system then modifies the DTw configuration by carrying out one of the following actions: modifying or adding at least one parameter of a splice of a model file (step 1406), updating one or more links between two splices of two model files using their API endpoints (step 1408), or generating or updating a script involving a splice of a model file (step 1410). At step 1412, the system generates a new DTw configuration based on the modification(s) carried out in the previous step(s).

At step 1414, the system saves the new DTw configuration in the twin configuration set. Then, at step 1416, the system designates the new DTw configuration as the authoritative twin in the twin set. Finally, at step 1418, the system instantiates a new DTw based on the new DTw configuration.

FIG. 15 is an exemplary flow chart showing another process for updating a digital twin within an IDEP based on external feedback, in accordance with some embodiments of the present invention.

At step 1510, a model representation connected to a digital model file associated with a digital twin is received, where the model representation provides access to a digital artifact of the digital model file through an interconnected digital model platform (IDMP), where the IDMP is configured to interconnect the digital model file with a different digital model file through a software-code-defined digital thread, and where the digital model file and the different digital model file are from two distinct software tools or from two distinct security networks.

At step 1520, the software-code-defined digital thread is received, where the software-code-defined digital thread is written as a computer-executable script accessing the digital artifact through the model representation, and where the software-code-defined digital thread is configured to execute a scripted workflow associated with the digital twin.

At step 1530, a twin configuration of the digital twin based on the model representation and the software-code-defined digital thread is generated.

At step 1540, the twin configuration is stored in a twin configuration set of the IDMP.

At step 1550, the digital twin is instantiated in a virtual environment by executing the software-code-defined digital thread.

At step 1560, external feedback related to the digital twin is received, where the external feedback includes feedback data from a source external to the digital twin.

At step 1570, the digital twin is updated based on the external feedback to generate an updated digital twin, by updating the software-code-defined digital thread through an update to the computer-executable script, by updating the model representation through an update to the digital artifact, and by updating the twin configuration by modifying a twin configuration feature.

At step 1580, a new twin configuration is generated based on the updated digital twin.

Finally, at step 1590, the new twin configuration is stored in the twin configuration set.

FIG. 16 is an exemplary system diagram showing a process for instantiating a new digital twin based on external feedback within an IDEP, in accordance with some embodiments of the present invention. Specifically, FIG. 16 provides an exemplary schematic representation of the modules and data 1620 that may be used for updating a platform orchestration script 1652 by an interconnected digital engineering platform (IDEP) application 1680, based on received external feedback 1630 from a user 1602 such as a subject matter expert (SME), according to exemplary embodiments of the invention.

The system may include access to at least one hardware processor 1694 responsible for executing program code 1692 to implement the modules 1620 described below. The system may include access to at least one non-transitory physical storage medium 1690, accessible by the at least one hardware processor 1694, which stores the program code 1692 that is executable by the hardware processor 1694. The program code may be stored and distributed among two or more non-transitory physical storage media, and may be executed by two or more processors.

The system may include an IDEP application 1680 controlling a training module 1640 that may carry out training, fine tuning, and/or validation of an artificial intelligence (AI) module 1650. In one embodiment, the AI module 1650 may include a script-generating or script-updating machine learning (ML) model. In another embodiment, the AI module 1650 may include a splice-generation or a splice-updating AI module.

In order to train the AI module 1650, the training module 1640 may use training data 1642 including sample data pairs, where each sample data pair may include a sample external feedback and a corresponding sample model file set, and a corresponding sample updated platform orchestration script.

At run time, the user 1602 may provide external feedback 1630 through a user interface (UI) 1604. In one embodiment, the external feedback 1630 is a user prompt. More generally, the external feedback may be (1) any user action as recorded by the UI 1604. (2) an explicit user prompt. (3) DTw performance data generated through running the DTw in a virtual environment, a simulation of the DTw, or a simulation of a component of the DTw; (4) a model file update or a script update provided by a SME; (5) data from a sensor, a virtual sensor, a simulation, a PTw, a DTw, a certification file, or a requirements file; (6) a request from a software agent on the interconnected digital engineering platform (IDEP), or (7) data generated by a feedback ML model trained on an IDEP training dataset comprising sample external feedback, corresponding sample twin configuration(s), and corresponding sample twin configuration update(s).

The IDEP application 1680 may also generate or identify two model splices, Model A Splice 1660 and Model B Splice 1670, each associated with a DE model (1610, 1612) related to the external feedback 1630. The model A splice 1660 may include splice data 1662 and splice functions 1664. Similarly, the model B splice 1670 may include splice data 1672 and splice functions 1674. The model splices 1660 and 1670, their data, and their functions are accessible through splicing APIs 1666 and 1676.

The trained AI module 1650 may receive the user's external feedback 1630 and may generate an updated platform orchestration script 1652 connecting model A splice 1660 and the model B splice 1670. In addition to updating the platform orchestration script 1652, the update required by the external feedback may also involve updating one of the two DE model files 1610 and 1612 through their respective model splices 1660 and 1670.

The IDEP application 1680 may store the updated platform orchestration script 1652 as a software-code-defined digital thread. In one embodiment, the updated platform orchestration script 1652 may be used to instantiate an updated DTw (not shown in FIG. 16).

Authoritative Twin

At each stage A-H of the product life cycle shown in FIG. 1, the system may label one twin configuration as the current design reference, herein described as the "authoritative twin" or "authoritative reference". The authoritative twin represents the design configuration that best responds to the actual conditions on the ground (i.e., the ground truth).

One of the most important aspects of digital twin updates is the management of uncertainty. Data updates, whether they come from a virtual or physical environment, are not treated as "absolutely" true. External data updates are treated as external inputs with their own measure of uncertainty. Therefore, any external data update cannot be treated as absolutely true, and consequently must not overrule the model. Rather, external data updates, even from physical external environments, update the digital model, digital thread, and/or digital twin, with new data points. This is analogous to the way that observations are used in Bayesian statistics to update prior probabilities in order to generate updated posterior probabilities.

The IDEP takes into account all of the external feedback inputs, whether they are digital or physical, as well as their estimated uncertainties, in order to update any associated system parameters, variables, and prediction models. A twin configuration that was updated based on external feedback may be selected as the most accurate representation of the design and its predicted interaction with its physical environment (i.e., the authoritative twin).

One of the novel capabilities of the IDEP is that it allows the selection of the authoritative twin in multiple virtual and physical feedback loops that are running simultaneously, where the data and computation capabilities available to multiple virtual and physical feedback loops differ in their predictive powers. For example, the IDEP could be receiving feedback from the physical systems while also running a virtual environment on remote information technology (IT) such as a cloud server. However, the physical instance (e.g., PTw) running on the physical systems and the digital instance (e.g., DTw) running on the remote IT may not be equivalent, as the remote IT platform would typically have access to greater processing power and data. Thus, its predictive powers (i.e., its level of certainty) should be greater than the physical twin's. Nevertheless, the PTw is typically equipped with physical sensors, thus creating a physical feedback loop. Although physical sensors do not remove uncertainty, their data may make the PTw the authoritative twin over short prediction horizons, until the physical sensor data is fed back to the remote IT platform, updating the DTw and its predictions, which then get pushed back to the PTw over the virtual feedback loop. Since the virtual feedback loop may take time, there is a time window over which the PTw has been collecting sensory data and updating its own local predictions. Within that time window, the PTw predictions may become superlative to those of the DTw located on the remote IT platform. In this case, the IDEP allows the PTw to be temporarily designated as the authoritative twin. Hence, the physical and virtual feedback cycles continue. This example may be extended to the IDEP managing multiple simultaneous PTw and DTw instances over virtual and physical feedback loops with varying data, computation, and communication capabilities.

In some embodiments, the IDEP manages a remote DTw over a remote IT infrastructure and one or more edge DTw/PTw on the physical twin, with access to local models, data, computational power, and select real-time sensor data. A user might also install an edge instance of the IDEP nearer the PTw (e.g., at a factory) to optimize operations without the long-haul data routing penalties. Embodiments of the IDEP may therefore be configured to run on (i) a remote IT platform only, with few effective compute/store/AI limitations, (ii) edge devices only, with more limitations on computational capabilities (e.g., AI), and (iii) on a hybrid remote+edge architecture, where multiple remote or edge instances presenting varying technical capabilities (e.g., computation, speed, or feedback capabilities) may be operated simultaneously. Whether the external data is physical (e.g., sensor data) or virtual (e.g., performance data) makes no difference. The IDEP provides configurable mechanisms (e.g., policies, algorithms, voting schema, statistical processes) whereby agents (e.g., users, platform modules) may designate a new twin (physical or digital) as the authoritative reference.

Table 1 shows exemplary scenarios where the authoritative twin designation is shifted from one twin to another at each of the stages listed above, in accordance with embodiments of the present invention. During digital modeling, digital threading, modification and iteration, and design finalization (e.g., Steps A, B, C, and D), the authoritative twin shifts from one DTw configuration to another DTw configuration, in the virtual domain. Once a PTw is produced and iteratively upgraded (e.g., Steps E, F, G, H), the authoritative twin may shift between an as-designed DTw, an as-manufactured PTw, as-assembled DTws or PTws, as-operated DTws and PTws, and further new DTw designs or configurations.

A. Digital models reside within the customer environments (1702).
B. Preparatory steps for design in the digital realm (1704):
  a. Create model splicers/wrappers that link to specific sub-parts of a model and creates a digital representation
  b. For each model type file, create a JSON (or other semantic structure) file with input, output, and meta-data for each model type file
  c. Create microservice instance representing each model splice/wrapper
  d. Validate and test each microservice for accuracy, efficiency, and reliability
  e. State: At the end of this step, all model splices/wrappers are ready and available for linking through applications.
C. Link threads as needed among splices (1706):
  a. Python scripts to iterate on parameters for CAD file (e.g., DAG architecture)
  b. Collect output of mesh files (few to few 1,000's variations)
  c. Validate the quality and correctness of the generated mesh files
  d. Within the platform, an expert user links API_1 (e.g., CAD) to API_2 (e.g., CFD) and so on to create digital threads

TABLE 1

Authoritative Twin Designation Examples

| Step | Authoritative Twin Shift | Example |
|---|---|---|
| A. Digital models reside within customer environments | Virtual | The digital models are created and reside within the customer environments, and no authoritative twin shifts occur at this stage. |
| B. Preparatory steps for design in digital realm | Virtual-to-Virtual | When adjusting the digital model based on simulation results, the authoritative twin shifts within the virtual domain. |
| C. Link threads as needed among splices | Virtual-to-Virtual | When iterating on parameters for CAD files and generating output variations, the authoritative twin remains within the virtual domain as adjustments are made based on requirements specifications. |
| D. Finalize 'As designed' | Virtual-to-Virtual | When making trade-off decisions between requirements and costs within the virtual model, the authoritative twin remains within the virtual domain. |
| E. Finalize 'As manufactured' | Virtual-to-Physical | When comparing the digital twin's predicted manufacturing outcomes with the actual results from the physical production process, the authoritative twin shifts from the virtual model to the physical prototype. |
| F. Finalize 'As assembled' | Physical-to-Virtual | When using data from the physical assembly process to refine the digital assembly model, the authoritative twin shifts from the physical domain to the virtual model. |
| G. Finalize 'As operated' | Can alternate between Virtual-to-Physical and Physical-to-Virtual | When comparing the digital twin's predicted performance metrics with the actual performance data from the physical system during operation, the authoritative twin shifts from the virtual model to the physical prototype and back to the virtual model as updates are made to the digital twin. |
| H. Predictive analytics/Future performance | Physical-to-Virtual | When using real-world sensor data and operational insights to update and refine the digital twin's predictive models, the authoritative twin shifts from the physical domain to the virtual model. |

FIG. 17 shows an illustrative process flow where the authoritative twin is shifted throughout the design process, in accordance with the architecture of FIG. 1 and Table 1. The following are one set of exemplary process flows that may be applied for each stage of the product life cycle. These are for illustrative purposes only and are non-limiting in scope.

e. API_2 output is the CFD model output
  f. Validate the results of the linked API outputs and ensure consistency with the expected outcomes.
  g. System compares the 1,000's of variations against requirements
  h. Refine the Python scripts based on the results of the iterations to enhance the optimization process.

i. System generates a report with the findings, including recommendations and insights for optimization D. Finalize 'As-designed' (1708):
  a. Trade-off is usually between requirements vs cost
  b. Decision can be made by human decision maker
  c. Or, an algorithm can be used (with an objective function, or fitness function)
  d. Document the final design decisions and the rationale behind them E. Finalize 'As-manufactured' (1710):
  a. Send files to manufacturing processes
  b. Collect data
    i. Part data
    ii. Machine operating history
    iii. Models of manufacturing processes
  c. Utilize physical parts measurement data as authoritative reference for the digital models of individual components
  d. Compare the 'as manufactured' data with the 'as designed' data to identify any discrepancies or deviations from the intended design and areas of improvement F. Finalize 'As-assembled' (1712):
  a. Create a digital version of the assembly, meeting requirements specifications
  b. Test digital assembly configurations are feasible given 'as manufactured' part dimensions and tolerances
  c. Develop assembly instructions as needed
  d. Send parts for assembly
  e. Utilize physical assembly and component parts measurement data as authoritative reference for digital assembly
  f. Validate the assembly process with the actual physical assembly to ensure the digital assembly accurately represents the real-world assembly G. Finalize 'As-operated' (1714):
  a. Create multiple digital twins as needed for specific performance metrics of the physical assembly or component parts
  b. Conduct simulations as needed, using physical sensor data to calibrate during operations
  c. Continuously update and refine the digital twins based on real-time operational data
  d. Monitor the performance of the physical assembly or component parts during operation and update the digital twin models accordingly H. Predictive analytics/Future performance (1716):
  a. Create multiple digital twins as needed for specific performance metrics of physical assembly or component parts
  b. Conduct simulations as needed, with various control policies to assess future performance
  c. Predict impact on performance objectives and costs
  d. Decide which specific control policy (e.g., steering range, throttle sensitivity) to implement
  e. Continuously update and refine the digital twin models based on the latest sensor data, control policies, and performance metrics to enhance predictive accuracy Qualitative Feedback Examples The following qualitative examples provide illustrative quantities, parameters, models, and process steps showing the integration of external feedback with the IDEP.

Example 1: External Feedback into Autonomous Digital Thread for Manufacturing Facility 1. Acquire and store digital models of various components and systems within a manufacturing facility, including machinery, assembly lines, and products. For example, store CAD models of a robotic arm that assembles engines, the conveyor belt that moves car bodies, and 3D scanned models of the engine parts.

2. Utilize model splicing to identify and expose key data and parameters within the model files, and to provide the necessary interface to make the spliced representations of the underlying model files executable on the IDEP.

3. Generate digital threads by autonomously linking the relevant digital models/splices and enabling the interactions and data flow between them, creating a complete and integrated architecture (e.g., a scripted DAG architecture) of the design and manufacturing processes.

4. Collect real-time data streams from various physical sensors within the facility, such as machine performance, environmental conditions, and product quality measurements. Examples include a sensor tracking the milling machine's performance, an environmental sensor monitoring factory temperature, and a product quality measurement sensor checking widget dimensions.

5. Generate processed sensory data on an ad-hoc basis by leveraging the collected sensor data and applying advanced analytics to identify trends, correlations, and anomalies that may not be apparent from the raw data alone. An example of processed sensory data include a software calculation predicting tool wear on the milling machine based on the real-time physical data gathered.

6. Create links between the physical sensor data, the processed sensory data and the digital threads, enabling the continuous refinement of the simulations by incorporating real-time data and expert feedback. For example, if a trend in increased tool wear is identified from the virtual sensor, it can feed back into the digital model of the milling machine, refining the simulation for future operations.

7. Utilize the refined simulations to optimize manufacturing processes, improve product quality, and identify potential issues before they escalate, ultimately increasing efficiency and reducing costs.

Example 2: Generalized Process Steps for External Feedback into Autonomously Generated Digital Threads 1. Acquire and store digital models of various components and systems within the target domain, taking into account their characteristics, functionalities, and interdependencies.

2. Utilize a model splicer to identify and evaluate potential relationships between these digital models based on their inherent properties and the context of the specific application.

3. Generate digital threads by autonomously linking the relevant digital models and simulating the interactions and data flow between them, creating a comprehensive understanding of the target domain's operations.

4. Collect real-time data streams from various sources related to the target domain, capturing relevant information about the performance, conditions, and quality measurements of the system.

5. Generate processed sensory data on an ad-hoc basis by leveraging the collected real-time sensor data and expert feedback, and apply advanced analytics to identify trends, correlations, and anomalies within the design configuration.

6. Employ configurable mechanisms for decision making (e.g., policies, algorithms, voting schema, and/or statistical processes) to determine whether a modification of the design configuration is required, and whether the modified design configuration best represents the ground truth (see "Authoritative Twin" section below).

7. Utilize modified design configuration in further refined simulations using new sensory data (step 4) to optimize processes, improve resource allocation, and identify potential issues within the updated design configuration The use of real time data streams and external feedback can be integrated to all phases of a product's life cycle (e.g., design, manufacturing, assembly, and operation), thus enabling the continuous refinement of the design configuration, improving the accuracy of the simulations, enhancing overall efficiency, and reducing operational costs.

Example 3: Car Manufacturing

Model Files:

A car has at least 5 different systems where digital engineering tools and sensors can be seen in practice. The following are illustrative examples of models and other digital artifacts and files that may be used for each system:
1. Chassis and Suspension System
   CAD models: Chassis components, suspension arms, shock absorbers, springs, anti-roll bars, etc
   Other files: Material properties, geometry data, etc.
2. Powertrain and Drivetrain System
   CAD models: Engine components, transmission, differential, axles, etc.
   Electrical system: Wiring diagrams, ECU (Engine Control Unit) configuration files
   Other files: Engine performance data, gear ratios, etc.
3. Aerodynamics and Bodywork System
   CAD models: Body panels, wings, diffusers, etc.
   Simulation models: Computational Fluid Dynamics (CFD),
   Other data: Prior CFD results, wind tunnel data, etc.
4. Electronics and Control System
   CAD models: Electronic components, PCB (Printed Circuit Board) layouts, etc.
   Electrical system design tools: Wiring diagrams, control algorithms, sensor and actuator configurations
   Other files: Software source code, firmware updates, calibration data, etc.
5. Braking System
   CAD models: Brake calipers, brake discs, brake pads, brake lines, etc.
   Other files: Material properties, performance data, etc.
   In some embodiments, it is possible to create a generalized process using artificial intelligence (AI) for generating the input/output and API scripts for a library of digital engineering model type files, as described below.
Physical Sensors and Physical Data Measured:
   Accelerometers: Acceleration (longitudinal, lateral, vertical)
   Gyroscopes: Angular rate (roll, pitch, yaw)
   Wheel speed sensors: Individual wheel speeds
   Temperature sensors: Engine coolant, oil, brakes, ambient, etc.
   Pressure sensors: Oil, fuel, brake, tires, etc.
   Position sensors: Throttle, brake, steering, suspension, etc.
   Force sensors: Suspension loads, tire loads, etc.
   Airflow sensors: Mass air flow, air pressure, etc.
Processed Sensory Data:
   Processed sensory data streams are software-based calculations or estimations of certain parameters based on available data inputs. Following is an exemplary list of Processed sensory data streams:
1. Chassis and Suspension System
   Tire forces and moments: Calculated using tire models like Pacejka's Magic Formula or MF-Tyre, based on wheel speed, slip, and load.
   Vehicle roll, pitch, and yaw angles: Estimated from accelerometers and gyroscopes data.
   Suspension travel and deflection: Calculated from position sensors or estimated from force sensors and suspension geometry.
   Tire wall thickness predictions: Calculated from tire pressure, wall temperature, distance traveled and tire wear simulations.
2. Powertrain and Drivetrain System
   Engine torque and power: Estimated from throttle position, RPM, and engine maps.
   Gearbox and differential efficiency losses: Calculated from drivetrain models based on input and output torques, and gear ratios.
   Clutch engagement and disengagement: Estimated from engine RPM, vehicle speed, and gear position.
3. Aerodynamics and Bodywork System
   Aerodynamic forces and moments: Calculated using CFD simulation data or wind tunnel test results and scaled based on vehicle speed and attitude.
   Air pressure distribution on the body surface: Estimated from CFD simulation data or wind tunnel test results.
   Boundary layer thickness and separation: Estimated from CFD simulation data or using simplified aerodynamic models.
4. Electronics and Control System
   Vehicle stability and control metrics: Yaw rate response, lateral acceleration response, and other handling metrics calculated from sensor data.
   Estimated state of charge (SoC) for electric vehicles: Calculated from current and voltage measurements, temperature, and battery chemistry.
   Fault detection and diagnosis: Estimation of component health, degradation, or failure based on sensor data and performance models.
5. Braking System
   Brake force distribution: Calculated from brake pressure, vehicle weight distribution, and load transfer.
   Brake pad and disc wear: Estimated from brake usage, temperature, and material properties.
   Brake balance: Calculated from brake pressure and vehicle dynamics data.
Environment Data that May be Used in these Systems:
   1. Ambient temperature and humidity: Used for engine performance calculations, cooling system efficiency, and tire performance.
   2. Wind speed and direction: Used for aerodynamic drag and lift calculations and vehicle stability assessment.
   3. Road surface condition and friction: Used for tire grip estimation, vehicle handling, and braking performance calculations.
   4. Track layout and elevation profile: Used for vehicle dynamics simulation, control system optimization, and energy management strategies.
   External data that define the environment may be provided by a database, or by analysis of data streams, and not necessarily by a physical sensor. Other examples of such environment data include: Weather forecast, Wind forecast, Sun's trajectory over a location and incident radiation, and Traffic data in a transport network.

Example 4: Generating a New Digital Twin (DTw) Target Configuration Based on Received External Data 1. Create digital models and link them over the IDEP: Develop a set of digital models that represent the design and characteristics of a desired physical object or system.
2. Build physical twin: Manufacture a physical object or system that closely matches the digital design and parameters.
3. Receive external data into the IDEP: Collect data from the physical object or system built in step 2, including sensor readings and external feedback using agent configurable mechanisms (e.g., policies, algorithms, voting schema, and/or statistical processes) or using APIs, to be used for comparison with the digital models.
4. Define model and simulation parameters: Set up boundary conditions, initial conditions, and other relevant parameters based on the physical system's operational physics.
5. Run simulations: Execute digital simulations of the system using the defined model parameters.
6. Receive simulation data into the IDEP and compare simulation and physical data at a set time point: Analyze the physical system's state and the simulated digital model's state at a specific time, using data from both the digital model and synthesized data from the physical sensors.
7. Evaluate and compare data on the IDEP: Assess the differences between the physical and digital data, incorporating expert feedback and determining the ground truth, either from the physical sensor data or expert-calculated values.
8. Update digital twin configuration in the IDEP: Utilize the comparison data obtained from step 7 to refine and improve the digital twin by manipulating or updating model files through their model splices, creating a new digital twin target configuration that accurately represents the physical system.

Design modifications may involve parameter changes or uncertainty reductions (e.g., wider design tolerances or broader operational scopes or larger process windows) within the same model splices if there are no net changes in the overall geometry or the parts assemblies of an object. In some instances, design modifications may include removal (in which case some splices for the removed parts are removed) or inclusion of new splices (in which case some new splices may be added).

For example, external sensory data from the physical environment may be combined with simulation performance data to revise a DTw instance. In a race track, for instance, wind speeds at different parts of the race track can greatly affect a car's performance in a race. If real-time sensor data from wind speed sensors located on the race track shows varying wind speeds and directions, these would need to be incorporated into the car's digital twin. Wind speed sensor data could require adjusting the aerodynamic parameters in the virtual environment and in simulations, leading to adjustments in the car's digital model (e.g., angle of rear wing), to optimize for these detected wind conditions. The updated digital twin is then used to simulate race conditions and make decisions about the race car.

Example 5: Updating a DTw Using PTw External Feedback

FIG. 18 shows illustrative twin management steps carried out over the IDEP for an 'as-operated' small propeller airplane, in accordance with embodiments of the present invention. Specifically, FIG. 18 provides an illustrative application of the digital engineering platform for the twin management of an 'as-operated' small propeller airplane, where the air speed, angle of attack, propeller speed and engine temperature are measured in the PTw, in addition to external wind pattern and cloud cover as environmental datastreams.

In FIG. 18, the twin management steps are both listed in the flowchart and numbered in the adjacent simplified IDEP architecture representation. The are described as follows:
1. Collection of Physical Twin (PTw) Data (1882): Acquire data related to airspeed, angle of attack, propeller speed, and engine temperature from the airplane's physical system 1802. Include data about environmental factors such as wind patterns and cloud cover 1802.
2. Cross-Verification (1884): In the analysis plane 1850, a comparison engine 1852 may apply a set of configurable mechanisms provided by a digital engineering platform 1800 to compare and validate the collected PTw data 1802 against corresponding Digital Twin (DTw) simulations 1804. These mechanisms include policies, algorithms, voting schema or statistical processes. The corresponding policies or algorithms are themselves linked through model splices in the splice plane 1870 to more elaborate performance manuals or validation requirement documents in the model plane 1880. Illustrative examples for cross-verification include:
   a. Policies: Use engine performance calibration charts to compare and normalize the PTw data for engine temperature and propeller speed against the DTw simulations.
   b. Algorithms: Compute lift and drag coefficients from the PTw data and compare these with corresponding coefficients from the DTw simulations.
   c. Voting Schemas: Assign weights to the outputs of configurable mechanisms and human expert opinions, casting votes for the accuracy of either PTw or DTw data for each parameter. The data source with the majority vote is deemed authoritative for that parameter.
   d. Statistical Processes: Apply statistical methods to evaluate the consistency and reliability of PTw data as compared to DTw data, employing techniques such as standard deviation analysis or error bounds estimation.
3. Determination of Authoritative Twin (1886): Evaluate the results of the cross-verification. If PTw data is deemed more accurate, establish the PTw as the authoritative twin reference for the given parameters or for the overall design. An authoritative twin indicator for each design parameter, or for the overall twin configuration, may be updated in the twin configuration set 1856.
4. Revision of parameters for select DTw and deprioritization of out-of-spec DTw (1888): Based on PTw findings, specific DTw parameters are adjusted, and out-of-spec DTws are deprioritized in the twin configuration set 1856. These changes are communicated to the application plane 1860 using scripts, potentially generated by AI algorithms trained on prior script examples and expert feedback (e.g., 1814), and implemented across relevant model splices in the splice plane 1870.

a. Parameter Modification and Deprioritization: Identify deviating parameters in selected DTws relative to PTw data and make necessary adjustments. Concurrently, identify and deprioritize any DTws now considered out of spec.

b. Communication of Revised Parameters: Transmit the revised parameters and information regarding deprioritized DTws from the analysis plane 1850 to the application plane 1860. These revisions are communicated as scripts that lead to further revision of orchestration scripts in the application plane 1860 connecting model splices associated with the DTw in the splice plane 1870.

5. Linking and adjustment of Model Splices (1890): The scripts in the application plane 1860 are revised, either by a human expert user (e.g., 1814), or using AI algorithms 1854, to make revisions to the links between model splices and associated parameters in these links. Revisions to model splice links and design parameters are carried out through the execution of application plane 1860 scripts that carry out DAG 1824 workflows. The DAG 1824 workflows may modify DE model files located in the model plane 1880 through model splices of the splice plane 1870. Examples include:

a. Structural Model Splices: Scripts tweak parameters, such as wing flex data, in the airplane's structural model splice (i.e., splices of structural DE models) based on the PTw's angle of attack data.

b. Lift-Drag Coefficient Simulation Model Splices: Scripts refine the lift and drag coefficients in the lift-drag simulation model splice, ensuring the DTw accurately reflects the PTw's aerodynamics. The coefficients are based on the PTw's airspeed and angle of attack data.

c. Engine Performance Model Splices: Scripts modify parameters like engine temperature and propeller speed in the engine performance model splice based on PTw data, thereby enhancing the DTw's accuracy in representing the PTw's engine performance.

6. Use of new instances of DTw in simulations (1892): Through these steps, the process ensures DTws remain aligned with PTw data, increasing their relevance and accuracy for subsequent simulations and operations. With the latest PTw authoritative twin data, new instances of DTw are created and used in simulations. These simulations are instrumental in estimating the airplane's range, determining the distance to the destination, and suggesting alternate routes to navigate potential weather-related challenges. This step assists in enhancing the overall operation and efficiency of the airplane.

In some cases, an AI algorithm (1854) is utilized to learn from past decisions and digital threads. The AI algorithm observes the progress of the virtual feedback loop (1804) and can automatically rewrite the script code (1860) linking specific splices (1870) with data updates (1802 and 1804). The AI can rewrite the code linking splices with data updates automatically, creating updated orchestration scripts in the application plane 1800, updated twin configurations in the twin configuration set, and updated digital twins.

Example 6: Evaluating CAD Model Files

In various embodiments, the methods and systems disclosed herein include an improved method for efficiently generating, revising, and evaluating CAD models within a simulation environment. FIGS. 19-22 show how an illustrative example of evaluating CAD models within a simulation environment can be enhanced through the IDEP, according to examples disclosed herein. FIG. 19 shows an illustrative example of evaluating CAD models within a simulation environment following a conventional method. The conventional method involves a CAD model SME (1904) utilizing custom CAD software to produce multiple versions of the CAD model (1902). Subsequently, these iterations are processed through specific scripts (1906) before being introduced into the simulation environment (1908).

This simulation environment encompasses three crucial DE tools: a mesher (1910), a CFD solver (19), and an output visualization tool (1914), with additional customized scripts (1920-1924) acting as interfaces between the different tools, such as the CFD tool controlling the CFD model 1912, and the simulation environments. Upon finishing the simulations, a comprehensive report (1916) containing simulation outcomes and results is generated. This report is then reviewed by a separate CFD SME (1918) to evaluate the optimizations. Necessary feedback and modifications to the model parameters are relayed to the CAD model SME (1904), who manually revises the models in a similar systematic manner.

In contrast, the methods and systems disclosed herein offer a more efficient procedure. FIG. 20 shows the example of evaluating CAD models within a simulation environment as shown in FIG. 19, enhanced using an IDEP in accordance with the examples disclosed herein. Initially, the digital engineering platform (2000) splices the given CAD model (2002). These splices may be used to create multiple CAD model variants within the application plane (see FIG. 1), which are then passed to subsequent scripts (2006) in the simulation environment. Additional scripts (2020-2024) act as interfaces between the different tools, the simulation environment, and the IDEP. The CFD model (2012) can also be spliced, and the resulting data is directed to an analysis module (2030) within the analysis plane (see FIG. 1) for the CFD SME (2018) to make decisions on the authoritative reference design (e.g., authoritative twin) or suggest revisions to the CAD model (2002) parameters. In some embodiments, the CFD SME (2018) may be assisted by AI tools (2032) for various operations such as the selection of an authoritative reference design (e.g., authoritative twin).

FIG. 21 shows the example of evaluating CAD models within a simulation environment as shown in FIG. 19, further enhanced through orchestrated digital threads over an IDEP, in accordance with the examples disclosed herein. In the alternative embodiment of FIG. 21, the CAD model (2102) is input to the IDEP (2130) through a platform API (2114), where a series of tools are enabled, including the mesher, the CFD analysis tool, the visualization tool, a Finite Element Analysis (FEA) tool, and an overall cost model. Various corresponding models (2104-2112) may be generated from the CAD model (2102) using these tools. Each of the generated models are spliced in the splicing plane (see FIG. 1) of the IDEP (2130). Splicing provides each of the generated models with a platform API (2114-2124) enabling it to be accessed through the IDEP in order to be connected with other models, to be updated, to be executed, etc. Additionally, the application plane (see FIG. 1) of the IDEP (2130) links the model splices together into a digital thread through engineering orchestration scripts (2136), where multiple digital threads (2132) can be generated, one for each iteration of the CAD model (2102). As discussed in the context of FIG. 10, the orchestration scripts may therefore be structured as Directed Acyclic Graphs (DAGs), allowing model updates to be interconnected and carried out as pipelined DAG tasks linking the splices with a range of corresponding parameter values.

The use of model splicing and orchestration scripts facilitates adaptability and flexibility in the CAD model analysis and revision processes. In addition, the methods described herein enable a more scalable and comprehensive workflow for analyzing and refining CAD models across various tools.

FIG. 22 shows the example of evaluating CAD models within a simulation environment as shown in FIG. 19, further enhanced through AI-enabled processes over an IDEP, in accordance with the examples disclosed herein. In various embodiments represented by FIG. 22, input CAD model variants, modeling and simulation parameters, simulation results, and SME decisions serve as training data for AI models (2202-2214), automating aspects of data review for future simulations.

AI-Assisted Application of DE Tools

FIG. 23 shows an example schematic of digital engineering tools applied to requirements files and design files, in accordance with some embodiments of the present invention.

In a first sequence of steps, a user 2304 uploads 2351 an MBSE file onto a digital engineering platform, which receives 2353 the MBSE file. The platform then extracts 2355 requirements (e.g., weight) from the MBSE file and transmits 2357 data based on those requirements to an MBSE tool, which is part of a set of digital engineering tools 2331. After the MBSE tool receives 2359 the data, it updates 2361 data (e.g., weight) in the MBSE file and exports 2363 the updated MBSE file back to the digital engineering platform, which receives 2365 the updated MBSE file.

In a second sequence of steps that may be in parallel or in series with the first sequence of steps, a user 2304 uploads 2371 a CAD file onto the digital engineering platform, which receives 2373 the CAD file. The platform then calculates 2375 properties (e.g., mass) from the CAD file and transmits 2377 data to a CAD tool, which is part of the set of digital engineering tools 2331. After the CAD tool receives 2379 the data, it highlights 2381 issues in the CAD file (which may include updating the CAD file), and exports 2383 the updated CAD file back to the digital engineering platform, which receives 2365 the updated CAD file.

The digital engineering platform now holds both an updated MBSE file from the first sequence and an updated CAD file from the second sequence.

Example 7: AI-Assisted Scalable Model Splicers

An Artificial Intelligence (AI)-assisted approach to model splicing for linking and sharing digital engineering model files, for example model-based system engineering (MBSE) files, may utilize a combination of machine learning (ML) techniques to analyze and extract relevant information, suggest appropriate functions and parameters, create scripts to control digital engineering tools, and suggest the optimal sequence of scripts for creating or modifying the digital engineering model file. This allows for dynamic changes to the file and the option to incorporate user inputs to create a variant of the model file. The machine learning engine may be trained on a dataset of user inputs and example model splicer functions or scripts, allowing for greater customization and flexibility. This approach may be further enhanced by the use of fine-tuned language models, which are better suited to understand the specific language and context of the model files. With the ability to continually improve performance over time, this AI-assisted approach allows for efficient and effective manipulation of digital engineering model files.

FIG. 23 shows an illustrative process for AI-assisted scalable creation of model splicers using external feedback, in accordance with the examples disclosed herein. As described earlier with reference to FIG. 2, an interconnected DE and certification ecosystem may include a user device 2306A, API 2306B, or other similar human-to-machine, or machine-to-machine communication interfaces operated by a user 2304. The ecosystem may further comprise a computing and control system 2308 (or a "computing system 2308") connected to and/or including a data storage unit 2318, an artificial intelligence (AI) engine 2320, and an application and service layer 2322. In some implementations, the data from multiple uses of the ecosystem (or a portion of said data) can be aggregated to develop a training dataset. For example, usage records 2317 collected via computing system 2308 may be de-identified or anonymized, before being added to the training set. As described earlier with reference to FIG. 2, a typical workflow may interact with various DE tools 2331 and information from a repository of common V&V products 2341.

The specific example of FIG. 23 outlines the following implementation process for AI-assisted splicing of MBSE files: uploading an MBSE file 2340 by the user 2304 or a software agent (e.g., an ML model of the IDEP or a program running on the user device 2306A), receiving the MBSE file 2350 at the IDEP, analyzing the MBSE file to extract relevant information 2352, suggesting appropriate functions and parameters 2354, creating model splicer scripts and orchestration scripts 2356 to control digital engineering tools, creating or modifying the MBSE file 2370 within the DE tools 2331, and allowing for dynamic changes to the file 2362 through script and splice functions.

Additionally, the process may include an alternative option for incorporating user inputs (e.g., text inputs) 2344 to create variant(s) of the MBSE file(s) and output at least one model splice as a sandbox model 2346.

More specifically, the embodiment shown in FIG. 23 uses AI at various stages of the process:

1. User uploads 23 file(s) to the computing system.
2. Machine learning engine analyzes 2352 the MBSE file(s) to extract relevant information.
3. AI algorithm (1) suggests 2354 appropriate functions and parameters for the MBSE file(s).
4. AI algorithm (2) creates 2356 one or more suggested scripts to control one or more digital engineering tools in order to create or modify the MBSE file(s).
5. AI algorithm (3) suggests 2358 the sequence of the created scripts to be executed.
6. As an alternative to (or in addition to) uploading MBSE file(s), user inputs 2344 can be incorporated to create variants 2360 or versions of the MBSE file(s).
7. System commands the appropriate DE tool(s) 2331 to create or modify 2370 the MBSE file(s).
8. Machine learning engine creates 2362 functions that allow dynamic changes to the MBSE file(s).
9. System outputs 2346 a model splice/wrapper with scripts allowing a sandbox for a model.

External feedback 2342 (e.g., from a subject matter expert) can occur in the locations of the process identified by a circled X ("⊗") symbol. For example, when AI algorithm (1) suggests 2354 API functions and parameters, an external expert user can provide feedback 2342 to accept the parameter suggestions or to make revisions. In another example, when AI algorithm (2) suggests 2356 scripts to run DE tools, an external expert user 2342 can accept the scripts or suggest revisions needed. In a third example, when AI algorithm (3) suggests 2358 the selection and linking of scripts in a sequence, the external expert user can provide feedback 2342 to accept the proposed sequence or make revisions.

The aforementioned AI-assisted functions may be created in a machine learning engine by utilizing a combination of supervised and unsupervised learning techniques. Once the model is trained, it can be applied to the MBSE file(s) to suggest appropriate functions and parameters, create model splicers to control the digital engineering tool, and suggest the sequence of scripts for optimal results. Additionally, the machine learning engine can be trained on new data, improving its performance over time.

The use of fine-tuned language models provides a specific implementation example for the AI models described in FIG. 23. In this scenario, the machine learning (ML) models configured to generate scripts may be trained on a dataset of user inputs, input MBSE files, and sample output scripts. Similarly, script suggestion ML models may be trained on sample generated scripts and associated finalized sample script sequences. The function and parameter suggestion MLs may be trained on an IDEP data set including sample user input MBSE files, including their sample functions and parameters, and corresponding sample selected/appropriate functions and parameters. The ML models may be trained to operate with specific DE-tools or on specific MBSE file types. The fine-tuned language models may then be able to correlate the specific language and context of the MBSE files, making them better suited to suggest appropriate functions and parameters, create scripts to control the digital engineering tool, and suggest the sequence of scripts for optimal results. Additionally, as new data is added, the machine learning engine may continually improve its performance over time. This approach allows for greater customization and flexibility, as the machine learning engine can be tailored to the specific needs and requirements of the user.

Furthermore, ML modules may also be used to convert user input (e.g., text instructions) 2344 into instructions for generating a set of model splices and API endpoints. Prior to deployment, the ML module is to be trained on one or more sample user input datasets and on one or more corresponding sample lists of model splices and API endpoints to be generated. Such input and output training datasets may be assembled from a database of user input instances and corresponding output model splice and API endpoint lists provided by subject matter experts.

Furthermore, steps 2-8 listed above, represent specific steps that can be undertaken by trained machine learning (ML) modules. In some embodiments, the following is a list of exemplary (input; output) pairs for the various ML modules described in steps 2-8:

MBSE file analysis and information extraction 2352: (MBSE file; File type, data structure) (e.g., see FIGS. 7 and 8).

AI algorithm (1) 2354: (MBSE file type or data structure; Default model splices, including splicing code) (e.g., see FIGS. 7 and 8).

AI algorithm (2) 2356: (Model splice, including splice description or code; Default scripts for accessing DE tools to execute splice functions, including user inputs-output specifications and splice function code).

AI algorithm (3) 2358: (MBSE splice, user input; additional modifications of the API functions, such as addition of new ones, based on user input).

MBSE file creation and/or modification 2370: (MBSE file; New or modified MBSE file, including, for example, default splices with model data extracted from the input MBSE file and stored in the data structure constructed above).

Creating MBSE file variants 2360 from user input 2344: (Original MBSE files, user input; Modified MBSE file or splice, script combining required API functions into the splice).

Creating or modifying MBSE files dynamically 2362: (MBSE splice, user input; File modification specification, including list of required splices and modification sequence, and script instructing splices to dynamically change).

Example 8: AI-Assisted Requirements Verification

FIG. 24 shows a flow diagram for an exemplary AI-assisted requirements verification process using external feedback, according to embodiments of the present invention. In this illustrative example, a user may upload 2410 a digital model file (e.g., CAD file for an airplane seat) into the IDEP, via a GUI or an API interface. The CAD file may be in .zip format with the entire seat assembly included, and a 3-dimensional (3D) view of the design may be displayed via the GUI for the user to confirm that the correct file has been uploaded. The GUI may receive further user input/instructions for seat requirements verification 2420.

Next, the user may upload the requirements file 2430. Requirements describe the necessary functions and features of the system when designed, implemented, and operated. As such, requirements set constraints and goals in the design space and the objective space, trading off design characteristics or limitations such as performance, schedule, cost, and lifecycle properties. In the exemplary flow diagram of FIG. 24, the user may click on an "Upload requirements" icon to initiate the upload process, then choose an excel requirements document to upload. The IDEP may convert the excel file into CSV format.

Once processed, a list of requirements, as extracted from the requirements file, may be displayed to the user for a walk through 2440, where the user may make any corrections needed to the individual requirements. In various embodiments, the requirements may be both quantitative and qualitative. In some embodiments, the IDEP may detect potential errors and conflicts within the requirements and between the requirements and model parameters, then display an error message to the user if any potential errors or conflicts are detected. The detection process may use an ML model trained on sample requirement files, sample input models, and corresponding sample detected errors and conflicts.

Next, the user may interact with the GUI to start the AI-assisted requirements verification process 2450. In one embodiment, the user clicks a "verification" button, selects the CAD model, selects the listed requirements, then clicks "Verify Selected Requirements". A workflow of the verification process may be displayed to the user to monitor the verification progress, allowing the user or a human expert to review correctly verified items, review error list examples, and provide feedback to the system if needed 2460. External feedback (e.g., from a subject matter expert) can occur at this stage of the process. For example, during the verification of requirements, an external expert's feedback can be applied to confirm that the verifications are correctly interpreted by the system. In another embodiment, when the system proposes verification results for specific requirements along with the corresponding data used, an external expert may provide feedback to accept the results as they are presented by the IDEP, or to suggest revisions so the system re-runs the verifications selectively.

A report may be generated automatically by the IDEP once verification is completed 2470. The IDEP may further provide functions for tracking/archiving verification histories, and for sharing the report via a downloadable link.

FIG. 25 shows a flow diagram of another exemplary AI-assisted requirements verification process using external feedback, according to embodiments of the present invention. In particular, the embodiment of FIG. 25 shows how Language Learning Models (LLMs) may be employed to analyze an input requirement file. Before running the AI-assisted requirement verification process, pre-processing 2502 may be carried out to add embeddings from reference requirements documentation 2504 (e.g., MIL-HDBK-516C Airworthiness Certification Criteria, for all manned and unmanned, fixed and rotary wing air systems) to the LLM 2506.

Upon initiation of the AI-assisted requirement verification process, a requirements file (e.g., in excel or CSV format) and a corresponding digital model file (e.g., CAD) to be verified against the requirements is received 2510 (e.g., uploaded to the IDEP).

The requirements file may be spliced 2520 into a Model Splice R using a dedicated Requirements Model Splicer, to extract the individual requirements, which may be quantitative or qualitative. Model Splice R may be further processed 2530 to assess, classify, or categorize qualitative and quantitative requirements, using the pre-processed LLM.

In an illustrative embodiment, Model Splice R may comprise parsing text to store in an instantiation of a requirements-specific data structure, and the generation of API scripts which may link to individual requirements, may be used to map specific requirements and associated data, or may capture a hierarchy of the system's requirements (e.g., list of all requirements, list of requirements or sub-requirements by level of hierarchy). See FIGS. 7 and 8 for a discussion of model splicer generation, components, and linking. Requirement model files are frequently human-readable, for example in the form of a text file with metadata, dependencies, and structure hierarchy organized with some semantic syntax. As a result, splicing of a requirements file may involve text processing and searching, and further extensions beyond, including creating individual splices for individual requirements, creating a mapping of requirements to associated data, and additional steps applicable to individual designs or requirements.

Next, each requirement may be individually assessed. A requirement determined 2532 to be quantitative may be checked or corrected 2534 via expert feedback, and its category may be edited or reassigned 2536 if incorrect. Similarly, a requirement determined 2532 to be qualitative may be checked or corrected 2540 via expert feedback, and its category may be edited or reassigned 2542 if incorrect. Expert feedback at this stage may be external (e.g., from an external subject matter expert). All subject matter expert inputs described herein can be enhanced or replaced by specifically trained AI modules located on the IDEP.

For every correctly identified quantitative requirement, variables needed for evaluation against the requirement may be identified 2538, and the input CAD model may be spliced 2550 accordingly into a Model Splice M, to extract current value from input variables or to calculate from model parameters. If Model Splice M already exists (i.e., variable values against an earlier requirement have been extracted already), Model Splice M may be updated with values for new/additional variables.

For every correctly identified qualitative requirement, the LLM may be used to extract 2546 relevant information to query the input CAD model when creating or updating Model Splice M. That is, model-specific data may be extracted from the input CAD model to answer qualitative questions from Model Splice R.

In some embodiments, default API scripts are provided by the IDEP directly during the splicing 2550 of the input CAD model file to generate Model Splice M, and such API scripts may be used to link with specific requirements. For example, API scripts within Model Splice M for linking with the CAD model may include, but are not limited to, "GetCenterOf-Gravity", "GetMass", "GetVolume", etc., and such API scripts may be generated based on requirement Model Splice R. In some embodiments, splicing of the CAD model into Model Splice M is independent of Model Splice R or individual requirements. That is, CAD Model splicing may be performed before the process shown in FIG. 25 starts and before any requirements are analyzed.

Next, Model Splice R and Model Splice M may be linked appropriately, such that corresponding requirements from splice R are evaluated with the corresponding model parameters from splice M, to check against requirement and output satisfiability 2560. That is, for each linked requirement, the system may retrieve specific data from the CAD model via Model Splice M, or answer the requirement using data retrieved via model splice M, by performing additional computation to the retrieved model data.

A human expert may review, validate, and approve 2570 each requirement verification result, and a verification report may be generated 2572 once all requirements have been considered. External feedback (e.g., from a subject matter expert) may occur in this location of the process. For example, when the system proposes verification results for specific requirements along with the corresponding data used, an external expert can provide feedback to accept the results as is, or to suggest revisions, so that the system may re-run the verifications selectively. In another embodiment, external feedback may be used to accept the verification report as-is, or to reject the report, or to suggest revisions to the content.

Each time human expert review data is received, the requirement categorization and/or verification result may be paired with the human expert review data to create a new training data point. Training data points can be continuously collected 2580 to form training data sets that are stored, updated, and used for LLM model retraining or continuous training schemes 2582. FIG. 25 shows various outcomes that may be collected for training, such as the qualitative 2534 and quantitative 2540 requirement assessments, and requirement satisfiability 2560. Input models and model splices, corresponding requirement files and requirement splices, individual requirement data, human feedback, as well as generated documentation 2572, may also be collected 2580 as training data.

Digital Twin Simulation Use Case

In the context of digital twin updates through external feedback, the virtual environment 120 shown in FIG. 1 may provide the ability to run simulations of multiple digital models, digital twins, and digital twin components, for the benefit of analysis/decision making (e.g., determining an authoritative twin configuration). The example below lists various implementation steps and examples, including model splicer/wrapper implementation.

The simulations discussed below involve generating a range of best possible outcomes (Pareto frontiers) through repeated random experiments (Monte Carlo simulations) to examine various options and make decisions in complex situations without full knowledge or certainty of the environment. The objective of the simulations is the comparison of a set of aircraft options in the digital domain using a digital twin.

Pre-Processing

A simulation includes a simulation kernel that performs actual computations over time and space, and a simulation planning interface (SPI) configured to deliver its inputs and receive its outputs. The first pre-processing step is the structuring of the input parameter distribution dictionary. First, a list of inputs for the simulations is generated and fed into the simulation planning interface (SPI). Actions within the SPI include the passing of each set of inputs into the run_simulation function, and the appending of the resulting values to the simulation_data list.

A code example is provided below that demonstrates the generation of input parameters for running simulations on an aircraft design using randomly sampled values based on specified means and standard deviations. The input_parameters dictionary stores the mean and standard deviation for each design parameter, such as wingspan, engine power, fuel capacity, payload capacity, and stealth technology level. In some embodiments, the SPI provides the keys to an input_parameters dictionary. In one embodiment, the SPI also provides a method to verify the values of the dictionary.

The function generate_inputs is defined to create a single set of inputs by drawing from the distributions specified in the input_parameters dictionary. The code then generates a list of inputs for the simulations by calling the generate_inputs function N times (where N=10,000 is selected here). Finally, the code iterates through the generated inputs list and runs the simulation for each input set, storing the results in the simulation_data list. The simulation results include values for range, payload, speed, stealth, and cost, which can be further analyzed and used for optimization and decision-making processes.

In the specific code example of Table 2, a dictionary input_parameters is first defined to store the means and standard deviations for the distributions of the inputs. The inputs considered here are the wing span, engine power, fuel capacity, payload capacity, and stealth technology level of the aircraft. Next, a function generate_inputs is defined to generate a single set of inputs by drawing from these distributions.

TABLE 2

Pre-processing Example

```
# Dictionary to store the means and standard deviations for the input
distributions input_parameters = {
    'wing_span': {
    'mean': 35, # mean wing span in meters
    'std_dev': 5 # standard deviation of wing span in meters
    },
    'engine_power': {
    'mean': 20000, # mean engine power in horsepower
    'std_dev': 1000 # standard deviation of engine power in horsepower
    },
    'fuel_capacity': {
    'mean': 20000, # mean fuel capacity in liters
    'std_dev': 2000 # standard deviation of fuel capacity in liters
    },
```

TABLE 2-continued

Pre-processing Example

```
'payload_capacity': {
'mean': 20000, # mean payload capacity in kilograms
'std_dev': 2000 # standard deviation of payload capacity in kilograms
},
'stealth_technology': {
'mean': 0.5, # mean stealth technology level (0 = none, 1 = maximum)
'std_dev': 0.1 # standard deviation of stealth technology level
},
}
# Function to generate a single set of inputs by drawing from the
distributions def generate_inputs(input_parameters):
    inputs = { }
    for parameter, values in input_parameters.items( ):
    inputs[parameter] = draw_from_distribution(values['mean'],
    values['std_dev'])
    return inputs
# Generate a list of inputs for the simulations
inputs_list = [generate_inputs(input_parameters) for _ in range(10000)]
# Run the simulations with the generated inputs
simulation_data = [ ]
for inputs in inputs_list:
    range_value, payload_value, speed_value, stealth_value, cost_value
    = run_simulation(inputs)
    simulation_data.append((range_value, payload_value, speed_value,
    stealth_value, cost_value))
```

The second pre-processing step is the structuring of inputs with specific examples on each of the model splicer/wrappers. For CAD models, inputs may be design parameters of the aircraft such as wing_span, engine_size, fuel_capacity, etc. The CAD model may provide a detailed structural representation of the aircraft and may calculate physical properties such as total_weight and wing_surface_area. An example is provided in Table 3.

To communicate with the CAD model, the IDEP API may be used with a POST request. The wrapper_ID would specify the CAD model, and the input dictionary would contain the design parameters.

TABLE 3

Input Structuring Example

```
CAD_inputs = {
    'wing_span': draw_from_distribution(35, 5), # in meters
    'engine_size': draw_from_distribution(4, 0.5), # in meters
    'fuel_capacity': draw_from_distribution(20000, 2000), # in liters
}
CAD_output = execute_model('CAD_wrapper_ID', CAD_inputs)
total_weight = CAD_output['output'][0]['value']
wing_surface_area = CAD_output['output'][1]['value']
```

A Controls Model may calculate the range of the aircraft based on total_weight, fuel_capacity, and wing_surface_area. The IDEP API may be used to call the Controls Model with the required inputs obtained from the CAD model, as shown in Table 4.

TABLE 4

Ranging Example

```
Controls_inputs = {
    'total_weight': total_weight,
    'fuel_capacity': CAD_inputs['fuel_capacity'],
    'wing_surface_area': wing_surface_area,
}
Controls_output = execute_model('Controls_wrapper_ID',
Controls_inputs)
range_value = Controls_output['output'][0]['value']
```

A CFD Model may provide data on aerodynamics of the aircraft such as lift_coefficient or drag_coefficient. Inputs could be design parameters such as wing_surface_area, speed, and altitude, as shown in Table 5.

TABLE 5

Aerodynamics Example

```
CFD_inputs = {
    'wing_surface_area': wing_surface_area,
    'speed': draw_from_distribution(850, 50), # in km/h
    'altitude': draw_from_distribution(10000, 500), # in meters
}
CFD_output = execute_model('CFD_wrapper_ID', CFD_inputs)
lift_coefficient = CFD_output['output'][0]['value']
drag_coefficient = CFD_output['output'][1]['value']
```

A Cost model may estimate the cost of the aircraft based on various factors such as total_weight, engine_size, and fuel_capacity. Again, the IDEP API may be used to call the Cost model with the required inputs, as shown in Table 6.

TABLE 6

Cost Model Example

```
Cost_inputs = {
    'total_weight': total_weight,
    'engine_size': CAD_inputs['engine_size'],
    'fuel_capacity': CAD_inputs['fuel_capacity'],
}
Cost_output = execute_model('Cost_wrapper_ID', Cost_inputs)
cost_value = Cost_output['output'][0]['value']
```

In various embodiments, each of these execute_model functions sends a POST request to the IDEP API, which starts a simulation and returns a URL where the simulation results can be collected. Once the simulation is complete, the function sends a GET request to this URL to collect the results. In some embodiments, the input and output handling may be adjusted according to the API specification and the specifics of each model.

Tradespace Analysis

A basic algorithm based on a Multi-Criteria Decision Analysis (MCDA) framework is disclosed, where each aircraft is evaluated across multiple criteria and scored based on its performance. The following process steps may be used to run a set of simulations, using a set of digital models (e.g., a digital twin) that reflect performance metrics in five dimensions (range, cost, payload, speed, and stealth):

1. Initialize a list of aircraft to evaluate. This may be a list of aircraft names, models, or identifiers.
2. For each aircraft, gather data on the five dimensions: Data should be quantitative, so it can be compared across different aircraft. Corresponding data must be in similar units for a comparable form (e.g., cost in dollars, speed in mph, etc.).
3. Normalize the data for each dimension: For example, scaling values between 0 and 1, where 0 represents the worst possible score and 1 represents the best possible score, may be valuable in some applications. The normalized range allows the system to compare scores across different dimensions.
4. Weigh the dimensions according to their importance, such that the sum of all weights equals 1. The weight assignment decision may be carried out in the analysis plane 150 (see FIG. 1). It may be determined based on expert opinion, based on a preordained set of rules (e.g., a decision-maker's preference), or algorithmically using techniques such as Analytic Hierarchy Process (AHP).

5. Calculate a single synthetic score for each aircraft (digital twin) by multiplying the normalized value for each dimension by its weight, then adding up these products, yielding a single score for each aircraft that takes into account all of the dimensions.
6. Rank the aircraft based on their scores. The aircraft with the highest score is the best option according to the selected dimensions and weights.
7. Iterate on the process as needed. If the results don't match a given expectation, or if the decision context changes, the weights or decision criteria may need to be adjusted.
8. Validate the results with the decision makers and experts in the field.

The steps above represent a simplified version of the process. The actual implementation may be more complex, with numerous possible variations and refinements. For example, additional factors such as uncertainties, risk analysis, etc., may be included when selecting an aircraft. A more detailed example is provided below.

The algorithm listed below compares three different hypothetical aircraft models A, B, and C, using the following concrete assumed numbers for each of the considered dimensions:

Range (in miles): A—2000, B—3000, C—1500
Cost (in $ millions): A—50, B—75, C—40
Payload (in lbs): A—5000, B—4500, C—6000
Speed (in mph): A—500, B—600, C—550.
Stealth (scale of 1-10, with 10 being the most stealthy): A—6, B—8, C—7

The weights for each dimension, as provided by a decision-maker, are assumed to be the following:

Range: 0.2
Cost: 0.3
Payload: 0.15
Speed: 0.25
Stealth: 0.1

The dimensions may be normalized by dividing each value by the maximum in its category, yielding the following:

Range: A—0.67, B—1.0, C—0.5
Cost: A—0.33, B—0, C—0.47
  Note that for cost, a lower cost is preferable. Therefore, normalization was inverted to (1-normalized_value).
Payload: A—0.83, B—0.75, C—1.0
Speed: A—0.83, B—1.0, C—0.92.
Stealth: A—0.6, B—0.8, C—0.7

The synthetic score for each aircraft is therefore:

$$A\_score =$$
$$0.67*0.2 + 0.33*0.3 + 0.83*0.15 + 0.83*0.25 + 0.6*0.1 = 0.67$$

$$B\_score = 1.0*0.2 + 0*0.3 + 0.75*0.15 + 1.0*0.25 + 0.8*0.1 = 0.67$$

$$C\_score = 0.5*0.2 + 0.47*0.3 + 1.0*0.15 + 0.92*0.25 + 0.7*0.1 = 0.74$$

Based on the provided calculations, aircraft C is the best option, as it has the highest score. The fact that aircrafts A and B have equal scores shows that there is a trade-off between the dimensions where designs A and B excel. Also, if the weights change (e.g., if cost factors change), then the ranking might change as well. Finally, the illustrative example above compares three models based on five dimensions. Tradespace analyses may be developed involving a large number of factors and exponential complexity.

Pareto Frontier Analysis with Monte Carlo Simulation

Creating Pareto frontiers using Monte Carlo simulations is an effective way to explore a complex tradespace under uncertainty. The exemplary steps below provide pseudocode and scripts implementing such an analysis.

Step 1: Set Up Monte Carlo Simulations

1. Initialize variables: range, payload, speed, and stealth. These variables will be dependent on the design of the aircraft and will have some level of uncertainty.
2. Define distributions for each variable based on historical data or engineering estimates. For example, range might follow a normal distribution around a mean of 2000 miles with a standard deviation of 100 miles.
3. Similarly, set up a distribution for cost. This may be a normal distribution. If there is more potential for large outliers, a lognormal distribution may be more appropriate.

Step 2: Run the Simulations

1. Run a large number of simulations (e.g., N=10,000 or more). In each simulation, draw a random value for each variable from its distribution.
2. Calculate the performance metrics and cost for each simulation.

Step 3: Identify the Pareto Frontier

1. For each performance variable (range, payload, speed, stealth), create a scatter plot with cost on the x-axis and the performance variable on the y-axis.
2. For each plot, identify the points that form the Pareto frontier. These are the points for which there is no other point that has a lower cost and a higher performance. These points represent the trade-off between cost and the given performance variable.
3. Table 7 shows a simplified example written in pseudocode.

TABLE 7

Sample Simulation Pseudo-Code

```
for i in range(10000):
    range = draw_from_range_distribution( )
    payload = draw_from_payload_distribution( )
    speed = draw_from_speed_distribution( )
    stealth = draw_from_stealth_distribution( )
    cost = draw_from_cost_distribution( )
    run_simulation(range, payload, speed, stealth, cost)
for each performance variable:
    scatter_plot(cost, performance)
    identify_pareto_frontier(cost, performance)
```

In most tradespace analyses, the above process may be more complex and may feature performance variables that are interdependent. In addition, the cost may be a function of the design choices. Moreover, identifying the Pareto frontier may be computationally complex, especially for an analysis having numerous dimensions.

Pareto Frontier Example using Notional Version of IDEP API Calls

The creation of the Pareto frontier using Monte Carlo simulations, as previously described, heavily depends on simulation models that can accurately calculate aircraft performance and cost from a set of inputs.

The example first lists the model splice_ID or wrapper_ID in the API request that uniquely identifies each of these models, using notional names. In an actual implementation within the platform, implementation may have the specific company name, model name and other information in addition, within the wrapper ID. The wrapper_ID list is:

range_wrapper_ID, payload_wrapper_ID, speed_wrapper_ID, stealth_wrapper_ID, cost_wrapper_ID.

Exemplary Pseudocode and Script

The following exemplary script performs simulations (e.g., Monte Carlo), calculates performance metrics and cost for each simulation, and then creates a scatter plot for cost vs each performance metric. It creates a four-way Pareto analysis for the trade-off between cost and the four metrics: range, payload, speed, and stealth. It uses the IDEP API to asynchronously execute different digital engineering models for each of these metrics. The script also handles long-running models that may take several minutes to hours to complete, with complex outputs returned as a structured JSON file. The results are visualized in scatter plots, with the Pareto frontiers highlighted. To reduce complexity, each model is assumed to require the same inputs, and the output of the model is assumed to be a single numeric value that may easily be extracted from the response. Exemplary pseudocode is provided in Table 8.

TABLE 8

Further Sample Simulation Pseudo-Code

```
Import required libraries
Initialize ISTARI_API_TOKEN to access the platform, and the model wrappers
Function draw_from_distribution(mean, std_dev):
    Return random_value_from_normal_distribution(mean, std_dev)
Function execute_model(wrapper_ID, inputs):
    Define headers and data for the request
    Send initial request and get the response
    Check response status code, raise exceptions if errors
    Loop until job is completed:
    Get result data from the polling response
    Check response status, raise exceptions if errors
    If job is successful, break the loop
    Else, wait for a specified time and poll again
    Extract and return the simulation_result from the response data
Function run_simulation(inputs):
    Call execute_model for range, payload, speed, stealth, and cost, with specific wrapper_IDs
    Return the values obtained
Function identify_pareto_frontier(df, cost_col, metric_col):
    Sort df by cost
    Initialize variable pareto_frontier
    Loop over rows in sorted df:
    If row has greater metric value than the last row in pareto_frontier:
    Add row to pareto_frontier
    Return pareto_frontier
Initialize empty list simulation_data
Define inputs for the simulation
Loop 10000 times:
    Call run_simulation with inputs
    Append results to simulation_data
Convert simulation_data to pandas DataFrame df
For each metric in ['Range', 'Payload', 'Speed', 'Stealth']:
    Plot cost vs metric with pareto_frontier
    Display plot
```

Exemplary Script

In the script of Table 9, the wrapper IDs and API tokens listed are notional and need to be replaced by actual wrapper IDs and API tokens provided by the IDEP for each model. The script assumes that each model has specific input and output requirements and the user adjusts as needed according to actual API and model specifics.

TABLE 9

| Sample Simulation Script |
| --- |

```
import requests
import matplotlib.pyplot as plt
import numpy as np
import pandas as pd
import time
# Define the API token
ISTARI_API_TOKEN = 'your_istari_api_token'
# Function to draw a sample from a normal distribution with a given mean and standard deviation
def draw_from_distribution(mean, std_dev):
    return np.random.normal(mean, std_dev)
# Function to execute a model on the Istari platform. It sends a POST request to the execute_model
endpoint
# and then continuously polls the result URI until the job is done
def execute_model(wrapper_ID, inputs):
    # Define the headers for the request
    headers = {
    'Authorization': f'Token {ISTARI_API_TOKEN}',
    'Content-Type': 'application/json',
    }
    # Define the data for the request
    data = {
    'wrapper_ID': wrapper_ID,
    'input': inputs,
    }
    # Send the initial request to execute the model
    initial_response = requests.post('api(dot)Istari(dot)com/v1/execute_model', headers=headers,
json=data)
    # If the status code of the response is not 200, raise an exception
    if initial_response.status_code != 200:
    raise ValueError(f'Initial request failed with status code {initial_response.status_code}')
    # Get the result URI from the response
    result_uri = initial_response.json( )['urls']['get']
    # Continuously poll the result URI until the job is done
    while True:
    result_response = requests.get(result_uri, headers=headers)
    # If the status code of the response is not 200, raise an exception
    if result_response.status_code != 200:
    raise ValueError(f'Polling request failed with status code {result_response.status_code}')
    # Get the data from the response
    result_data = result_response.json( )
    # If the status of the job is 'succeeded', break the loop
    if result_data['status'] == 'succeeded':
    break
    # If the status of the job is 'failed', raise an exception
    elif result_data['status'] == 'failed':
    raise ValueError("Simulation failed")
    # Wait for 10 seconds before polling again
    time.sleep(10)
    # Extract the 'outputs' field from the response data
    outputs = result_data['outputs']
    # Find the 'Simulation results' field in the outputs
    for output in outputs:
    if output['name'] == 'Simulation results':
    simulation_result = output['value']
    break
    else:
    raise ValueError('Simulation results not found in response')
    # Return the simulation result
    return simulation_result
# Function to run a simulation. It executes the models for range, payload, speed, stealth, and cost,
# and returns the resulting values
def run_simulation(inputs):
    range_value = execute_model('range_wrapper_ID', inputs)
    payload_value = execute_model('payload_wrapper_ID', inputs)
    speed_value = execute_model('speed_wrapper_ID', inputs)
    stealth_value = execute_model('stealth_wrapper_ID', inputs)
    cost_value = execute_model('cost_wrapper_ID', inputs)
    return range_value, payload_value, speed_value, stealth_value, cost_value
# Function to identify the Pareto frontier in a data frame. It sorts the data frame by the cost column,
# and then iterates over the rows, adding each row to the Pareto frontier if its metric value is greater
# than the metric value of the last row in the Pareto frontier
def identify_pareto_frontier(df, cost_col, metric_col):
    df_sorted = df.sort_values(cost_col)
    pareto_frontier = df_sorted.iloc[0:1]
    for i in range(1, len(df_sorted)):
    if df_sorted.iloc[i][metric_col] > pareto_frontier.iloc[-1][metric_col]:
    pareto_frontier = pareto_frontier.append(df_sorted.iloc[i])
    return pareto_frontier
```

TABLE 9-continued

Sample Simulation Script

```
# Define the list to store the simulation data and the inputs for the simulation
simulation_data = [ ]
inputs = {"polygon_count": "lowest", "hide_parts": "propeller", "debug": False}
# Run the simulation 10000 times and append the results to the simulation data
for i in range(10000):
    range_value, payload_value, speed_value, stealth_value, cost_value = run_simulation(inputs)
    simulation_data.append((range_value, payload_value, speed_value, stealth_value, cost_value))
# Create a data frame from the simulation data
df = pd.DataFrame(simulation_data, columns=['Range', 'Payload', 'Speed', 'Stealth', 'Cost'])
# For each metric, plot the cost versus the metric and the Pareto frontier
for metric in ['Range', 'Payload', 'Speed', 'Stealth']:
    plt.figure( )
    plt.scatter(df['Cost'], df[metric])
    pareto_frontier = identify_pareto_frontier(df, 'Cost', metric)
    plt.plot(pareto_frontier['Cost'], pareto_frontier[metric], color='r')
    plt.title(f'Cost vs { metric} with Pareto Frontier')
    plt.xlabel('Cost')
    plt.ylabel(metric)
    plt.show( )
```

Exemplary Simulation using a Single Script

The script of Table 10 runs the exemplary Pareto frontier simulation described above in a single script. Note that the wrapper IDs and API tokens listed are notional and need to be replaced by actual wrapper IDs and API tokens provided by the IDEP for each model. The script assumes that each model has specific input and output requirements and the user adjusts as needed according to actual API and model specifics.

TABLE 10

Further Sample Simulation Script

```
import requests
import time
import matplotlib.pyplot as plt
import numpy as np
import pandas as pd
# Set your Istari API token
ISTARI_API_TOKEN = 'your_istari_api_token'
# This function generates random values for the given mean and standard deviation
def draw_from_distribution(mean, std_dev):
    return np.random.normal(mean, std_dev)
# This function sends a POST request to the Istari API to execute a given model with specified
inputs
# It then sends a GET request to collect the simulation results once they are ready
def execute_model(wrapper_ID, inputs):
    headers = {
    'Authorization': f'Token {ISTARI_API_TOKEN}',
    'Content-Type': 'application/json',
    }
    data = {
    'wrapper_ID': wrapper_ID,
    'input': inputs,
    }
    # Send the POST request
    response = requests.post('api(dot)Istari(dot)com/v1/execute_model', headers=headers,
json=data)
    # Get the URL where the simulation results can be collected
    result_url = response.json( )['urls']['get']
    # Wait for the simulation to complete
    while response.json( )['status'] != 'succeeded':
    time.sleep(10) # adjust this as needed
    response = requests.get(result_url, headers=headers)
    # Get the output value(s) from the simulation results
    output_values = [output['value'] for output in response.json( )['output']]
    return output_values
# This function runs the simulation
def run_simulation(inputs):
    # Execute the CAD model
    CAD_output = execute_model('CAD_wrapper_ID', inputs)
    total_weight = CAD_output[0]
    wing_surface_area = CAD_output[1]
    # Execute the Controls Model
    Controls_inputs = {
    'total_weight': total_weight,
    'fuel_capacity': inputs['fuel_capacity'],
    'wing_surface_area': wing_surface_area,
```

TABLE 10-continued

Further Sample Simulation Script

```
}
range_value = execute_model('Controls_wrapper_ID', Controls_inputs)[0]
# Execute the CFD model
CFD_inputs = {
'wing_surface_area': wing_surface_area,
'speed': draw_from_distribution(850, 50), # in km/h
'altitude': draw_from_distribution(10000, 500), # in meters
}
lift_coefficient = execute_model('CFD_wrapper_ID', CFD_inputs)[0]
# Execute the Cost model
Cost_inputs = {
'total_weight': total_weight,
'engine_size': inputs['engine_size'],
'fuel_capacity': inputs['fuel_capacity'],
}
cost_value = execute_model('Cost_wrapper_ID', Cost_inputs)[0]
return range_value, lift_coefficient, cost_value
# This function identifies the Pareto frontier in a given dataset
def identify_pareto_frontier(df, cost_col, metric_col):
    df_sorted = df.sort_values(cost_col)
    pareto_frontier = df_sorted.iloc[0:1]
    for i in range(1, len(df_sorted)):
    if df_sorted.iloc[i][metric_col] > pareto_frontier.iloc[-1][metric_col]:
    pareto_frontier = pareto_frontier.append(df_sorted.iloc[i])
    return pareto_frontier
# Generate the inputs for the simulation
simulation_inputs = {
    'wing_span': draw_from_distribution(35, 5), # in meters
    'engine_size': draw_from_distribution(4, 0.5), # in meters
    'fuel_capacity': draw_from_distribution(20000, 2000), # in liters
}
# Run the simulation multiple times and collect the results
simulation_data = [ ]
for i in range(100):
    range_value, lift_coefficient, cost_value = run_simulation(simulation_inputs)
    simulation_data.append((range_value, lift_coefficient, cost_value))
# Convert the simulation results into a DataFrame
df = pd.DataFrame(simulation_data, columns=['Range', 'Lift Coefficient', 'Cost'])
# Identify the Pareto frontier for each metric and plot it against cost
for metric in ['Range', 'Lift Coefficient']:
    plt.figure( )
    plt.scatter(df['Cost'], df[metric])
    pareto_frontier = identify_pareto_frontier(df, 'Cost', metric)
    plt.plot(pareto_frontier['Cost'], pareto_frontier[metric], color='r')
    plt.title(f'Cost vs {metric} with Pareto Frontier')
    plt.xlabel('Cost')
    plt.ylabel(metric)
    plt.show( )
```

Exemplary Digital Twin Simulation

In the exemplary simulation described below, a chain of ten different models with hypothetical names, inputs, and outputs associated with a digital twin are linked through a script. In this illustrative example, generic engineering tool names are used to represent the tools and DE models. The models have the following attributes:

CAD_tool (CAD tool):
  a. Inputs:
    i. Aircraft design specifications (e.g., wing span, fuselage length, number of engines)
    ii. Material properties (e.g., density, strength)
  b. Outputs:
    i. 3D CAD files of the aircraft
    ii. Estimated total weight of the aircraft
CFD_tool (CFD tool):
  a. Inputs:
    i. 3D CAD files of the aircraft from CAD_tool
    ii. Flight conditions (e.g., air density, velocity)
  b. Outputs:
    i. Lift coefficient under the given conditions
    ii. Drag coefficient under the given conditions Controls (Controls Model):
  a. Inputs:
    i. Estimated total weight of the aircraft from CAD_tool
    ii. Lift and drag coefficients from CFD_tool
  b. Outputs:
    i. Control parameters for stable flight
    ii. Stability margins of the control system
Structural_Analysis (Structural Analysis Model):
  a. Inputs:
    i. 3D CAD files of the aircraft from CAD_tool
    ii. Material properties
  b. Outputs:
    i. Stress distribution over the aircraft structure
    ii. Critical stress points that need reinforcement
Thermal_Analysis (Thermal Analysis Model):
  a. Inputs:
    i. 3D CAD files of the aircraft from CAD_tool
    ii. Heat generation and dissipation parameters (e.g., from engines, electronics)

b. Outputs:
   i. Temperatures at critical points on the aircraft
   ii. Heat dissipation efficiency of the current design
Systems (Systems Model):
   a. Inputs:
      i. Control parameters from Controls
      ii. Loads on the aircraft from Structural_Analysis
   b. Outputs:
      i. System response time
      ii. System overshoot
Cost (Cost Model):
   a. Inputs:
      i. Material used from CAD_tool
      ii. System design from Systems
   b. Outputs:
      i. Estimated manufacturing cost
      ii. Estimated operational cost
Requirements_Management (Requirements Management):
   a. Inputs:
      i. Design constraints
      ii. System design from Systems
   b. Outputs:
      i. Requirement compliance status
      ii. List of requirements that are not met
Systems_Engineering (Systems Engineering):
   a. Inputs:
      i. System design from Systems
      ii. Requirements from Requirements_Management
   b. Outputs:
      i. Systems validation status
      ii. Suggested system modifications
Electronics_Design (Electronics Design):
   a. Inputs:
      i. Electronics requirements
      ii. System design from Systems_Engineering b. Outputs:
   i. Electronics design files
   ii. Electronics validation status
   A hypothetical sequence of tasks is considered across ten different modeling tools to get an output evaluation. The tasks are such that the output of one tool serves as the input for the next tool. In the case of CAD_tool and CFD_tool, the output is a URL to a file that serves as an input for the next tool. For others, numerical outputs are used as inputs.
   The tools used in the exemplary scenario have the following assumed characteristics:
   CAD_tool is used to generate a CAD model of the aircraft.
   Electronics_Design uses the CAD model from CAD_tool to design the electronics.
   CFD_tool and Thermal_Analysis both use the CAD model to perform CFD analysis and Heat Analysis, respectively.
   CONTROLS tool then uses the output of CFD_tool and Thermal_Analysis to calculate the range and other performance parameters.
   STRUCTURAL_ANALYSIS tool uses the CAD model from CAD_tool and the load details from CONTROLS to perform structural analysis.
   Systems tool uses the control parameters from CONTROLS and the structural properties from STRUCTURAL_ANALYSIS to simulate aircraft behavior.
   The outputs from Systems and CONTROLS are both inputs for the Cost model.
   Requirements_Management and Systems_Engineering use the system design from CONTROLS, requirements from the Cost model, and the behavior model from Systems to manage requirements and system architecture.
Exemplary Script
   Table 11 shows an exemplary script of the simulation.

TABLE 11

Exemplary Digital Twin Simulation Script

```
import requests
import time
import json
from concurrent.futures import ThreadPoolExecutor
ISTARI_API_TOKEN = 'your_istari_api_token'
# Map model types to their wrapper_IDs
model_wrappers = {
   "CAD_tool": "cad_wrapper_ID",
   "CFD_tool": "cfd_wrapper_ID",
   "Controls": "controls_wrapper_ID",
   "Structural_Analysis": "structural_analysis_wrapper_ID",
   "Thermal_Analysis": "thermal_analysis_wrapper_ID",
   "Systems": "systems_wrapper_ID",
   "Cost": "cost_wrapper_ID",
   "Requirements_Management": "requirements_wrapper_ID",
   "Systems_Engineering": "systems_wrapper_ID",
   "Electronics_Design": "electronics_wrapper_ID"
}
def execute_model(wrapper_ID, inputs):
   # same as before
# Notional initial inputs for CAD_tool
inputs = {"design_specs": {"wing_span": 30, "engine_power": 1500}, "material_props": {"density":
7.85, "yield_strength": 250}}
# Execute the first model (CAD_tool)
outputs_cad = execute_model(model_wrappers["CAD_tool"], inputs)
# Perform parallel computations on the CAD model (CFD_tool and Thermal_Analysis)
with ThreadPoolExecutor( ) as executor:
   future_cfd = executor.submit(execute_model, model_wrappers["CFD_tool"], {"cad_files":
outputs_cad["cad_files_uri"], "flight_conditions": {"altitude": 10000, "speed": 250}})
   future_thermal_analysis = executor.submit(execute_model,
```

TABLE 11-continued

Exemplary Digital Twin Simulation Script

```
model_wrappers["Thermal_Analysis"], {"cad_files": outputs_cad["cad_files_uri"], "heat_params":
{"external_temp": −50, "internal_temp": 20}})
    future_electronics = executor.submit(execute_model, model_wrappers["Electronics_Design"],
{"cad_files": outputs_cad["cad_files_uri"], "electronics_design": {"transistor_count": 5000,
"board_layout": "linear"}})
outputs_cfd = future_cfd.result( )
outputs_thermal_analysis = future_thermal_analysis.result( )
outputs_electronics = future_electronics.result( )
# Run CONTROL model to calculate performance parameters
inputs_controls = {"aircraft_weight": outputs_cfd["aircraft_weight"], "lift_drag_coeffs":
outputs_cfd["lift_drag_coeffs"], "heat_transfer_coeffs":
outputs_thermal_analysis["heat_transfer_coeffs"], "electronics_efficiency":
outputs_electronics["electronics_efficiency"]}
outputs_controls = execute_model(model_wrappers["Controls"], inputs_controls)
# Run STRUCTURAL_ANALYSIS model for structural analysis
inputs_structural_analysis = {"cad_files": outputs_cad["cad_files_uri"], "loads":
outputs_controls["loads"]}
outputs_structural_analysis = execute_model(model_wrappers["Structural_Analysis"],
inputs_structural_analysis)
# Run Systems model for aircraft behavior
inputs_systems = {"controls": outputs_controls["controls"], "loads":
outputs_structural_analysis["loads"], "aircraft_specs": outputs_cad["aircraft_specs"]}
outputs_systems = execute_model(model_wrappers["Systems"], inputs_systems)
# Run Cost model for cost analysis
inputs_cost = {"aircraft_specs": outputs_cad["aircraft_specs"], "performance":
outputs_controls["performance"], "behavior": outputs_systems["behavior"]}
outputs_cost = execute_model(model_wrappers["Cost"], inputs_cost)
# Run Requirements_Management and Systems_Engineering for requirements and system architecture
inputs_requirements = {"system_design": outputs_controls["system_design"], "requirements":
outputs_cost["requirements"]}
inputs_systems = {"system_design": outputs_controls["system_design"], "requirements":
outputs_cost["requirements"], "behavior_model": outputs_systems["behavior_model"]}
with ThreadPoolExecutor( ) as executor:
    future_requirements = executor.submit(execute_model,
model_wrappers["Requirements_Management"], inputs_requirements)
    future_systems = executor.submit(execute_model, model_wrappers["Systems_Engineering"],
inputs_systems)
outputs_requirements = future_requirements.result( )
outputs_systems = future_systems.result( )
# Print the final outputs
print(f"Final Outputs: {outputs_requirements, outputs_systems}")
```

LLM-Generated Report

The script shown in Table 12 creates a detailed report using an LLM. LLM prompts that are specific to each simulation output are required. This may be achieved by augmenting a generate_report function with more specific prompts that explain what each model does in the analysis process. Furthermore, the script will also keep track of the analysis flow by storing each operation's explanation in a list, which will then be passed to the language model to generate the final comprehensive report.

The script also includes detailed steps detailing the analysis process. It passes these steps to the language model, which incorporates them into the generated report to provide a comprehensive explanation of how the analysis was conducted.

TABLE 12

Exemplary Analysis Report Script

```
import requests
import time
import json
from concurrent.futures import ThreadPoolExecutor
ISTARI_API_TOKEN = 'your_istari_api_token'
GPT_API_TOKEN = 'your_gpt_api_token'
# Map model types to their wrapper_IDs
model_wrappers = {
    # Same as before
}
def execute_model(wrapper_ID, inputs):
    # same as before
def generate_report(steps, outputs):
    # Define the headers for the GPT-3 API request
    headers = {
        'Authorization': f'Token {GPT_API_TOKEN}',
```

TABLE 12-continued

Exemplary Analysis Report Script

```
'Content-Type': 'application/json',
}
# Compile the analysis steps and simulation outputs into a single prompt
prompt = "We have completed the aircraft design simulation. Here's a step by step
explanation:\n\n"
    for step in steps:
    prompt += step + '\n\n'
    prompt += f"Here are the key results:\n\n{json.dumps(outputs, indent=2)}\n\nPlease generate a
comprehensive report based on these steps and results."
    # Define the data for the GPT-3 API request
    data = {
    'prompt': prompt,
    'max_tokens': 8000,
    }
    # Send the request to the GPT-3 API
    response = requests.post('api(dot)openai(dot)com/v1/engines/davinci-codex/completions',
headers=headers, json=data)
    # Extract and return the text generated by the language model
    return response.json( )['choices'][0]['text']
# Notional initial inputs for CAD_tool
inputs = {"design_specs": {"wing_span": 30, "engine_power": 1500}, "material_props": {"density":
7.85, "yield_strength": 250}}
# Prepare the list to store the analysis steps
analysis_steps = [ ]
# Execute the first model (CAD_tool)
outputs_cad = execute_model(model_wrappers["CAD_tool"], inputs)
analysis_steps.append("Step 1: We started by designing the aircraft using CAD_tool. Here we specified
the initial design specifications and material properties.")
# Perform parallel computations on the CAD model (CFD_tool and Thermal_Analysis)
with ThreadPoolExecutor( ) as executor:
    # Same as before
outputs_cfd = future_cfd.result( )
outputs_thermal_analysis = future_thermal_analysis.result( )
outputs_electronics = future_electronics.result( )
analysis_steps.append("Step 2: We performed computational fluid dynamics (CFD) analysis using
CFD_tool and thermal analysis using Thermal_Analysis. We also performed electronic design analysis
using Electronics_Design.")
# Run CONTROL model to calculate performance parameters
inputs_controls = {"aircraft_weight": outputs_cfd["aircraft_weight"], "lift_drag_coeffs":
outputs_cfd["lift_drag_coeffs"], "heat_transfer_coeffs":
outputs_thermal_analysis["heat_transfer_coeffs"], "electronics_efficiency":
outputs_electronics["electronics_efficiency"]}
outputs_controls = execute_model(model_wrappers["Controls"], inputs_controls)
analysis_steps.append("Step 3: We ran the CONTROL model to compute the performance parameters
of the aircraft, considering the aircraft weight, lift and drag coefficients, heat transfer coefficients, and
electronic system efficiency.")
# Run STRUCTURAL_ANALYSIS model for structural analysis
inputs_structural_analysis = {"aircraft_design": outputs_cad["aircraft_design"], "material_props":
inputs["material_props"]}
outputs_structural_analysis = execute_model(model_wrappers["Structural_Analysis"],
inputs_structural_analysis)
analysis_steps.append("Step 4: We performed structural analysis using STRUCTURAL_ANALYSIS
based on the aircraft design and material properties.")
# Run Systems model for system behavior modeling
inputs_systems = {"aircraft_design": outputs_cad["aircraft_design"], "performance_params":
outputs_controls["performance_params"]}
outputs_systems = execute_model(model_wrappers["Systems"], inputs_systems)
analysis_steps.append("Step 5: We used Systems for system behavior modeling, considering the
aircraft design and performance parameters.")
# Run Cost Software for cost estimation
inputs_cost = {"aircraft_design": outputs_cad["aircraft_design"], "material_props":
inputs["material_props"], "system_design": outputs_controls["system_design"]}
outputs_cost = execute_model(model_wrappers["Cost"], inputs_cost)
analysis_steps.append("Step 6: We estimated the cost of the aircraft using Cost Software, based on the
aircraft design, material properties, and system design.")
# Run Requirements_Management and Systems_Engineering for requirements management and system
architecture modeling
inputs_requirements = {"system_design": outputs_controls["system_design"], "requirements":
outputs_cost["requirements"]}
inputs_systems = {"system_design": outputs_controls["system_design"], "requirements":
outputs_cost["requirements"], "behavior_model": outputs_systems["behavior_model"]}
with ThreadPoolExecutor( ) as executor:
    # Same as before
outputs_requirements = future_requirements.result( )
outputs_systems = future_systems.result( )
analysis_steps.append("Step 7: We managed the requirements using Requirements_Management and
developed the system architecture model using Systems_Engineering, considering the system design,
requirements, and behavior model.")
```

TABLE 12-continued

Exemplary Analysis Report Script

```
# Collect all the final outputs
final_outputs = {"CAD": outputs_cad, "CFD_tool": outputs_cfd, "Thermal_Analysis":
outputs_thermal_analysis, "CONTROLS": outputs_controls, "Structural_Analysis":
outputs_structural_analysis, "Systems": outputs_systems, "Cost": outputs_cost,
"Requirements_Management": outputs_requirements, "Systems_Engineering": outputs_systems}
# Generate the report using GPT-3
report = generate_report(analysis_steps, final_outputs)
# Print the final report
print(f"Final Report: {report}")
```

Machine Learning (ML) and Neural Networks

Machine learning (ML) algorithms are characterized by the ability to improve their performance at a task over time without being explicitly programmed with the rules to perform that task (i.e., learn). An ML model is the output generated when a ML algorithm is trained on data. As described herein, embodiments of the present invention use one or more artificial intelligence (AI) and ML algorithms to perform external feedback integration, including script, twin, or model updates. Various exemplary ML algorithms are within the scope of the present invention. The following description describes illustrative ML techniques for implementing various embodiments of the present invention.

Neural Networks

A neural network is a computational model comprising interconnected units called "neurons" that work together to process information. It is a type of ML algorithm that is particularly effective for recognizing patterns and making predictions based on complex data. Neural networks are widely used in various applications such as image and speech recognition and natural language processing, due to their ability to learn from large amounts of data and improve their performance over time. FIG. 26 describes neural network operation fundamentals, according to exemplary embodiments of the present invention.

FIG. 26 shows a single-layered neural network, also known as a single-layer perceptron. The operation of a single-layered neural network involves the following steps:

1. Input: Receiving a DE input vector v 2604 with elements $v_j$, with $j \in [1, n]$ representing the $j^{th}$ DE input, and where each element of the vector corresponds to an element 2606 in the input layer. For an exemplary neural network model trained to update an IDEP script, the DE input vector v 2604 may take the form of a user prompt. A DE input can be a user prompt, a DE document, a DE model, DE program code, system data from the IDEP, and/or any useful form of data in digital engineering.

2. Transfer Function: Multiplying each element of the DE input vector by a corresponding weight $w_j$ 2608. These weighted inputs are then summed together as the transfer function, yielding the net input to the activation function $$\sum_{j=1}^{n} v_j \cdot w_j \ \mathbf{2610}.$$

Each neuron in a neural network may have a bias value 2612, which is added to the weighted sum of the inputs to that neuron. Both the weights and bias values are learned during the training process. The purpose of the bias is to provide every neuron with a trainable constant value that can help the model fit the data better. With biases, the net input to the activation function is $$\sum_{j=1}^{n} \{v_j \cdot w_j\} + b.$$

In the exemplary neural network model described above (e.g., to implement a script-updating ML model), the value of the transfer function 2610 may represent the probability that a given script update will be output.

3. Activation Function: Passing the net input through an activation function 2614. The activation function σ determines the activation value o 2618, which is the output of the neuron. It is typically a non-linear function such as a sigmoid or ReLU (Rectified Linear Unit) function. The threshold θ 2616 of the activation function is a value that determines whether a neuron is activated or not. In some activation functions, such as the step function, the threshold is a specific value. If the net input is above the threshold, the neuron outputs a constant value, and if it's below the threshold, it outputs a zero value. In other activation functions, such as the sigmoid or ReLU (Rectified Linear Unit) functions, the threshold is not a specific value but rather a point of transition in the function's curve.

In the exemplary neural network model described above (e.g., to implement a script-updating ML model), the activation function σ 2614 may be a ReLU that is activated at a threshold θ 2616 representing the minimum probability for a given script update to be implemented. Hence, the activation function 2614 will yield the given script update when the implementation likelihood exceeds the threshold θ 2616.

4. Output: The activation value o 2618 is the output of the activation function. This value is what gets passed on to the next layer in the network or becomes the final DE output in the case of the last layer. In the exemplary neural network model described above (e.g., to implement a script-updating ML model), multiple activation values o 2618 from multiple layers of a neural network may be combined to generate a text variable representing the script update that has the highest likelihood of satisfying a given external feedback DE input 2604. A DE output can also be an updated twin configuration, DTw, PTw, DE document, DE model, DE program code, or any useful form of data in digital engineering.

In the exemplary neural network discussions of FIG. 26, examples are provided with respect to a particular script-updating ML model implementation using neural networks. Analogous approaches can be used to implement model-updating ML models, feedback ML models, and any other NN-based components of the systems and subsystems described herein.

FIG. 27 shows an overview of an IDEP neural network training process, according to exemplary embodiments of the present invention.

The training of the IDEP neural network involves repeatedly updating the weights and biases 2710 of the network to minimize the difference between the predicted output 2704 and the true or target output 2706, where the predicted output 2704 is the result produced by the network when a set of inputs from a dataset is passed through it. The predicted output 2704 of an IDEP neural network 2702 corresponds to the DE output 2618 of the final layer of the neural network. The true or target output 2706 is the true desired result. The difference between the predicted output and the true output is calculated using a loss function 2708, which quantifies the error made by the network in its predictions.

The loss function is a part of the cost function 2708, which is a measure of how well the network is performing over the whole dataset. The goal of training is to minimize the cost function 2708. This is achieved by iteratively adjusting the weights and biases 2710 of the network in the direction that leads to the steepest descent in the cost function. The size of these adjustments is determined by the learning rate 2708, a hyperparameter that controls how much the weights and biases change in each iteration. A smaller learning rate means smaller changes and a slower convergence towards the minimum of the cost function, while a larger learning rate means larger changes and a faster convergence, but with the risk of overshooting the minimum.

For an IDEP neural network model 2702 based on the exemplary neural network model (e.g., to implement a script-updating ML model) discussed above in the context of FIG. 26, and trained to determine whether a given script update is to be implemented based on external feedback input:

the weights and biases 2710 are the IDEP neural network's hyperparameters that get updated at each iteration of the training process, as discussed in the context of FIG. 26, the predicted output 2704 is the binary prediction on whether a given script update is to be implemented based on a sample external feedback. (or a normalized score ranking prioritizing the order of script updates to be displayed to the user), the true/target output 2706 is the correct decision (i.e., sample ground truth output) on whether to implement the given script update based on the sample external feedback, the loss function 2708 is the difference between the evaluation and the true output (e.g., a binary error indicating whether the IDEP neural network's decision was correct), the cost function 2708 is the average of all errors over a training dataset including sample external feedbacks and corresponding implementations of the given script update, and the learning rate 2708 is the rate at which the cost function 2708 in consecutive training epochs approaches a pre-specified tolerable cost function.

Neural network training combines the processes of forward propagation and backpropagation. Forward propagation is the process where the input data is passed through the network from the input layer to the output layer. During forward propagation, the weights and biases of the network are used to calculate the output for a given input. Backpropagation, on the other hand, is the process used to update the weights and biases 2710 of the network based on the error (e.g., cost function) 2708 of the output. After forward propagation through the IDEP neural network 2702, the output 2704 of the network is compared with true output 2706, and the error 2708 is calculated. This error is then propagated back through the network, starting from the output layer and moving towards the input layer. The weights and biases 2710 are adjusted in a way that minimizes this error. This process is repeated for multiple iterations or epochs until the network is able to make accurate predictions.

The neural network training method described above, in which the network is trained on a labeled dataset (e.g., sample pairs of input user prompts and corresponding output recommendations), where the true outputs are known, is called supervised learning. In unsupervised learning, the network is trained on an unlabeled dataset, and the goal is to discover hidden patterns or structures in the data. The network is not provided with the true outputs, and the training is based on the intrinsic properties of the data. Furthermore, reinforcement learning is a type of learning where an agent learns to make decisions from the rewards or punishments it receives based on its actions. Although reinforcement learning does not typically rely on a pre-existing dataset, some forms of reinforcement learning can use a database of past actions, states, and rewards during the learning process. Any neural network training method that uses a labeled dataset is within the scope of the methods and systems described herein, as is clear from the overview below.

FIG. 28 provides additional details on the training process or an IDEP machine learning model, according to exemplary embodiments of the present invention.

Transformer Model Architecture

The transformer architecture is a neural network design that was introduced in the paper "*Attention is All You Need*" by Vaswani et al. published in June 2017 (available at arxiv (dot) org), and incorporated herein by reference as if fully set forth herein. Large Language Models (LLMs) heavily rely on the transformer architecture.

The architecture (see FIG. 1 in Vaswani et al.) is based on the concept of "attention", allowing the model to focus on different parts of the input sequence when producing an output. Transformers consist of an encoder and a decoder. The encoder processes the input data and the decoder generates the output. Each of these components is made up of multiple layers of self-attention and point-wise, fully connected layers.

The layers of self-attention in the transformer model allow it to weigh the relevance of different parts of the input sequence when generating an output, thereby enabling it to capture long-range dependencies in the data. On the other hand, the fully connected layers are used for transforming the output of the self-attention layers, adding complexity and depth to the model's learning capability.

The transformer model is known for its ability to handle long sequences of data, making it particularly effective for tasks such as machine translation and text summarization. In the transformer architecture, positional encoding is used to give the model information about the relative positions of the words in the input sequence. Since the model itself does not have any inherent sense of order or sequence, positional encoding is a way to inject some order information into the otherwise order-agnostic attention mechanism.

The Embeddings Vector Space

In the context of neural networks, tokenization refers to the process of converting the input and output spaces, such as natural language text or programming code, into discrete units or "tokens". This process allows the network to effectively process and understand the data, as it transforms complex structures into manageable, individual elements that the model can learn from and generate.

In the training of neural networks, embeddings serve as a form of distributed word representation that converts discrete categorical variables (i.e., tokens) into a continuous vector space (i.e., embedding vectors). This conversion process captures the semantic properties of tokens, enabling tokens with similar meanings to have similar embeddings. These embeddings provide a dense representation of tokens and their semantic relationships. Embeddings are typically represented as vectors, but may also be represented as matrices or tensors.

The input of a transformer typically requires conversion from an input space (e.g., the natural language token space) to an embeddings space. This process, referred to as "encoding", transforms discrete inputs (tokens) into continuous vector representations (embeddings). This conversion is a prerequisite for the transformer model to process the input data and understand the semantic relationships between tokens (e.g., words). Similarly, the output of a transformer typically requires conversion from the embeddings space to an output space (e.g., natural language tokens, programming code tokens, etc.), in a process referred to as "decoding". Therefore, the training of a neural network and its evaluation (i.e., its use upon deployment) both occur within the embeddings space.

In this document, the processes of tokenization, encoding, decoding, and de-tokenization may be assumed. In other words, the processes described below occur in the "embeddings space". Hence, while the tokenization and encoding of training data and input prompts may not be represented or discussed explicitly, they may nevertheless be implied. Similarly, the decoding and de-tokenization of neural network outputs may also be implied.

Training and Fine-Tuning Machine Learning (ML) Modules

FIG. 28 is an illustrative flow diagram showing the different phases and datasets involved in training an IDEP ML model, according to exemplary embodiments of the present invention.

The training process starts at step 2810 with DE data acquisition, retrieval, assimilation, or generation. At step 2820, acquired DE data are pre-processed, or prepared. At step 2830, the IDEP ML model is trained using training data 2825. At step 2840, the IDEP ML model is evaluated, validated, and tested, and further refinements to the IDEP ML model are fed back into step 2830 for additional training. Once its performance is acceptable, at step 2850, optimal IDEP ML parameters are selected.

Training data 2825 is a dataset containing multiple instances of system inputs (e.g., user inputs, user prompts, DTw/PTw performance data, simulation data, and/or certification/requirement documents, etc.) and correct outcomes (e.g., updated script, DE model, twin configuration, DTw, PTw, etc.). It trains the IDEP ML model to optimize the performance for a specific target task, such as the prediction of a specific target output data field within a specific target document. In FIG. 28, training data 2825 may also include subsets for validating and testing the IDEP ML model, as part of the training iterations 2830 and 2840. For an NN-based ML model, the quality of the output may depend on (a) NN architecture design and hyperparameter configurations, (b) NN coefficient or parameter optimization, and (c) quality of the training data set. These components may be refined and optimized using various methods. For example, training data 2825 may be expanded via a document database augmentation process.

In some embodiments, an additional fine-tuning 2860 phase including iterative fine-tuning 2860 and evaluation, validation, and testing 2870 steps, is carried out using fine-tuning data 2855. Fine-tuning in machine learning is a process that involves taking a selected 2850 pre-trained model and further adjusting or "tuning" its parameters to better suit a specific task or fine-tuning dataset 2855. This technique is particularly useful when dealing with deep learning models that have been trained on large, general training datasets 2825 and are intended to be applied to more specialized tasks or smaller datasets. The objective is to leverage the knowledge the model has already acquired during its initial training (often referred to as transfer learning) and refine it so that the model performs better on a more specific task at hand.

The fine-tuning process typically starts with a model that has already been trained on a large benchmark training dataset 2825, such as ImageNet (available at image-net (dot) org) for image recognition tasks. The model's existing weights, which have been learned from the original training, serve as the starting point. During fine-tuning, the model is trained further on a new fine-tuning dataset 2855, which may contain different classes or types of data than the original training set. This additional training phase allows the model to adjust its weights to better capture the characteristics of the new fine-tuning dataset 2855, thereby improving its performance on the specific task it is being fine-tuned for.

In some embodiments, additional test and validation 2880 phases are carried out using DE test and validation data 2875. Testing and validation of a ML model both refer to the process of evaluating the model's performance on a separate dataset 2875 that was not used during training, to ensure that it generalizes well to new unseen data. Validation of a ML model helps to prevent overfitting by ensuring that the model's performance generalizes beyond the training data.

While the validation phase is considered part of ML model development and may lead to further rounds of fine-tuning, the testing phase is the final evaluation of the model's performance after the model has been trained and validated. The testing phase provides an unbiased assessment of the final model's performance that reflects how well the model is expected to perform on unseen data, and is usually carried out after the model has been finalized to ensure the evaluation is unbiased.

Once the IDEP ML model is trained 2830, selected 2850, and optionally fine-tuned 2860 and validated/tested 2880, the process ends with the deployment 2890 of the IDEP ML model. Deployed IDEP ML models 2895 usually receive new DE data 2885 that was pre-processed 2880.

In machine learning, data pre-processing 2820 is tailored to the phase of model development. During model training 2830, pre-processing involves cleaning, normalizing, and transforming raw data into a format suitable for learning patterns. For fine-tuning 2860, pre-processing adapts the data to align with the distribution of the specific targeted task, ensuring the pre-trained model can effectively transfer its knowledge. Validation 2880 pre-processing mirrors that of training to accurately assess model generalization without leakage of information from the training set. Finally, in deployment 2890, pre-processing ensures real-world data matches the trained model's expectations, often involving dynamic adjustments to maintain consistency with the training and validation stages.

Machine Learning Algorithms

Various exemplary ML algorithms are within the scope of the present invention. Such machine learning algorithms include, but are not limited to, random forest, nearest neighbor, decision trees, support vector machines (SVM), Adaboost, gradient boosting, Bayesian networks, evolutionary algorithms, various neural networks (including deep learning networks (DLN), convolutional neural networks (CNN), and recurrent neural networks (RNN)), etc.

ML modules based on transformers and Large Language Models (LLMs) are particularly well suited for the tasks described herein. The online article "*Understanding Large Language Models—A Transformative Reading List*", by S. Raschka (posted Feb. 7, 2023, available at sebastianraschka (dot)com), describes various LLM architectures that are within the scope of the methods and systems described herein, and is hereby incorporated by reference in its entirety herein as if fully set forth herein.

The input to each of the listed ML modules is a feature vector comprising the input data described above for each ML module. The output of the ML module is a feature vector comprising the corresponding output data described above for each ML module.

Prior to deployment, each of the ML modules listed above may be trained on one or more respective sample input datasets and on one or more corresponding sample output datasets. The input and output training datasets may be generated from a database containing a history of input instances (e.g., user inputs, user prompts, DTw/PTw performance data, simulation data, and/or certification/requirement documents) and output instances (e.g., updated scripts, DE models, twin configurations, DTws, PTws), or may be generated synthetically by subject matter experts.

Exemplary System Architecture

An exemplary embodiment of the present disclosure may include one or more servers (management computing entities), one or more networks, and one or more clients (user computing entities). Each of these components, entities, devices, and systems (similar terms used herein interchangeably) may be cloud-based, and in direct or indirect communication with, for example, one another over the same or different wired or wireless networks. All of these devices, including servers, clients, and other computing entities or nodes may be run internally by a customer (in various architecture configurations including private cloud), internally by the provider of the IDEP (in various architecture configurations including private cloud), and/or on the public cloud.

FIG. 29 provides illustrative schematics of a server (management computing entity) 2910 connected via a network 2920 to a client (user computing entity) 2930 used for documentation within an interconnected digital engineering platform (IDEP), according to some embodiments of the present invention. While FIG. 29 illustrates the various system entities as separate, standalone entities, the various embodiments are not limited to this particular architecture. Additionally, the terms "client device", "client computing entity", "edge device", and "edge computing system" are equivalent and are used interchangeably herein.

Exemplary Management Computing Entity

An illustrative schematic is provided in FIG. 29 for a server or management computing entity 2910. In general, the terms computing entity, computer, entity, device, system, and/or similar words used herein interchangeably may refer to, for example, one or more cloud servers, computers, computing entities, desktop computers, mobile phones, tablets, phablets, notebooks, laptops, distributed systems, gaming consoles, watches, glasses, iBeacons, proximity beacons, key fobs, radio frequency identification (RFID) tags, earpieces, scanners, televisions, dongles, cameras, wristbands, wearable items/devices, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, crawling, displaying, storing, determining, creating/generating, monitoring, evaluating, and/or comparing (similar terms used herein interchangeably). In one embodiment, these functions, operations, and/or processes can be performed on data, content, and/or information (similar terms used herein interchangeably), as they are used in a digital engineering process.

In one embodiment, management computing entity 2910 may be equipped with one or more communication interfaces 2912 for communicating with various computing entities, such as by exchanging data, content, and/or information (similar terms used herein interchangeably) that can be transmitted, received, operated on, processed, displayed, stored, and/or the like. For instance, management computing entity 2910 may communicate with one or more client computing devices such as 2930 and/or a variety of other computing entities. Network or communications interface 2912 may support various wired data transmission protocols including, but not limited to, Fiber Distributed Data Interface (FDDI), Digital Subscriber Line (DSL), Ethernet, Asynchronous Transfer Mode (ATM), frame relay, and data over cable service interface specification (DOCSIS). In addition, management computing entity 2910 may be capable of wireless communication with external networks, employing any of a range of standards and protocols, including but not limited to, general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High-Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

As shown in FIG. 29, in one embodiment, management computing entity 2910 may include or be in communication with one or more processors 2914 (also referred to as processors and/or processing circuitry, processing elements, and/or similar terms used herein interchangeably) that communicate with other elements within management computing entity 2910, for example, via a bus. As will be understood, processor 2914 may be embodied in a number of different ways. For example, processor 2914 may be embodied as one or more complex programmable logic devices (CPLDs), microprocessors, multi-core processors, co-processing entities, application-specific instruction-set processors (ASIPs), graphical processing units (GPUs), microcontrollers, and/or controllers. The term circuitry may refer to an entire hardware embodiment or a combination of hardware and computer program products. Thus, processor 2914 may be embodied as integrated circuits (ICs), application-specific integrated circuits (ASICs), field-programmable gate arrays (FPGAs), programmable logic arrays (PLAs), hardware accelerators, other circuitry, and/or the like. As will therefore be understood, processor 2914 may be configured for a particular use or configured to execute instructions stored in volatile or non-volatile (or non-transitory) media 2916 and 2918, or otherwise accessible to processor 2914. As such, whether configured by hardware or computer program products, or by a combination thereof, processor 2914 may be capable of performing steps or operations according to embodiments of the present disclosure when configured accordingly.

In one embodiment, management computing entity 2910 may further include or be in communication with non-transitory memory 2918 (also referred to as non-volatile media, non-volatile storage, non-transitory storage, physical storage media, memory, memory storage, and/or memory circuitry—similar terms used herein interchangeably). In one embodiment, the non-transitory memory or storage may include one or more non-transitory memory or storage media, including but not limited to hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. As will be recognized, the non-volatile (or non-transitory) storage or memory media may store cloud storage buckets, databases, database instances, database management systems, data, applications, programs, program modules, scripts, source code, object code, byte code, compiled code, interpreted code, machine code, executable instructions, and/or the like. The term database, database instance, and/or database management system (similar terms used herein interchangeably) may refer to a collection of records or data that is stored in a computer-readable storage medium using one or more database models, such as a hierarchical database model, network model, relational model, entity-relationship model, object model, document model, semantic model, graph model, and/or the like.

In one embodiment, management computing entity 2910 may further include or be in communication with volatile memory 2916 (also referred to as volatile storage, memory, memory storage, memory and/or circuitry-similar terms used herein interchangeably). In one embodiment, the volatile storage or memory may also include one or more volatile storage or memory media, including but not limited to RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, processor 2914. Thus, the cloud storage buckets, databases, database instances, database management systems, data, applications, programs, program modules, scripts, source code, object code, byte code, compiled code, interpreted code, machine code, executable instructions, and/or the like may be used to control certain aspects of the operation of management computing entity 2910 with the assistance of processor 2914 and an operating system.

Although not shown, management computing entity 2910 may include or be in communication with one or more input elements, such as a keyboard input, a mouse input, a touch screen/display input, motion input, movement input, audio input, pointing device input, joystick input, keypad input, and/or the like. Management computing entity 2910 may also include or be in communication with one or more output elements, also not shown, such as audio output, visual output, screen/display output, motion output, movement output, spatial computing output (e.g., virtual reality or augmented reality), and/or the like.

As will be appreciated, one or more of the components of management computing entity 2910 may be located remotely from other management computing entity components, such as in a distributed system. Furthermore, one or more of the components may be combined and additional components performing functions described herein may be included in management computing entity 2910. Thus, management computing entity 2910 can be adapted to accommodate a variety of needs and circumstances. As will be recognized, these architectures and descriptions are provided for exemplary purposes only and are not limited to the various embodiments.

Exemplary User Computing Entity

A user may be a human individual, a company, an organization, an entity, a department within an organization, a representative of an organization and/or person, an artificial user such as algorithms, artificial intelligence, or other software that interfaces, and/or the like. FIG. 29 further provides an illustrative schematic representation of a client user computing entity 2930 that may be used in conjunction with embodiments of the present disclosure. In various embodiments, computing device 2930 may be a general-purpose computing device with dedicated modules for performing digital engineering-related tasks. It may alternatively be implemented in the cloud, with logically and/or physically distributed architectures.

As shown in FIG. 29, user computing entity 2930 may include a power source 2931, an antenna 2970, a radio transceiver 2932, a network and communication interface 2934, and a processor unit 2940 that provides signals to and receives signals from the network and communication interface. The signals provided to and received may include signaling information in accordance with air interface standards of applicable wireless systems. In this regard, user computing entity 2930 may be capable of operating with one or more air interface standards, communication protocols, modulation types, and access types. More particularly, user computing entity 2930 may operate in accordance with any of a number of wireless communication standards and protocols, such as those described above with regard to management computing entity 2910. Similarly, user computing entity 2930 may operate in accordance with multiple wired communication standards and protocols, such as those described above with regard to management computing entity 2910.

Via these communication standards and protocols, user computing entity 2930 may communicate with various other entities using concepts such as Unstructured Supplementary Service Data (USSD), Short Message Service (SMS), Multimedia Messaging Service (MMS), Dual-Tone Multi-Frequency Signaling (DTMF), and/or Subscriber Identity Module Dialer (SIM dialer). User computing entity 2930 may also download changes, add-ons, and updates, for instance, to its firmware, software (e.g., including executable instructions, applications, program modules), and operating system.

In some implementations, processing unit 2940 may be embodied in several different ways. For example, processing unit 2940 may be embodied as one or more complex programmable logic devices (CPLDs), microprocessors, multi-core processors, co-processing entities, application-specific instruction-set processors (ASIPs), graphical processing units (GPUs), microcontrollers, and/or controllers. Further, processing unit 2940 may be embodied as one or more other processing devices or circuitry. The term circuitry may refer to an entirely hardware embodiment or a combination of hardware and computer program products. Thus, processing unit 2940 may be embodied as integrated circuits, application specific integrated circuits (ASICs), field programmable gate arrays (FPGAs), programmable logic arrays (PLAs), hardware accelerators, other circuitry, and/or the like. As will therefore be understood, processing unit 2940 may be configured for a particular use or configured to execute instructions stored in volatile or non-volatile media or otherwise accessible to the processing unit. As such, whether configured by hardware or computer program products, or by a combination thereof, processing unit 2940 may be capable of performing steps or operations according to embodiments of the present invention when configured accordingly.

In some embodiments, processing unit 2940 may comprise a control unit 2942 and a dedicated arithmetic logic unit (ALU) 2944 to perform arithmetic and logic operations. In some embodiments, user computing entity 2930 may comprise a graphics processing unit (GPU) 2946 for specialized parallel processing tasks, and/or an artificial intelligence (AI) module or accelerator 2948, also specialized for applications including artificial neural networks and machine learning. In some embodiments, processing unit 2940 may be coupled with GPU 2946 and/or AI accelerator 2948 to distribute and coordinate digital engineering related tasks.

In some embodiments, computing entity 2930 may include a user interface, comprising an input interface 2950 and an output interface 2952, each coupled to processing unit 2940. User input interface 2950 may comprise any of a number of devices or interfaces allowing computing entity 2930 to receive data, such as a keypad (hard or soft), a touch display, a mic/speaker for voice/speech/conversation, a camera for motion or posture interfaces, and appropriate sensors for spatial computing interfaces. User output interface 2952 may comprise any of a number of devices or interfaces allowing computing entity 2930 to provide information to a user, such as through the touch display, or a speaker for audio outputs. In some embodiments, output interface 2952 may connect computing entity 2930 to an external loudspeaker or projector, for audio and/or visual output. In some embodiments, user interfaces 2950 and 2952 integrate multimodal data in an interface that caters to human users. Some examples of human interfaces include a dashboard-style interface, a workflow-based interface, conversational interfaces, and spatial-computing interfaces. As shown in FIG. 5, computing entity 2930 may also support bot/algorithmic interfaces such as code interfaces, text-based API interfaces, and the like.

User computing entity 2930 can also include volatile and/or non-volatile storage or memory 2960, which can be embedded and/or may be removable. For example, the non-volatile or non-transitory memory may be ROM, PROM, EPROM, EEPROM, flash memory, MMCs, SD memory cards, Memory Sticks, CBRAM, PRAM, FORAM, NVRAM, MRAM, RRAM, SONOS, FJG RAM, Millipede memory, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. The volatile and non-volatile (or non-transitory) storage or memory 2960 may store an operating system 2962, application software 2964, data 2966, databases, database instances, database management systems, data, applications, programs, program modules, scripts, source code, object code, byte code, compiled code, interpreted code, machine code, executable instructions, and/or the like to implement functions of user computing entity 2930. As indicated, this may include a user application that is resident on the entity or accessible through a browser or other user interface for communicating with management computing entity 2910 and/or various other computing entities.

In some embodiments, user computing entity 2930 may include one or more components or functionalities that are the same or similar to those of management computing entity 2910, as described in greater detail above. As will be recognized, these architectures and descriptions are provided for exemplary purposes only and are not limited to the various embodiments.

In some embodiments, computing entities 2910 and/or 2930 may communicate to external devices like other computing devices and/or access points to receive information such as software or firmware, or to send information from the memory of the computing entity to external systems or devices such as servers, computers, smartphones, and the like.

In some embodiments, two or more computing entities such as 2910 and/or 2930 may establish connections using a network such as 2920 utilizing any of the networking protocols listed previously. In some embodiments, the computing entities may use network interfaces such as 2912 and 2934 to communicate with each other, such as by communicating data, content, information, and/or similar terms used herein interchangeably that can be transmitted, received, operated on, processed, displayed, stored, and/or the like.

Additional Hardware & Software Implementation Details

Although an example processing system has been described above, implementations of the subject matter and the functional operations described herein can be implemented in other types of digital electronic circuitry, or in computer software, firmware, or hardware, including the structures disclosed in this specification and their structural equivalents, or in combinations of one or more of them.

Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described herein can be implemented as one or more computer programs, i.e., one or more modules of computer program instructions, encoded on computer storage medium for execution by, or to control the operation of, information/data processing apparatus. Alternatively, or in addition, the program instructions can be encoded on an artificially generated propagated signal, e.g., a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The terms "processor", "computer," "data processing apparatus", and the like encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing, and grid computing infrastructures.

A computer program (also known as a program, software, software application, script, code, program code, and the like) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or information/data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read only memory or a random-access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, e.g., magnetic, magneto optical disks, or optical disks. However, a computer need not have such devices. Devices suitable for storing computer program instructions and information/data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described herein can be implemented on a computer having a display device, e.g., a CRT (cathode ray tube) or LCD (liquid crystal display) monitor, for displaying information/data to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user: for example, by sending web pages to a web browser on a user's client device in response to requests received from the web browser.

Embodiments of the subject matter described herein can be implemented in a computing system that includes a backend component, e.g., as an information/data server, or that includes a middleware component, e.g., an application server, or that includes a frontend component, e.g., a client computer having a graphical user interface or a web browser through which a user can interact with an implementation of the subject matter described herein, or any combination of one or more such back end, middleware, or front end components. The components of the system can be interconnected by any form or medium of digital information/data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship with each other. In some embodiments, a server transmits information/data (e.g., an HTML page) to a client device (e.g., for purposes of displaying information/data to and receiving user input from a user interacting with the client device). Information/data generated at the client device (e.g., a result of the user interaction) can be received from the client device at the server.

While this specification contains many specific implementation details, these should not be construed as limitations on the scope of any embodiment or of what may be claimed, but rather as descriptions of features specific to particular embodiments. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

In some embodiments of the present invention, the entire system can be implemented and offered to the end-users and operators over the Internet, in a so-called cloud implementation. No local installation of software or hardware would be needed, and the end-users and operators would be allowed access to the systems of the present invention directly over the Internet, using either a web browser or similar software on a client, which client could be a desktop, laptop, mobile device, and so on. This eliminates any need for custom software installation on the client side and increases the flexibility of delivery of the service (software-as-a-service), and increases user satisfaction and ease of use. Various business models, revenue models, and delivery mechanisms for the present invention are envisioned, and are all to be considered within the scope of the present invention.

In general, the method executed to implement the embodiments of the invention, may be implemented as part of an operating system or a specific application, component, program, object, module, or sequence of instructions referred to as "program code," "computer program(s)", "computer code(s)," and the like. The computer programs typically comprise one or more instructions set at various times in various memory and storage devices in a computer, and that, when read and executed by one or more processors in a computer, cause the computer to perform operations necessary to execute elements involving the various aspects of the invention. Moreover, while the invention has been described in the context of fully functioning computers and computer systems, those skilled in the art will appreciate that the various embodiments of the invention are capable of being distributed as a program product in a variety of forms, and that the invention applies equally regardless of the particular type of machine or computer-readable media used to actually affect the distribution. Examples of computer-readable media include but are not limited to recordable type media such as volatile and non-volatile (or non-transitory) memory devices, floppy and other removable disks, hard disk drives, optical disks, which include Compact Disk Read-Only Memory (CD ROMS), Digital Versatile Disks (DVDs), etc., as well as digital and analog communication media.

CONCLUSIONS

One of ordinary skill in the art knows that the use cases, structures, schematics, flow diagrams, and steps may be performed in any order or sub-combination, while the inventive concept of the present invention remains without departing from the broader scope of the invention. Every embodiment may be unique, and step(s) of method(s) may be either shortened or lengthened, overlapped with other activities, postponed, delayed, and/or continued after a time gap, such that every active user and running application program is accommodated by the server(s) to practice the methods of the present invention.

For simplicity of explanation, the embodiments of the methods of this disclosure are depicted and described as a series of acts or steps. However, acts or steps in accordance with this disclosure can occur in various orders and/or concurrently, and with other acts or steps not presented and described herein. Furthermore, not all illustrated acts or steps may be required to implement the methods in accordance with the disclosed subject matter. In addition, those skilled in the art will understand and appreciate that the methods could alternatively be represented as a series of interrelated states via a state diagram or events or their equivalent.

As used herein, the singular forms "a," "an," and "the" include plural references unless the context clearly indicates otherwise. Thus, for example, reference to "a cable" includes a single cable as well as a bundle of two or more different cables, and the like.

The terms "comprise," "comprising." "includes," "including," "have," "having," and the like, used in the specification and claims are meant to be open-ended and not restrictive, meaning "including but not limited to."

In the foregoing description, numerous specific details are set forth, such as specific structures, dimensions, processes, parameters, etc., to provide a thorough understanding of the present invention. The particular features, structures, materials, or characteristics may be combined in any suitable manner in one or more embodiments. The words "example", "exemplary", "illustrative" and the like, are used herein to mean serving as an example, instance, or illustration. Any aspect or design described herein as "example" or its equivalents is not necessarily to be construed as preferred or advantageous over other aspects or designs. Rather, use of the words "example" or equivalents is intended to present concepts in a concrete fashion.

As used in this application, the term "or" is intended to mean an inclusive "or" rather than an exclusive "or". That is, unless specified otherwise, or clear from context, "X includes A or B" is intended to mean any of the natural inclusive permutations. That is, if X includes A. X includes B, or X includes both A and B, then "X includes A or B" is satisfied under any of the foregoing instances.

Reference throughout this specification to "an embodiment," "certain embodiments," or "one embodiment" means that a particular feature, structure, or characteristic described in connection with the embodiment is included in at least one embodiment. Thus, the appearances of the phrase "an embodiment," "certain embodiments," or "one embodiment" throughout this specification are not necessarily all referring to the same embodiment.

As used herein, the term "about" in connection with a measured quantity, refers to the normal variations in that measured quantity, as expected by one of ordinary skill in the art in making the measurement and exercising a level of care commensurate with the objective of measurement and the precision of the measuring equipment. For example, in some exemplary embodiments, the term "about" may include the recited number±10%, such that "about 10" would include from 9 to 11. In other exemplary embodiments, the term "about" may include the recited number±X %, where X is considered the normal variation in said measurement by one of ordinary skill in the art.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom. Features of the transitory physical storage medium described may be incorporated into/used in a corresponding method, digital documentation system and/or system, and vice versa.

Although the present invention has been described with reference to specific exemplary embodiments, it will be evident that the various modifications and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present invention, as defined by the claims.

What is claimed is:

1. A non-transitory physical storage medium storing program code, the program code executable by a hardware processor to cause the hardware processor to execute a computer-implemented process for updating a digital twin of a physical product and/or a physical process within an interconnected digital model platform (IDMP), the program code comprising code to:

receive a model representation connected to a digital model file associated with the digital twin, wherein the model representation provides access to a digital artifact of the digital model file through the IDMP, wherein the digital model file resides within a customer environment, wherein the IDMP is configured to interconnect the digital model file with a different digital model file through a software-code-defined digital thread, and wherein the digital model file and the different digital model file are from two distinct software tools and/or from two distinct security networks;

receive the software-code-defined digital thread, wherein the software-code-defined digital thread is written in a computer-executable scripting language, and the software-code-defined digital thread accesses the digital artifact through the model representation, wherein the software-code-defined digital thread is configured to execute a scripted workflow associated with the digital twin, and wherein the scripted workflow executes a plurality of pipelined tasks;

generate a twin configuration of the digital twin based on the model representation and the software-code-defined digital thread;

instantiate the digital twin in a virtual environment by executing the software-code-defined digital thread;

receive external feedback related to the digital twin, wherein the external feedback comprises feedback data from a source external to the digital twin;

update the digital twin based on the external feedback to generate an updated digital twin; and store the updated digital twin.

2. The non-transitory physical storage medium of claim 1, wherein the digital model file is selected from the group consisting of a digital engineering (DE) model file, a medical model file, a supply chain logistics model file, a manufacturing model file, and a financial model file.

3. The non-transitory physical storage medium of claim 1, wherein the twin configuration comprises a twin version identifier identifying the digital twin, a digital thread identifier identifying the software-code-defined digital thread, a model representation identifier identifying the model representation, and an authoritative twin indicator, and wherein the twin configuration feature is selected from the group of twin configuration features consisting of the digital thread identifier, the model representation identifier, and the authoritative twin indicator.

4. The non-transitory physical storage medium of claim 1, wherein a new twin configuration is designated as an authoritative twin configuration using an authoritative twin designation ML model, wherein the authoritative twin designation ML model is trained on an IDMP training dataset comprising a plurality of sample twin configurations comprising at least one sample authoritative twin configuration.

5. The non-transitory physical storage medium of claim 1, wherein the model representation comprises a model splice connected to the digital model file, wherein the model splice comprises one or more splice data items, one or more splice data structures, and a splice function providing access to the digital artifact, wherein the access to the digital artifact is provided through an Application Programming Interface (API) or Software Development Kit (SDK) endpoint, and wherein the digital artifact has a metadata component and a data component.

6. The non-transitory physical storage medium of claim 5, wherein the digital model file and the different digital model file are from different software tools, and wherein the software-code-defined digital thread accesses a different digital artifact through a different model splice connected to the different digital model file.

7. The non-transitory physical storage medium of claim 5, wherein code to update the model representation comprises code to update the model splice, wherein the code to update a given model splice comprises code to update a splice feature of the given model splice selected from the group of splice features consisting of a given splice data item of the given model splice, a given splice data structure of the given model splice, and a given splice function of the given model splice.

8. The non-transitory physical storage medium of claim 7, wherein the model splice is updated using a splice updating ML model trained on an IDMP training dataset comprising at least one sample updated model splice and corresponding sample external feedback.

9. The non-transitory physical storage medium of claim 1, wherein an update to a computer-executable script is carried out using a script-updating ML model trained on an IDMP training dataset comprising at least one sample updated computer-executable script and corresponding sample external feedback.

10. The non-transitory physical storage medium of claim 1, wherein the external feedback comprises digital twin performance data, wherein the twin configuration is configured to receive one or more performance data sets from the digital twin, and wherein the code to update the twin configuration comprises code to modify the one or more performance data sets.

11. The non-transitory physical storage medium of claim 10, further comprising program code to:

analyze the digital twin performance data, wherein the code to analyze the digital twin performance data comprises code to compare the digital twin performance data with one of a product requirement and a performance data set of the twin configuration.

12. The non-transitory physical storage medium of claim 11, wherein analyzing the digital twin performance data comprises using an analysis script generated by an analysis ML model, wherein the analysis ML model is trained on an IDMP training dataset comprising one or more digital twins and one or more corresponding performance data sets.

13. The non-transitory physical storage medium of claim 1, wherein the external feedback is generated by a data source selected from the group of data sources consisting of a product certification file, and a product requirements file.

14. The non-transitory physical storage medium of claim 1, wherein the external feedback comprises a feedback suggestion generated by a feedback ML model trained on an IDMP training dataset comprising one or more sample digital twins, one or more sample updated digital twins, and corresponding sample external feedback, wherein the feedback ML model is selected from the group consisting of a transformer and a neural network.

15. The non-transitory physical storage medium of claim 1, further comprising program code to:

instantiate a new digital twin based on a new twin configuration, wherein the new digital twin is instantiated using a computer-executable script generated by a digital twin instantiation ML model, and wherein the digital twin instantiation ML model is trained on an IDMP training dataset comprising one or more sample twin configurations and one or more sample computer-executable scripts.

16. The non-transitory physical storage medium of claim 1, further comprising program code to:

instantiate a new physical twin based on a new twin configuration, wherein the new physical twin is instantiated in a physical environment based on a plurality of spliced digital model files through a model-based systems engineering (MBSE) manufacturing process, and wherein each spliced digital model file of the plurality of spliced digital model files is associated with a model splice identified by a splice identifier of the new twin configuration.

17. The non-transitory physical storage medium of claim 1, wherein the external feedback is received through a multimodal interface, and wherein the multimodal interface is selected from the group consisting of a 3D visualization interface and a conversational interface.

18. The non-transitory physical storage medium of claim 1, wherein the IDMP is deployed following a deployment configuration selected from the group consisting of an external platform instance, an external platform instance with internal agent, an external platform instance with internal agent and edge computing, an edge instance connection, and an air-gapped platform instance.

19. The non-transitory physical storage medium of claim 1, further comprising program code to:

store the twin configuration in a twin configuration set of the IDMP;

update the digital twin to generate an updated digital twin based on the external feedback by:

updating the software-code-defined digital thread through an update to a script written in the computer-executable scripting language, updating the model representation through an update to the digital artifact, and updating the twin configuration by modifying a twin configuration feature;

generate a new twin configuration based on the updated digital twin; and store the new twin configuration in the twin configuration set.

20. A computer-implemented method for updating a digital twin of a physical product and/or a physical process within an interconnected digital model platform (IDMP), the method comprising:

receiving a model representation connected to a digital model file associated with the digital twin, wherein the model representation provides access to a digital artifact of the digital model file through the IDMP, wherein the digital model file resides within a customer environment, wherein the IDMP is configured to interconnect the digital model file with a different digital model file through a software-code-defined digital thread, and wherein the digital model file and the different digital model file are from two distinct software tools and/or from two distinct security networks;

receiving the software-code-defined digital thread, wherein the software-code-defined digital thread is written in a computer-executable scripting language, and the software-code-defined digital thread accesses the digital artifact through the model representation, wherein the software-code-defined digital thread is configured to execute a scripted workflow associated with the digital twin, and wherein the scripted workflow executes a plurality of pipelined tasks;

generating a twin configuration of the digital twin based on the model representation and the software-code-defined digital thread;

instantiating the digital twin in a virtual environment by executing the software-code-defined digital thread;

receiving external feedback related to the digital twin, wherein the external feedback comprises feedback data from a source external to the digital twin;

updating the digital twin based on the external feedback to generate an updated digital twin; and storing the updated digital twin.

* * * * *